United States Patent
Koganezawa et al.

(10) Patent No.: US 6,327,120 B1
(45) Date of Patent: *Dec. 4, 2001

(54) ACTUATOR USING PIEZOELECTRIC ELEMENT AND HEAD-POSITIONING MECHANISM USING THE ACTUATOR

(75) Inventors: Shinji Koganezawa; Toru Kohei; Tomoyoshi Yamada; Yukihiro Uematsu, all of Kawasaki; Tadayoshi Noguchi, Toyohashi; Hisashi Nakano, Kosai; Ryuma Sakamoto, Souka; Junichi Inoue, Kosai; Tetsuya Suzuki, Atsumi-gun, all of (JP)

(73) Assignees: Fujitsu Limited, Tokyo (JP); FDX Corporation, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/057,174

(22) Filed: Apr. 8, 1998

(30) Foreign Application Priority Data

Apr. 17, 1997 (JP) ...................................... 9-100347
Jul. 10, 1997 (JP) ...................................... 9-185385

(51) Int. Cl.⁷ .......................... G11B 21/10; H01L 41/09; H01L 41/047
(52) U.S. Cl. ....................... 360/294.4; 310/311; 310/333; 310/366
(58) Field of Search .................................... 360/104–109, 360/294.4, 264.3; 310/311, 313 A, 313 B, 323–325, 333, 351, 366–368, 365

(56) References Cited

U.S. PATENT DOCUMENTS 4,825,227 * 4/1989 Fischback et al. .................... 346/1.1
4,868,447 * 9/1989 Lee et al. ..
4,879,568 * 11/1989 Bartky .

(List continued on next page.)

FOREIGN PATENT DOCUMENTS

| 4332966 | 3/1995 | (DE) . |
| 360975 | 4/1990 | (EP) . |
| 55-24485 | 2/1980 | (JP) . |

(List continued on next page.)

OTHER PUBLICATIONS

Kiesewetter: "Piezoelektrizitat und Magnetostriktion in Translationsmotoren" in Technische Rundschau, 1988, H. 22, S. 104–109.

*Primary Examiner*—William Klimowicz
(74) *Attorney, Agent, or Firm*—Greer, Burns & Crain, Ltd.

(57) ABSTRACT

An actuator having a simple configuration requiring no high dimensional accuracy, high in positioning accuracy and low in cost, and a head-positioning mechanism using the actuator are disclosed. An actuator according to a first application comprises a shear-type piezoelectric element of predetermined thickness and an opposed electrode formed on two electrodes in spaced relationship on a base member. The opposed electrode is displaced in accordance with the direction of polarization of the shear-type piezoelectric element upon applying a voltage between the two electrodes. The opposed electrode thus constitutes an operating section of the actuator. An actuator according to a second application comprises a movable member arranged on a drive member including a shear-type piezoelectric element on a base member. The drive member includes a plurality of layers of piezoelectric elements polarized in alternately opposite directions perpendicular to the thickness of the devices. A plurality of conductive layers are formed adjacently to the respective layers of the devices to permit voltage application thereto. The movable member can be driven in parallel to the base member upon application of a voltage between the conductive layers. Any one of these actuators can be incorporated as a part of the head actuator to constitute a head-positioning mechanism capable of displacing the head by a minuscule distance independently of the operation of the head actuator.

33 Claims, 50 Drawing Sheets

U.S. PATENT DOCUMENTS

| | | | |
|---|---|---|---|
| 4,905,107 | * 2/1990 | Klein | 360/75 |
| 4,912,351 | * 3/1990 | Takata et al. | 310/323 |
| 4,928,030 | * 5/1990 | Culp | 310/328 |
| 5,159,225 | * 10/1992 | Um | 310/328 |
| 5,189,578 | * 2/1993 | Mori et al. | 360/106 |
| 5,268,611 | * 12/1993 | Culp | 310/328 |
| 5,408,376 | * 4/1995 | Nishikura et al. | 360/109 |
| 5,418,418 | * 5/1995 | Hirano et al. | 310/328 |
| 5,466,985 | * 11/1995 | Suzuki | 310/333 |
| 5,521,778 | * 5/1996 | Boutaghou et al. | 360/106 |
| 5,548,313 | * 8/1996 | Lee | 347/68 |
| 5,633,554 | * 5/1997 | Kaji | 310/328 |
| 5,682,076 | * 10/1997 | Zumeris | 310/323 |
| 5,764,444 | * 6/1998 | Imamura et al. | 360/109 |
| 5,850,109 | * 12/1998 | Mock et al. | 310/26 |
| 5,898,541 | * 4/1999 | Boutaghou et al. | 360/109 |
| 5,898,544 | * 4/1999 | Krinke et al. | 360/104 |

FOREIGN PATENT DOCUMENTS

| | | | |
|---|---|---|---|
| 60-111315 | * | 6/1985 | (JP) . |
| 62281126 | | 12/1987 | (JP) . |
| 1214278 | | 8/1989 | (JP) . |
| 1-214278 | * | 8/1989 | (JP) . |
| 369072 | | 3/1991 | (JP) . |
| 412677 | | 1/1992 | (JP) . |
| 4-221475 | * | 8/1992 | (JP) . |
| 5346304 | | 12/1993 | (JP) . |
| 6259905 | | 9/1994 | (JP) . |
| 7272235 | | 10/1995 | (JP) . |
| 7332983 | | 12/1995 | (JP) . |
| 11-031368 | * | 2/1999 | (JP) . |

* cited by examiner

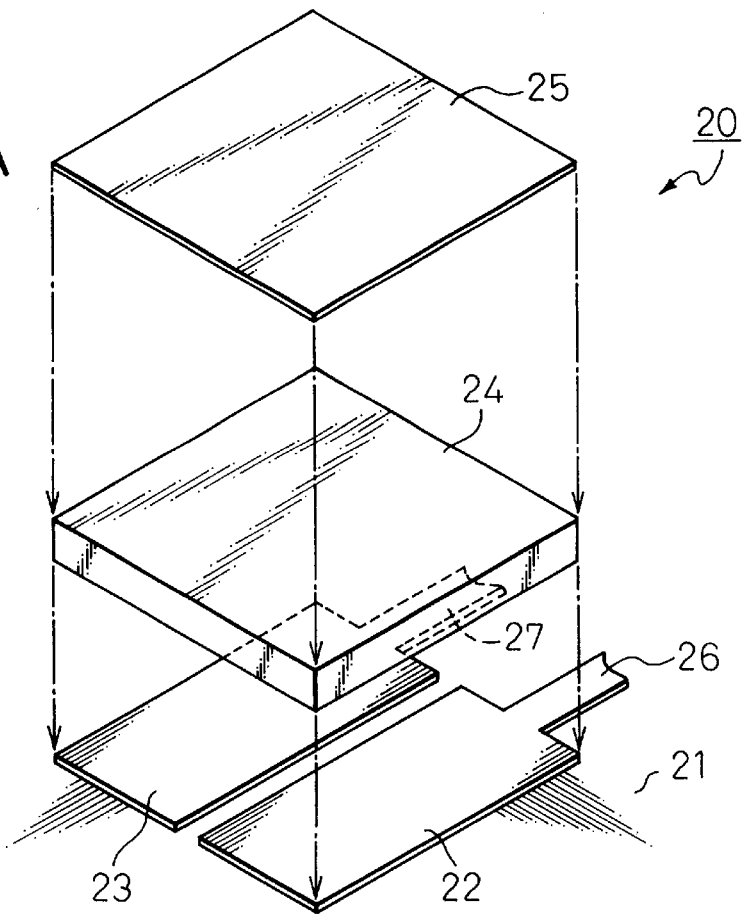
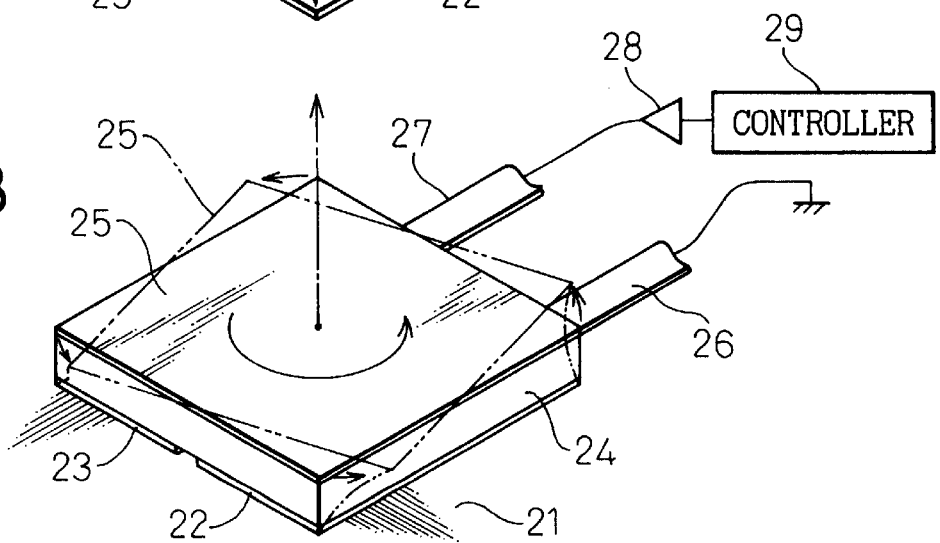
Fig.1A
Fig.1B

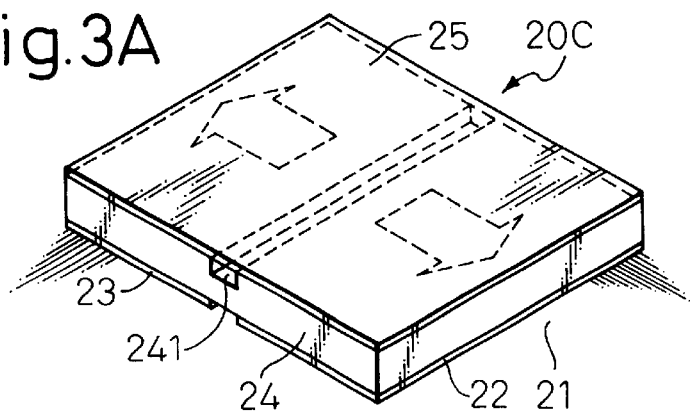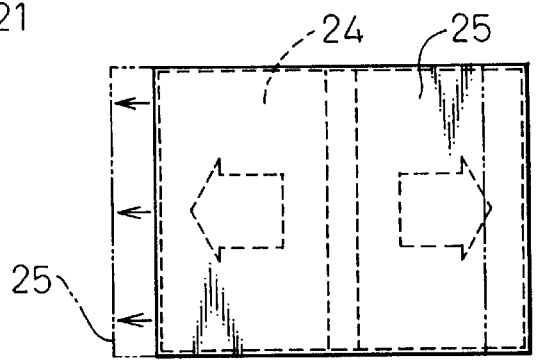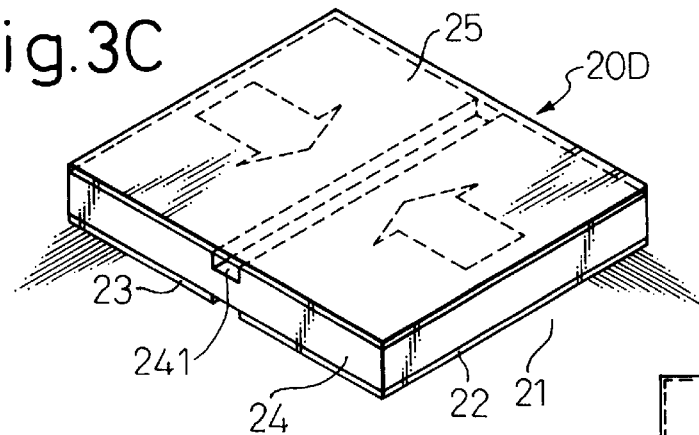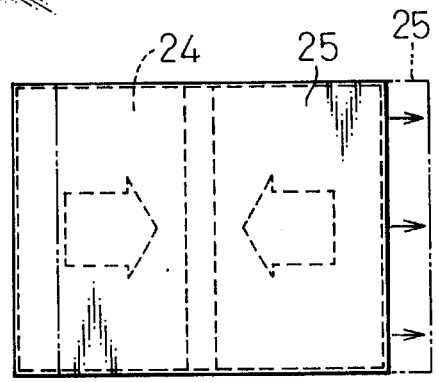

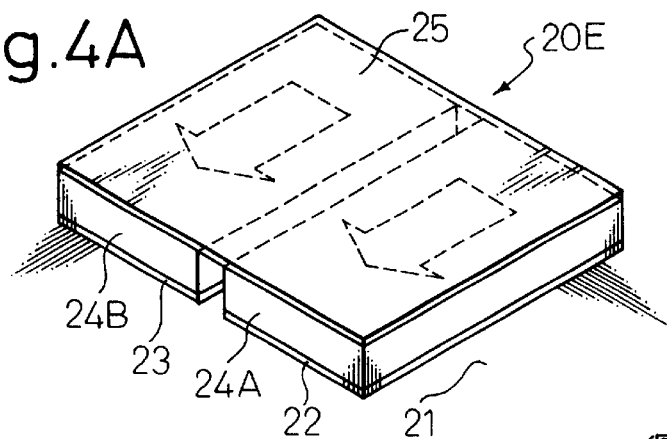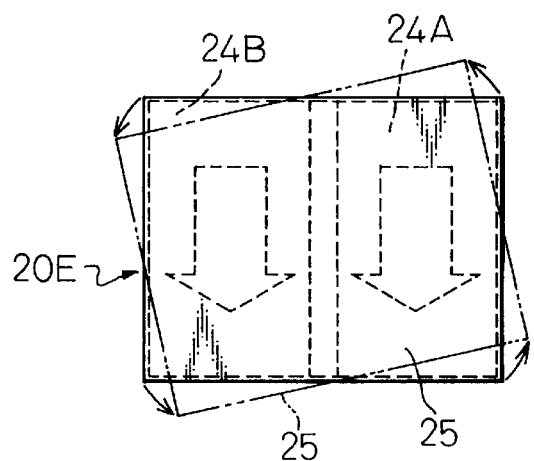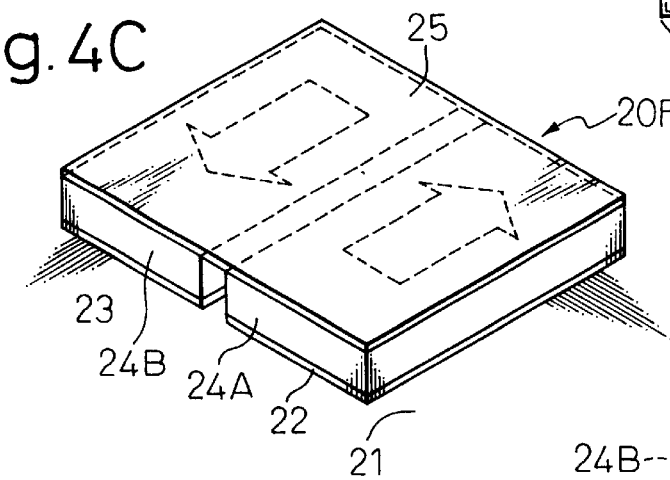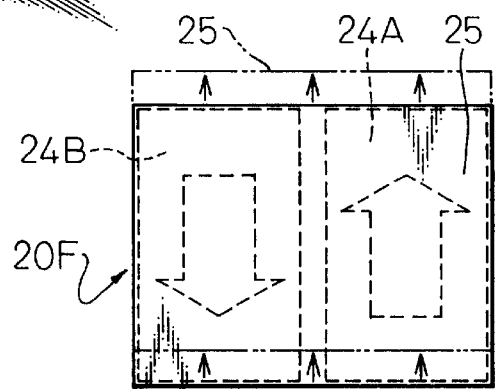

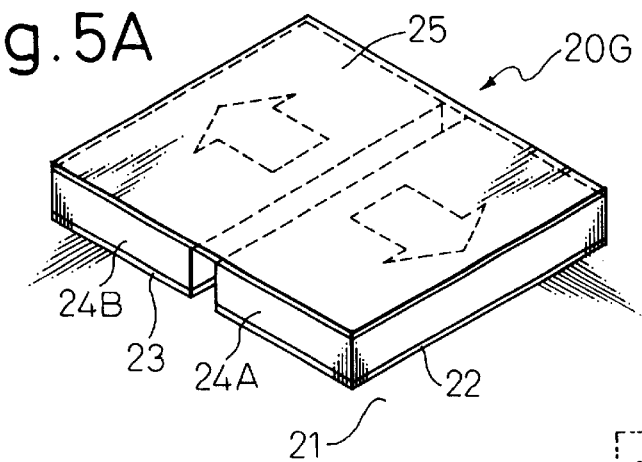
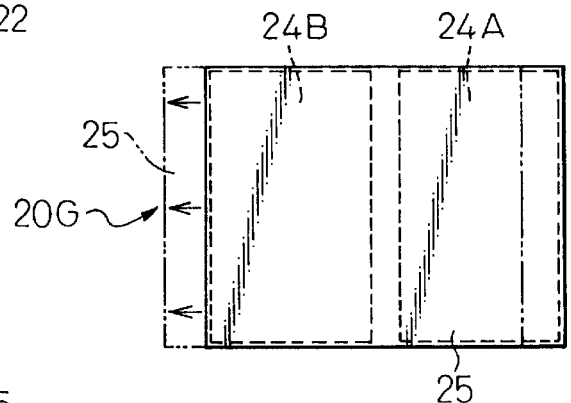
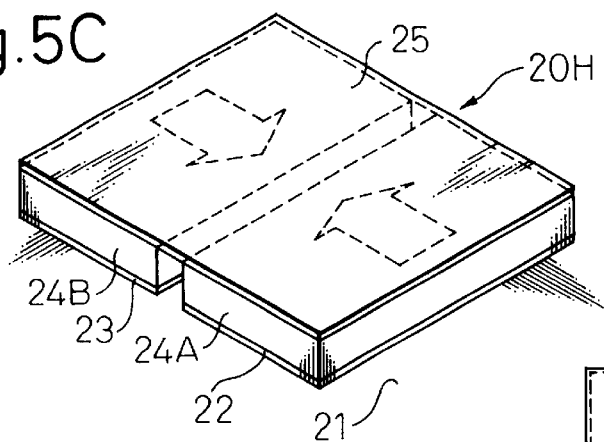
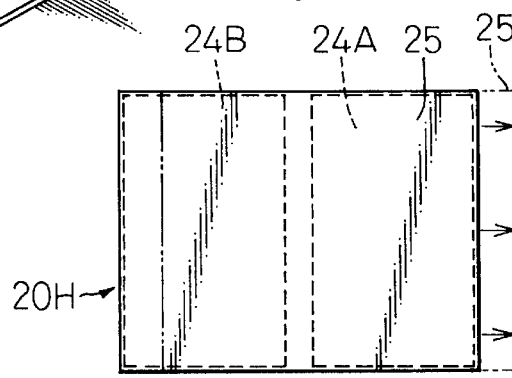

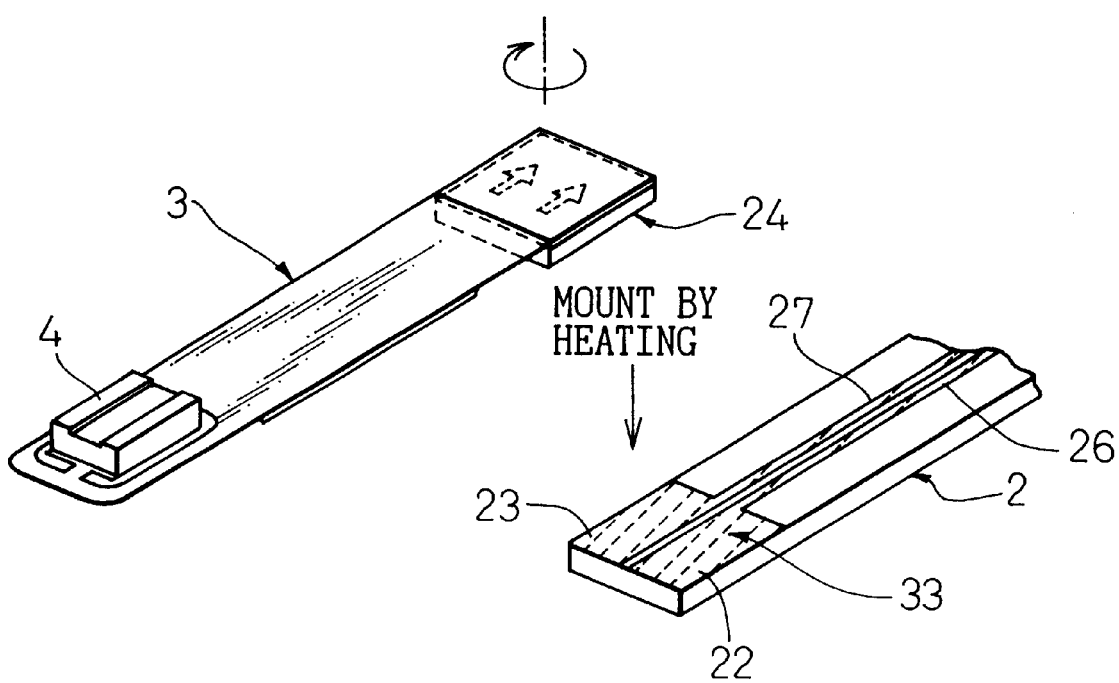

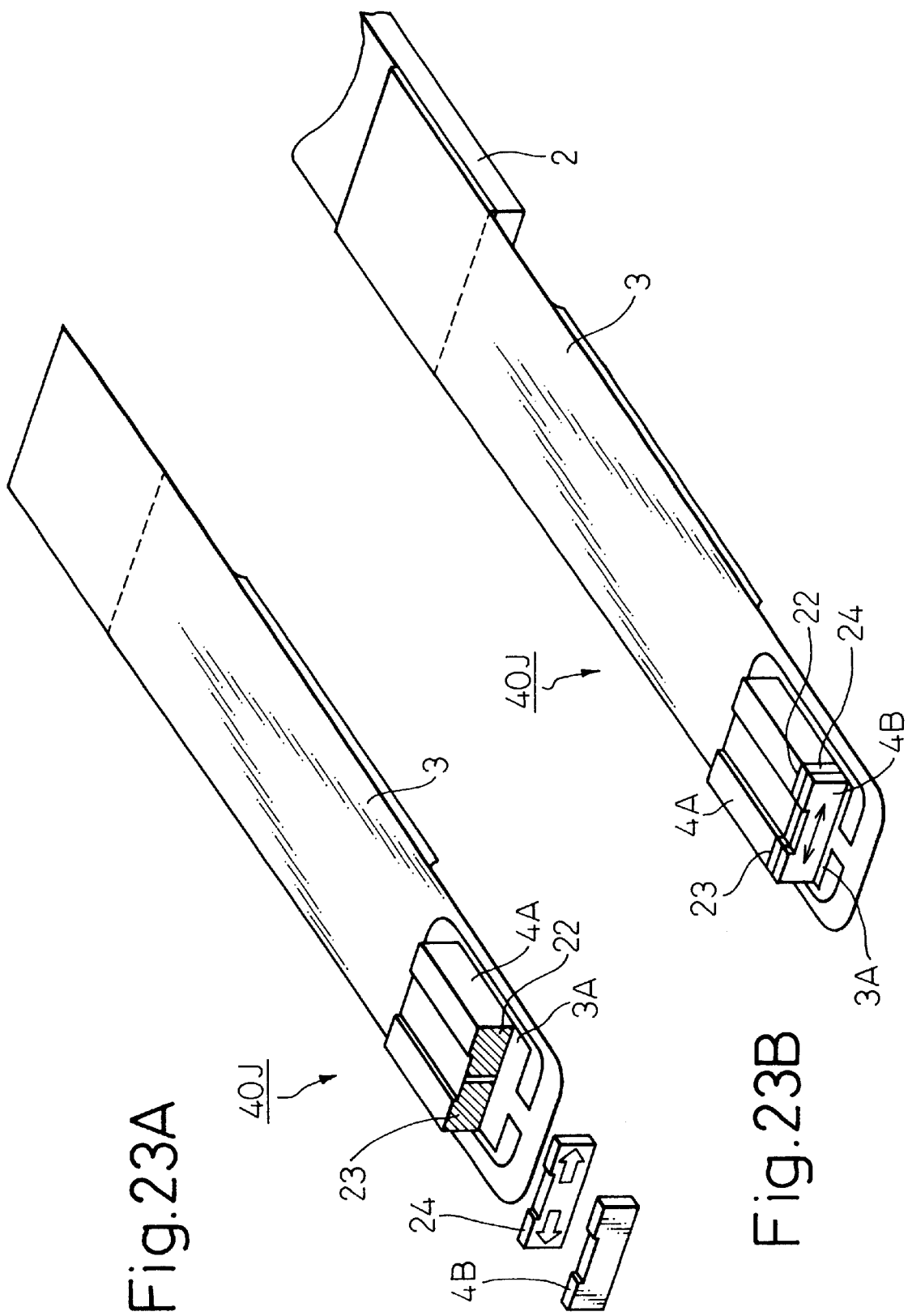

DIRECTION OF
ELECTRIC FIELD

E

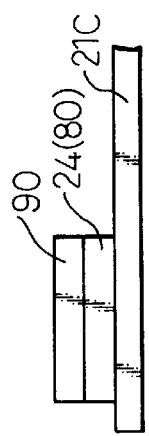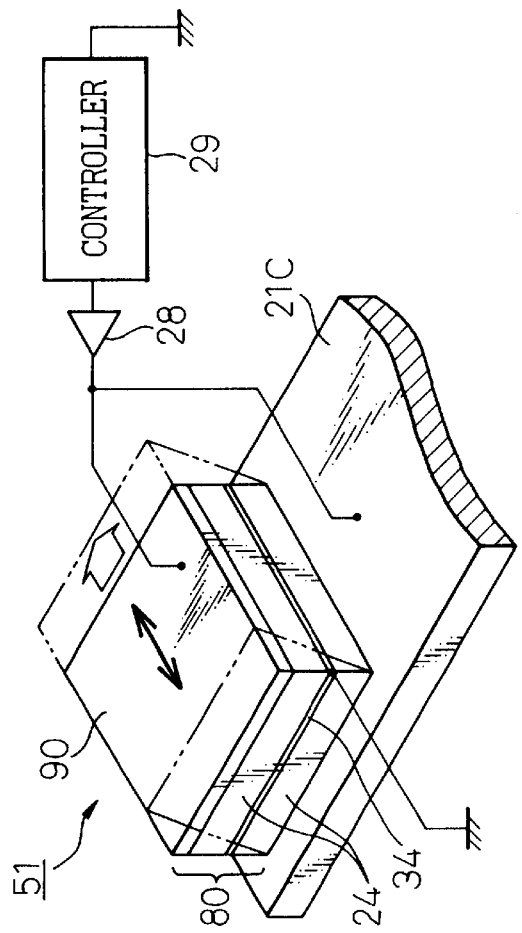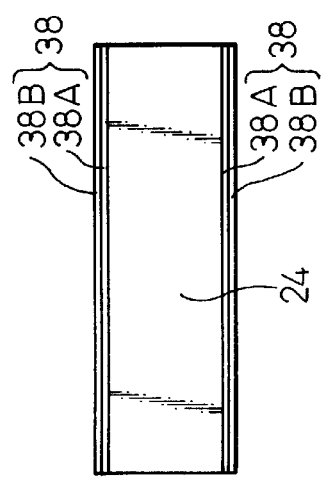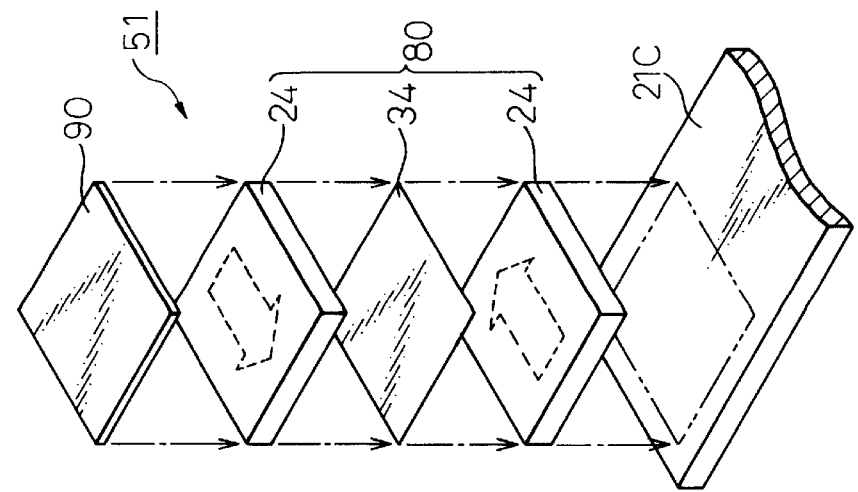

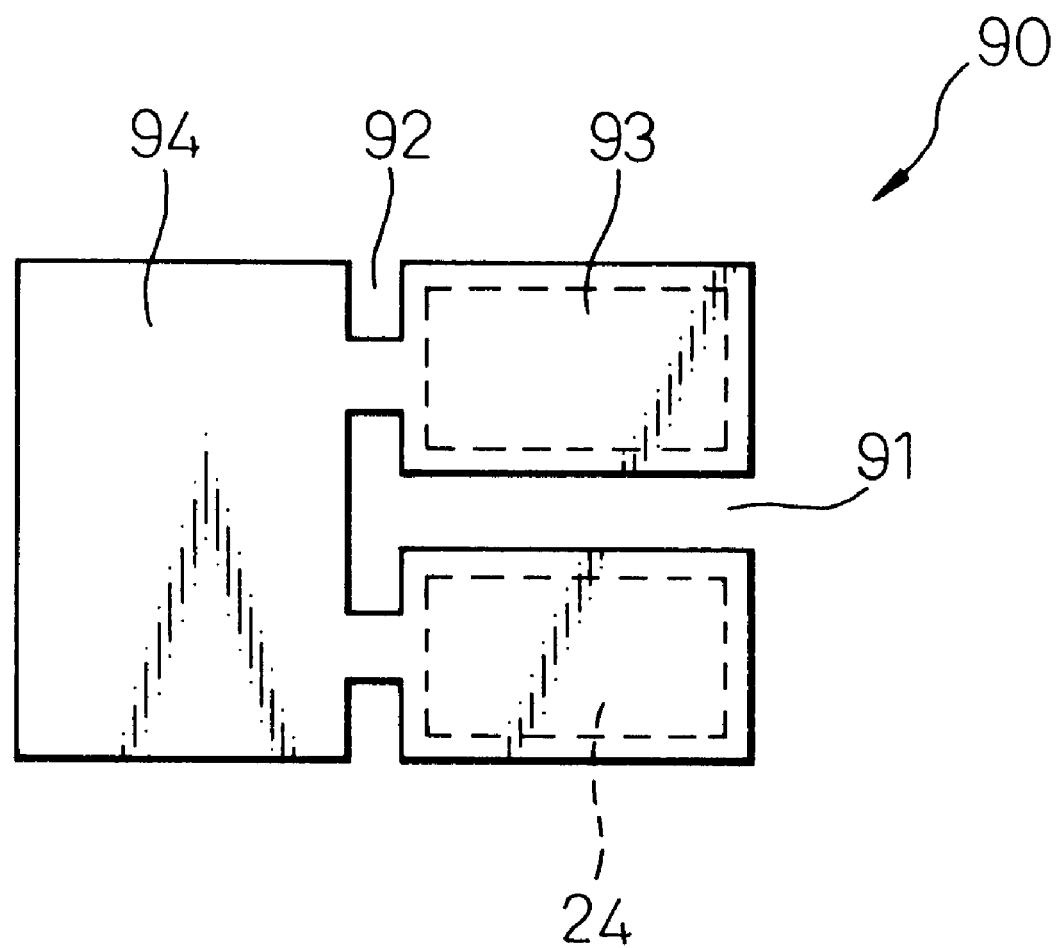

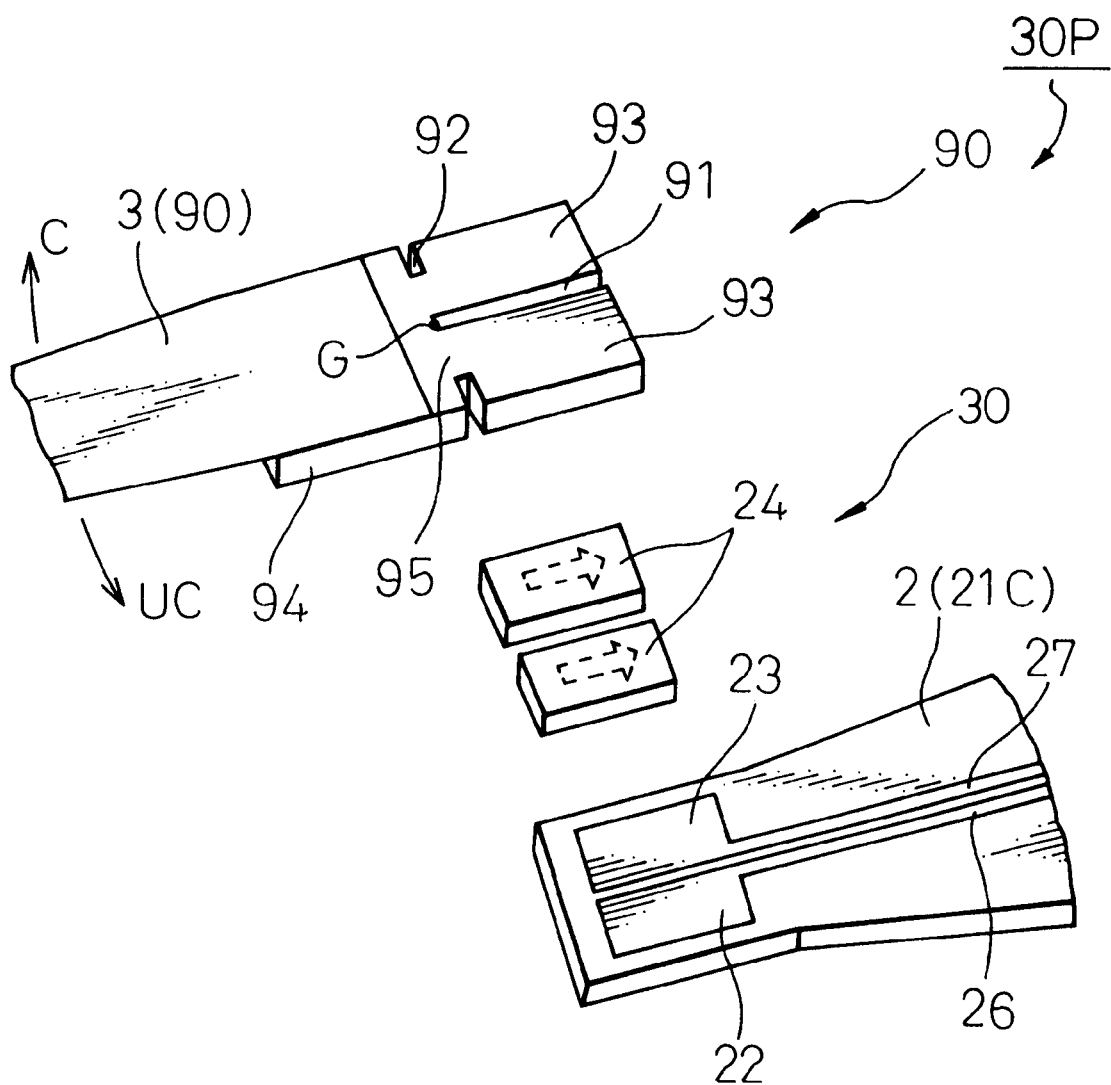

ACTUATOR USING PIEZOELECTRIC ELEMENT AND HEAD-POSITIONING MECHANISM USING THE ACTUATOR

BACKGROUND OF THE INVENTION

1. Field of the Invention

The present invention relates to an actuator using a piezoelectric element, and a head-positioning mechanism using the actuator. More in particular, the present invention relates to an actuator using a piezoelectric element, capable of positioning with high accuracy, and a head-positioning mechanism using such an actuator.

2. Description of the Related Art

In recent years, information equipment has increased in precision and demand has risen for an actuator able to operate over a minuscule distance. Actuators for correcting the focal point or controlling the inclination angle of optical systems or head actuators for printers and magnetic disk drives, for example, require the capability of controlling the motion thereof to a very high accuracy.

A magnetic disk drive is one of key devices of in multimedia equipment, the market for which has expanded in recent years. Development of a device having a larger memory capacity is desired for use with multimedia equipment which can handle image and voice data in a greater amount and at higher speed. An increased capacity of a magnetic disk drive is generally realized by increasing the storage capacity of each disk. If the storage density is sharply increased without changing the disk diameter, however, the track pitch is sharply reduced. The resulting technical problem is how to accurately position the head device for reading from and writing onto a recording track. A head actuator having a high positioning accuracy is therefore desired.

With conventional magnetic disk drives, an attempt has been made to improve the rigidity of the movable parts such as the carriage and thus to increase the main resonance frequency of in-plane mode. Nevertheless, increasing the frequency of the resonance frequency has its own limitation. Even if the frequency of the resonance frequency caused by stiffness of carriage arms can be increased remarkably, resonance would be generated by the spring characteristics of the bearing supporting the movable parts. Thus, it is difficult to reduce positioning errors.

Also, it has so far been difficult to increase the servo bandwidth for positioning control of a magnetic disk drive.

A proposal that has been made as a means for solving these problems is to arrange a second actuator for following the track at the forward end of the arm of the head actuator. This second actuator is capable of positioning the head at the forward end of the arm independently of the operation of the head actuator.

Unexamined Patent Publication (Kokai) No. 3-69072 (JP-A-3-69072), for example, discloses a disk drive comprising a sub-actuator, arranged at the forward end of an arm for positioning the head, in addition to a main actuator for a disk drive. This sub-actuator includes two multilayered piezoelectric elements each configured of a plurality of piezoelectric elements in the plane of head movement, each piezoelectric element being adapted to be displaced along the thickness direction. The expansion and contraction of the piezoelectric elements can move the head finely in the same direction as the plane of head movement.

This sub-actuator is formed as a swingable center spring, having the function of a spring, having a thin arm portion with a multilayered piezoelectric element arranged on both sides thereof. This swingable center spring can be configured of a plurality of slits formed alternately inwardly in the direction perpendicular to the longitudinal direction of the thin arm portion. The swingable center spring imparts a pre-load on the multilayered piezoelectric elements and enhances the operation of extension and contraction thereof at the same time. The multilayered piezoelectric elements and the arm are electrically insulated from each other by an insulating material, and lead wires are led from the electrodes at the ends thereof so that a drive voltage for the multilayered piezoelectric elements is supplied through the lead wires.

The problems of the above-mentioned conventional apparatuses are that a multilayered piezoelectric element is difficult to fabricate, that a pre-load mechanism machined with high precision is required and that the electrodes of the multilayered piezoelectric elements are required to be led out by a lead wire or a wiring member. These factors have increased the cost of the sub-actuator.

Further, the invention described in Examined Patent Publication No.2528261 discloses a head-positioning mechanism including a positioning actuator at the forward end of an arm for following the tracks. The head-positioning mechanism is mounted on a coupling plate for coupling an access arm protruded from the carriage of the head actuator to a support spring with a head mounted at the forward end thereof.

The coupling plate on which the head-positioning mechanism is arranged includes a fixed area, a movable area, an extendable area, a hinge section and a gap. A groove is formed on each of the two surfaces of the extendable area. Piezoelectric elements are fixed in the grooves. The piezoelectric elements located at symmetric positions about the center line of the coupling plate are deformed in opposite directions at the same time upon application of different potentials from a power supply to the outer side surfaces thereof, respectively, with the coupling plate as a common electrode.

The head-positioning mechanism having the above-mentioned configuration, however, requires a high accuracy in the fabrication of the multilayered piezoelectric elements and highly accurate outer dimensions of the element. Further, the arm is required to be machined with high dimensional accuracy and the coupling plate having a comparatively high rigidity is required to be extended and contracted. The resulting problem is that strong forces are required to obtain a predetermined stroke in the head-positioning mechanism.

SUMMARY OF THE INVENTION

The object of the present invention is to provide an actuator using a shear-type piezoelectric element capable of positioning a head transducer with high accuracy without requiring a high dimensional accuracy of component parts and a head-positioning mechanism using such an actuator.

According to a first aspect of the invention, there is provided an actuator using a shear-type piezoelectric element comprising two electrodes arranged in juxtaposition at a fixed end of the actuator, a shear-type piezoelectric element laid on the two electrodes, and an opposite electrode arranged on the surface at a free end of the actuator in an opposed relationship to the two electrodes of the shear-type piezoelectric element, wherein the opposed electrode is displaced in a direction in the plane thereof in accordance with the direction of polarization of the piezoelectric element upon application of a voltage between the two electrodes.

According to a second aspect of the invention, there is provided an actuator of the first aspect, wherein the shear-type piezoelectric element is polarized in the direction parallel to the direction in which the two electrodes are juxtaposed and wherein the shear-type piezoelectric element is displaced in such a direction as to rotate about the central portion thereof upon application of a voltage to the two electrodes.

According to a third aspect of the invention, there is provided an actuator of the first aspect, wherein the shear-type piezoelectric element is polarized in the direction parallel to the direction in which the two electrodes are juxtaposed, wherein the shear-type piezoelectric elements on the two portions of the shear-type piezoelectric elements are polarized in opposite directions to each other, and wherein the actuator is displaced in the direction parallel to the direction of polarization of the shear-type piezoelectric elements upon application of a voltage to the two electrodes.

According to a fourth aspect of the invention, there is provided an actuator of the first aspect, wherein the shear-type piezoelectric element is polarized in the direction perpendicular to the direction in which the two electrodes are juxtaposed, wherein the two portions of the shear-type piezoelectric element arranged on the two electrodes are polarized in the directions opposite to each other, and wherein the actuator is displaced in the direction parallel to the directions in which the shear-type piezoelectric element is polarized upon application of a voltage to the two electrodes.

According to a fifth aspect of the invention, there is provided an actuator of any of the first to fourth aspects, wherein a shear-type piezoelectric element is divided into two independent portions laid on two electrodes, respectively.

According to a sixth aspect of the invention, there is provided a disk drive comprising at least a recording disk, a head, and a head actuator for setting the head in position on the desired track on the recording disk, wherein a head-positioning mechanism is configured using an actuator of any of the first to fifth aspects in a part of the head actuator for moving the head by a small distance independently of the motion of the head actuator, wherein the two electrodes of the actuator are arranged at the forward end of an arm of the head actuator and wherein the base of a support spring of the head actuator is mounted on an opposed electrode of the actuator.

According to a seventh aspect of the invention, there is provided an actuator of a sixth aspect, wherein a dividing plane between the two electrodes is arranged longitudinally on the arm.

According to an eighth aspect of the invention, there is provided a disk drive of the sixth aspect, wherein the a dividing plane between the two electrodes is arranged in the direction perpendicular to the longitudinal direction of the arm.

According to a ninth aspect of the invention, there is provided an actuator using a shear-type piezoelectric element comprising a circular aperture of a predetermined depth formed at a fixed end of the actuator, two electrodes arranged in such positions on the inner peripheral surface of the circular aperture as to divide the particular inner peripheral surface into two laterally symmetric sections, two semi-annular shear-type piezoelectric elements of a predetermined thickness laid on the inner peripheral surfaces of the two electrodes and adapted to be polarized symmetrically about the dividing plane, an opposed electrode arranged over the inner peripheral surfaces of the two semi-annular shear-type piezoelectric elements, and a rotational shaft fixedly secured to the inner peripheral surface of the opposed electrode and adapted to rotate upon application of a voltage between the two electrodes.

According to a tenth aspect of the invention, there is provided a disk drive comprising at least a recording disk, a head, and a head actuator for positioning the head on the desired recording track on the recording disk, wherein a head-positioning mechanism is configured using the actuator of the ninth aspect with a part of the head actuator in order to move the head by a small distance independently of the motion of the head actuator, wherein a fixed end of the actuator is arranged at the forward end of the arm of the head actuator and wherein a movable part of the actuator is mounted on the base of a support spring of the head actuator.

According to an 11th aspect of the invention, there is provided an actuator using a shear-type piezoelectric element, comprising a deep slit-like groove of a predetermined depth formed at a fixed end of the actuator, two electrodes arranged on the two opposed internal surfaces of the slit-like deep groove, two shear-type piezoelectric elements of a predetermined thickness laid on the two electrodes, respectively, and a conductive movable plate fixedly inserted in the space between the two shear-type piezoelectric elements, wherein the movable plate is displaced in accordance with the direction of polarization of the shear-type piezoelectric elements upon application of a voltage between the two electrodes and the movable plate.

According to a 12th aspect of the invention, there is provided a disk drive comprising at least a recording disk, a head, and a head actuator for positioning the head on the desired recording track on the recording disk, wherein a head-positioning mechanism is configured using the actuator of the 11th aspect of the invention with a part of the head actuator for moving the head by a small distance independently of the motion of the head actuator, wherein a fixed end of the actuator constitutes the forward end of the arm of the head actuator and wherein the movable plate of the actuator constitutes the base of a support spring of the head actuator.

According to a 13th aspect of the invention, there is provided a disk drive comprising at least a recording disk, a head, and a head actuator for positioning the head on the desired recording track on the recording disk, wherein a head-positioning mechanism is configured using the actuator in any of the first to fifth aspects of the invention with a part of the head actuator for moving the head by a small distance independently of the motion of the head actuator, wherein the two electrodes of the actuator are arranged at the forward end of the support spring of the head actuator, and wherein a head slider of the head actuator is arranged on the opposed electrode of the actuator.

According to a 14th aspect of the invention, there is provided a disk drive in the 13th aspect of the invention, wherein the two electrodes are arranged in juxtaposition longitudinally on the support spring.

According to a 15th aspect of the invention, there is provided an actuator in the 13th aspect of the invention, wherein the two electrodes are arranged in juxtaposition in the direction perpendicular to the longitudinal direction of the support spring.

According to a 16th aspect of the invention, there is provided a disk drive comprising at least a recording disk, a head, and a head actuator for positioning the head on the desired recording track on the recording disk, wherein a head-positioning mechanism is configured using the actuator in the fourth aspect of the invention with a part of the head actuator for moving the head by a small distance independently of the motion of the head actuator, wherein the two electrodes of the actuator are arranged at an end of the head slider nearer to the head, and wherein a head element board including the head of the head actuator is arranged on the opposed electrode of the actuator.

According to a 17th aspect of the invention, there is provided an actuator comprising a fixed member constituting a baseboard, a drive member including a plurality of piezoelectric elements and a movable member arranged on the drive member, the actuator being activated upon application of a voltage to the two surfaces of the piezoelectric element, wherein each of the piezoelectric elements polarized in the direction perpendicular to the direction along the thickness thereof and deformed by shearing upon application of a voltage thereto, are laid one on another in alternate directions of polarization thereby to make up the drive member, and a voltage is applied between the electrodes of each of the piezoelectric elements thereby to drive the movable member in parallel to the fixed member.

According to an 18th aspect of the invention, there is provided an actuator comprising two drive members each including a piezoelectric element arranged adjacently in parallel to each other on a fixed member making up a baseboard, and a movable member arranged over the two drive members, the actuator being activated upon application of a voltage to the sides of each of the piezoelectric elements, wherein each of the piezoelectric elements is polarized and deformed by shearing in the directions perpendicular to the direction along the thickness thereof upon application of a voltage thereto, wherein the piezoelectric elements are arranged substantially parallel to each other in alternately opposite directions of polarization thereby to make up a drive member, and wherein a voltage is applied between each pair of electrodes in the same direction thereby to rotate the movable member relative to the fixed member.

According to a 19th aspect of the invention, there is provided an actuator of the 18th aspect, wherein each of the piezoelectric elements in a first layer has arranged thereon, through a common electrode, a second layer of piezoelectric elements in the same number as in the first layer polarized in the directions parallel and opposite to those of the piezoelectric elements in the first layer, respectively, and wherein the amount of rotation of the movable member relative to the fixed member is increased by applying a predetermined voltage thereto.

According to a 20th aspect of the invention, there is provided an actuator comprising a fixed member constituting a baseboard, a drive member including a piezoelectric element and a movable member arranged on the drive member, the actuator being activated by applying a voltage to the sides of the piezoelectric element, wherein the drive member includes the single piezoelectric element having different portions thereof polarized in two parallel and opposite directions, wherein the piezoelectric element is deformed by shearing upon application of a voltage thereto, and wherein the movable member is rotated relative to the fixed member upon application of a voltage between the electrodes of the piezoelectric element.

According to a 21st aspect of the invention, there is provided an actuator of the 20th aspect comprising a piezoelectric element making up a drive member, and at least a second piezoelectric element arranged on the first piezoelectric element through a common electrode and polarized in the directions parallel and opposite to that of the first piezoelectric element, wherein the amount of rotation of the movable member relative to the fixed member is increased upon application of a predetermined voltage.

According to a 22nd aspect of the invention, there is provided an actuator of the 18th, 19th, 20th or 21st aspect, wherein an electrode for applying a voltage to the side of the piezoelectric element nearer to the fixed member is arranged independently for each direction of polarization of the piezoelectric element.

According to a 23rd aspect of the invention, there is provided an actuator of the 17th, 19th or 21st aspect, wherein a plurality of the piezoelectric elements stacked one on another have a portion thereof not overlaid, and wherein the electrode portion exposed from the overlaid portion is connected with a lead wire for applying a voltage.

According to a 24th aspect of the invention, there is provided an actuator of any one of the 18th to 21st aspects, wherein the movable member includes a base directly driven by a piezoelectric element and a magnified coverage portion extended from the base, and wherein a first notch for dividing the base into two portions is formed in parallel to the direction of polarization of the drive member laid on the base.

According to a 25th aspect of the invention, there is provided an actuator of the 24th aspect, wherein second notches perpendicular to the first notch are formed in the boundary between the base and the magnified coverage portion of the movable member, and wherein hinges are formed in the portion sandwiched between the forward ends of the first and second notches.

According to a 26th aspect of the invention, there is provided an actuator comprising a fixed member constituting a baseboard, a drive member including a piezoelectric element and a movable member arranged on the fixed member, the actuator being activated by applying a voltage to the two sides of the piezoelectric element, wherein the piezoelectric element is polarized in the direction perpendicular to the direction along the thickness thereof and deformed by shearing upon application of a voltage thereto, and wherein the movable member is driven in parallel to the fixed member upon application of the voltage.

According to a 27th aspect of the invention, there is provided an actuator of any one of the 17th to 26th aspects, wherein an electrode film is formed by sputtering on each of the surfaces of the piezoelectric element in contact with an electrode.

According to a 28th aspect of the invention, there is provided an actuator of any one of the 17th to 27th aspects, wherein means for applying a voltage to the side of the piezoelectric element nearer to the fixed member and the side of the piezoelectric element nearer to the movable member constitutes a conductive adhesive.

According to a 29th aspect of the invention, there is provided a head-positioning mechanism for a disk drive comprising a recording disk, a head and a head actuator, wherein the head actuator includes a piezoelectric element according to any one of the 17th to 28th aspects for moving the head independently of the head actuator, wherein the fixed member constitutes a head arm of the head actuator, and wherein the base of a support spring with a head mounted at the forward end thereof is fixed at an end of the movable member.

According to a 30th aspect of the invention, there is provided a head-positioning mechanism for a disk drive comprising a recording disk, a head and a head actuator, wherein the head actuator includes a head actuator according to any of the 17th or 28th aspects for moving the head independently of the head actuator, wherein the fixed member constitutes an access arm of the head actuator and wherein the movable member constitutes a support spring with a head mounted at the forward end thereof.

According to a 31st aspect of the invention, there is provided a head-positioning mechanism for a disk drive comprising a recording disk, a head and a head actuator, using an actuator of the 24th or 25th aspect as a part of the head actuator for moving the head independently of the head actuator, wherein the fixed member constitutes an access arm of the head actuator, wherein two electrodes are arranged in juxtaposition at the forward end of the fixed member for applying a voltage to drive members, wherein the drive members are polarized in the same direction, and wherein the base of a support spring with a head mounted at the forward end thereof is fixed at an end of a magnified coverage portion.

According to a 32nd aspect of the invention, there is provided a head-positioning mechanism for a disk drive comprising a recording disk, a head and a head actuator, using an actuator of the 24th or 25th aspect as a part of the head actuator for moving the head independently of the head actuator, wherein the fixed member constitutes an access arm of the head actuator, wherein two electrodes are arranged in juxtaposition at the forward end of the fixed member for applying a voltage to drive members, wherein the drive members are polarized in the same direction, and wherein the movable member constitutes a support spring with a head mounted at the forward end thereof.

According to the first to fifth aspects, the ninth aspect and the 11th aspect of the invention, an inexpensive and high-accuracy actuator is obtained.

According to the sixth to eighth aspects and the 13th aspect of the invention, an inexpensive and high-accuracy head-positioning mechanism is obtained using any of the actuators in the first to fifth aspects.

According to the tenth aspect, an inexpensive and high-accuracy head-positioning mechanism is obtained using the actuator of the ninth aspect of the invention.

According to the 12th aspect, an inexpensive and high-accuracy head-positioning mechanism is obtained using the actuator of the 11th aspect of the invention.

According to the 14th and 15th aspects, an inexpensive and high-accuracy head-positioning mechanism is obtained using the actuator of the 13th aspect of invention.

According to the 16th aspect, an inexpensive and high-accuracy head-positioning mechanism is obtained using the actuator of the fourth aspect of the invention.

According to the 17th aspect, the movable member can be driven in parallel to the fixed member, so that a parallel-driven actuator is obtained which is large in displacement, inexpensive and high in precision.

According to the 18th aspect, the movable member can be rotated relative to the fixed member, so that a rotary actuator is obtained which is inexpensive and high in precision.

According to the 19th aspect, the amount of rotation of the movable member relative to that of the fixed member can be increased.

According to the 20th aspect, the movable member can be rotated relative to the fixed member, and a rotary actuator is obtained which is composed of a smaller number of parts, is inexpensive and is high in precision.

According to the 21st aspect, the amount of rotation of the movable member relative to the fixed member of the actuator according to the 20th aspect can be increased.

According to the 22nd aspect, the movable member can constitute a common electrode and therefore is not required to be connected to one of electrodes.

According to the 23rd aspect, a lead wire for applying a voltage can be connected to an exposed portion of a plurality of piezoelectric elements having different sizes formed one on another in an actuator according to the 17th or 19th aspect, so that the lead wire can be easily connected to an intermediate electrode.

According to the 24th aspect, a first notch is added to an actuator according to any one of the 18th to 21st aspects, so that the device can be deformed to a greater extent to thereby secure a larger distance coverage by the magnified coverage portion.

According to the 25th aspect, second notches are added to the actuator according to the 24th aspect to form a hinge structure, thereby securing an even greater distance coverage by the magnified coverage portion.

According to the 26th aspect, an actuator having a simple and basic configuration is obtained.

According to the 27th and 28th aspects, the contact between the piezoelectric element and the electrodes is improved so that the piezoelectric element extends and contracts efficiently.

According to the 29th to 32nd aspects, the fixed member of the actuator according to the 17th to 28th aspects constitutes an access arm of the head actuator, thereby providing a head-positioning mechanism which is inexpensive, superior in production efficiency, smaller in the number of parts and high in precision.

BRIEF DESCRIPTION OF THE DRAWINGS

The present invention will be more clearly understood from the description as set forth below with reference to the accompanying drawings, wherein:

FIG. 1A is a perspective view for assembly showing a basic configuration using a single shear-type piezoelectric element according to the present invention;

FIG. 1B is a perspective view showing an example of operation after assembly of the actuator of FIG. 1A;

FIG. 3A is a perspective view showing a configuration of an actuator using a single shear-type piezoelectric element according to a third embodiment of the invention;

FIG. 3B is a plan view showing the direction in which the actuator of FIG. 3A is deformed upon application of a voltage thereto;

FIG. 3C is a perspective view showing a configuration of an actuator using a single shear-type piezoelectric element according to a fourth embodiment of the invention;

FIG. 3D is a plan view showing the direction in which the actuator of FIG. 3C is deformed upon application of a voltage thereto;

FIG. 4A is a perspective view showing a configuration of an actuator using two shear-type piezoelectric elements according to a fifth embodiment of the invention;

FIG. 4B is a plan view showing the direction in which the actuator of FIG. 4A is deformed upon application of a voltage thereto;

FIG. 4C is a perspective view showing a configuration of an actuator using two shear-type piezoelectric elements according to a sixth embodiment of the invention;

FIG. 4D is a plan view showing the direction in which the actuator of FIG. 4C is deformed upon application of a voltage thereto;

FIG. 5A is a perspective view showing a configuration of an actuator using two shear-type piezoelectric elements according to a seventh embodiment of the invention;

FIG. 5B is a plan view showing the direction in which the actuator of FIG. 5A is deformed upon application of a voltage thereto;

FIG. 5C is a perspective view showing a configuration of an actuator using two shear-type piezoelectric elements according to an eighth embodiment of the invention;

FIG. 5D is a plan view showing the direction in which the actuator of FIG. 5C is deformed upon application of a voltage thereto;

FIG. 7 is a diagram for explaining the steps of mounting an actuator according to the invention between the arm of the head actuator and the support spring mounted on the arm in a disk drive;

FIG. 23A is a perspective view for assembly showing a configuration of the head-positioning mechanism in the second application using an actuator according to the third embodiment of the invention;

FIG. 23B is a perspective view showing the assemble state of the head-positioning mechanism of FIG. 23A;

FIG. 31A is a perspective view showing the configuration of an actuator using a shear-type piezoelectric element according to an 11th embodiment in assembled state.

FIG. 31B is a perspective view showing an example operation of the actuator of FIG. 31A after being assembled.

FIG. 31C is a side view of a piezoelectric element with an electrode film formed on each of the upper and lower surfaces according to a modification of the 11th embodiment of the invention.

FIG. 31D is a side view of an actuator according to another modification of the 11th embodiment.

FIG. 41 is a plan view showing a hinge structure of a spacer used with the actuator according to another embodiment of the invention.

FIG. 51 is a perspective view showing a configuration according to a modification of the head-positioning mechanism in assembled state of FIGS. 50A and 50B.

DESCRIPTION OF THE PREFERRED EMBODIMENTS

Before describing the preferred embodiments, an explanation will be given of the conventional head actuator having a head-positioning mechanism shown in FIGS. 24 to 29.

A conventional disk drive has been proposed in which a second actuator for following the tracks is arranged at the forward end of the arm of a head actuator. This second actuator can finely move the head at the forward end of the arm independently of the motion of the head actuator.

Figure 24:
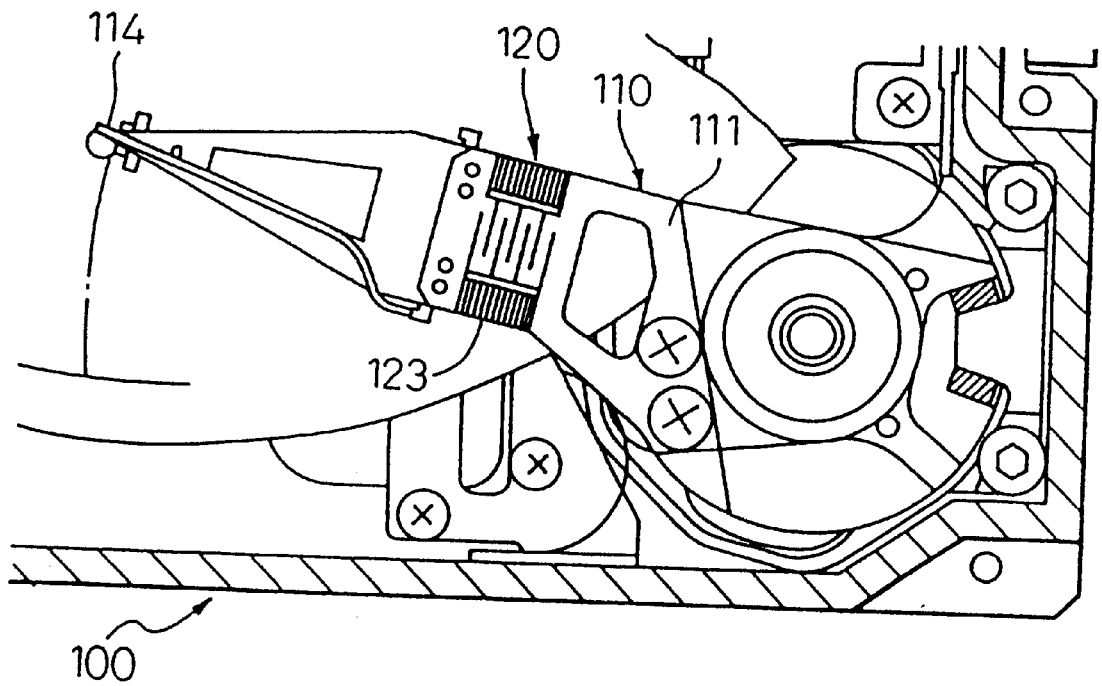
FIG. 24 is a plan view of a conventional head actuator comprising a sub-actuator.
Figure 25:
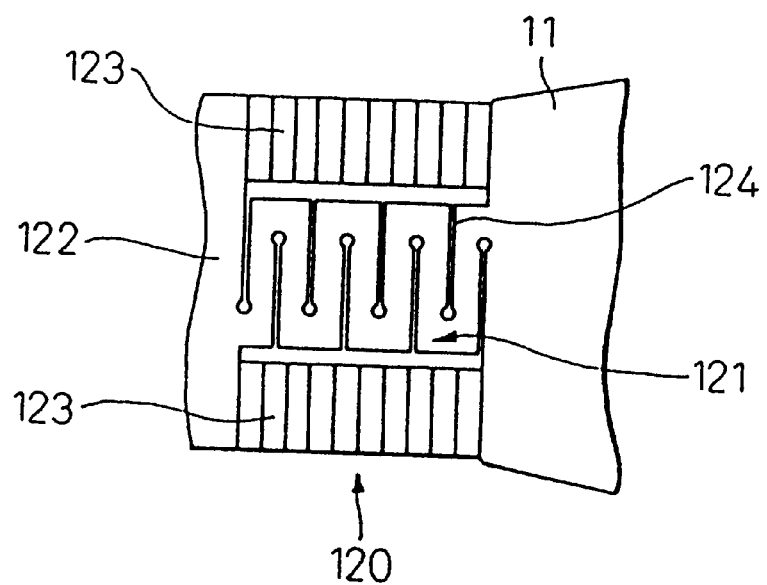
FIG. 25 is an enlarged view of the sub-actuator shown in FIG. 24.

FIG. 24 shows a head actuator disclosed in JP-A-3-69072, in which a sub-actuator 120 is arranged at the forward end of an arm 111 in addition to a main actuator 110 of a disk drive 100. This sub-actuator 120 is adapted to inch a head 114 using two multilayered piezoelectric elements 123. The sub-actuator 120 includes two multilayered piezoelectric elements 123 each composed of a plurality of piezoelectric elements adapted to be displaced along the thickness thereof in the plane of head motion. The head can thus be finely displaced in the same direction as it moves in the plane of motion.

Further, the sub-actuator 120 includes two multilayered piezoelectric elements 123 along the direction of extension of the two arms 111. As shown in detail in FIG. 25, a swingable center spring 121 is interposed between the two piezoelectric elements 123. This swingable center spring 121 is comprised of a plurality of slits 124 formed unwardly of the center arm 122 from the two sides thereof in the direction perpendicular to the longitudinal direction of the center arm 122. The slits 124 cause the center arm 122 to function as a spring and enhance the operation of extension and contraction while at the same time applying a pre-load to the multilayered piezoelectric elements 123. The multi-layered piezoelectric elements 123 and the arm 111 are electrically insulated from each other by an insulating material, and lead wires are led out of the electrodes at the ends thereof. A driving voltage is applied to the multilayered piezoelectric elements 123 through the lead wires.

The problem in this prior art is the difficulty of fabricating the multilayered piezoelectric elements 123, the necessity of a pressuring spring mechanism machined with high precision and the necessity of leading out the electrodes of the multilayered piezoelectric elements 123 by a lead wire or a wiring material, resulting in an increased cost of the sub-actuator 120.

Figure 26:
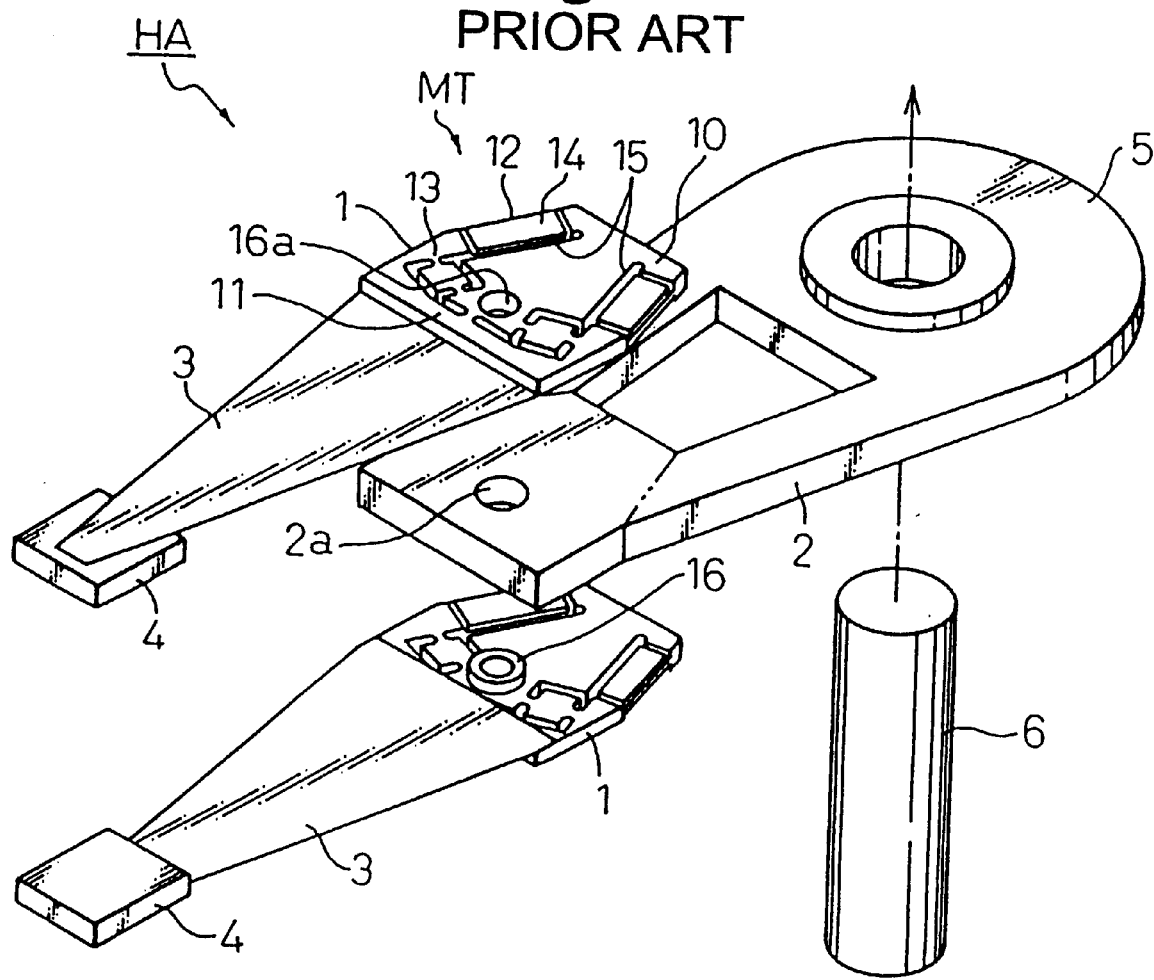
FIG. 26 is a perspective view for assembly showing a configuration of a head actuator of a disk drive including another conventional head-positioning mechanism mounted thereon.

FIG. 26 shows an invention that is therefor; and described in Examined Patent Publication No.2528261, which discloses a head-positioning mechanism comprising a positioning actuator for following the tracks at the forward end of an arm. As shown in FIG. 26, a head-positioning mechanism MT of this conventional mechanism is arranged on each of two coupling plates 1 for coupling an access arm 2 protruded from a carriage 5 of a head actuator HA to a support spring 3 mounted at the forward end of a head 4. The carriage 5 is mounted on a rotational shaft 6, and the coupling plates 1 are fixedly mounted on the access arm 2 using an adhesive or the like by fitting the protrusions 16 formed on the reverse side of each coupling plate 1 into a fixing hole 2a formed in the access arm 2.

Figure 27:
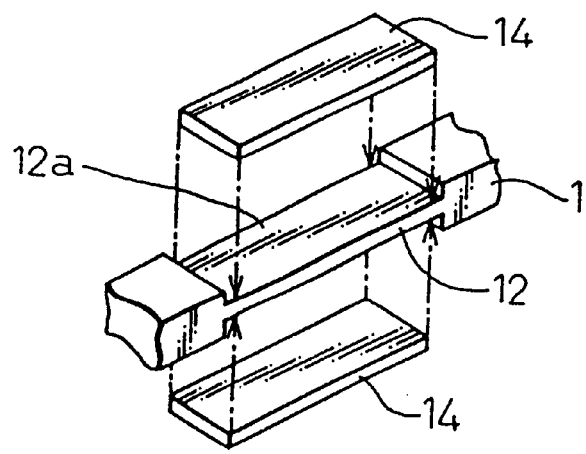
FIG. 27 is a partly-enlarged perspective view for assembly showing the head-positioning mechanism in enlarged form for the head actuator of FIG. 26.
Figure 28:
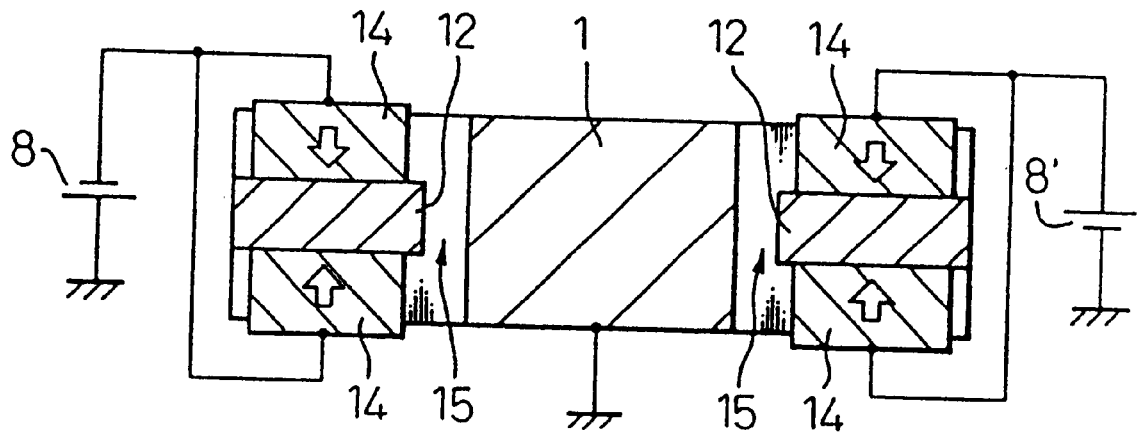
FIGS. 28 and 29 are circuit configuration diagrams showing an example connection of the piezoelectric element of FIG. 27 to a power supply.

The coupling plates 1 with the head-positioning mechanism MT arranged thereon each include a fixed area 10, a movable area 11, an extendable area 12, a hinge section 13 and gaps 15. As shown in FIG. 27, the extendable area 12 is formed with recesses 12a on the front and reverse sides thereof. Piezoelectric elements 14 are fixed in the recesses 12a.

The piezoelectric elements 14 arranged symmetrically about the center line of the coupling plate 1 are deformed in opposite directions at the same time. The piezoelectric elements 14 are polarized along the thickness as indicated by arrows in FIG. 28. When the coupling plate 1 is grounded as a common electrode and different electrical potentials are applied from power supplies 8, 8' to the outer side surfaces of the two piezoelectric elements 14, the piezoelectric element supplied with power from the power supply 8 is subjected to an electric field in the direction opposite to the polarization and extends longitudinally, while the piezoelectric element supplied with power from the power supply 8' is affected by the electric field in the same direction as polarization and contracts in longitudinal direction.

Figure 29:
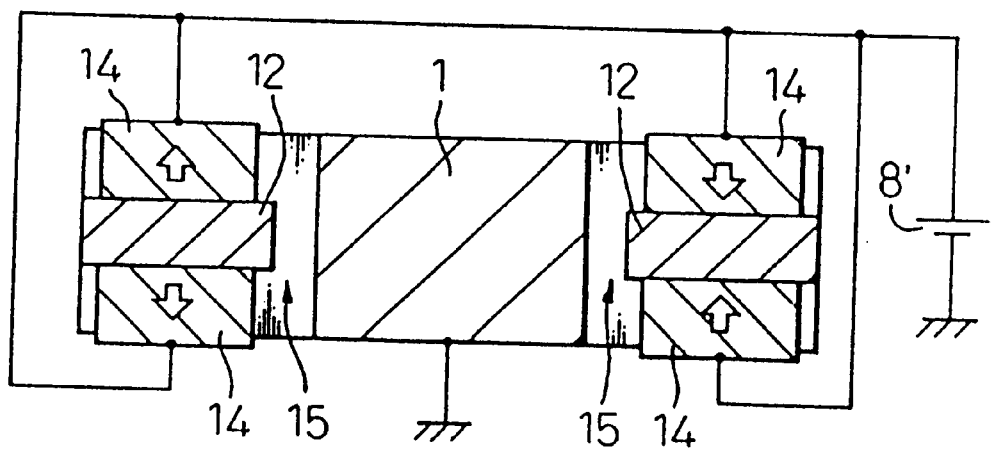

FIG. 29 shows a configuration in which the same potential is applied from the power supply 8' to the outer side surfaces of the piezoelectric elements 14 on the front and reverse sides of the two piezoelectric elements. In this case, the piezoelectric elements 14 are also polarized in the thickness direction, as indicated by the arrows. The coupling plate 1 is grounded as a common electrode. Upon application of the same potential from the power supply 8' to the outer side surfaces of the two piezoelectric elements 14, the piezoelectric element 14 on the left side in the drawing is subjected to an electric field in the direction opposite to the polarization and thus extends longitudinally, while the piezoelectric element 14 on the right side of the drawing on which an electric field in the same direction as the polarization is exerted contracts in longitudinal direction. Thus the same operation is performed as in the configuration shown in FIG. 28.

A head-positioning mechanism having the above-mentioned configuration, however, requires a high accuracy for fabrication of the multilayered piezoelectric elements and a high dimensional accuracy of the devices. Also, the machining of the arm requires a high dimensional accuracy. Further, it is necessary to extend and contract a coupling plate of a comparatively high rigidity, thereby posing the problem that a considerable force is required and an appropriate stroke cannot be secured.

Figure 30A:
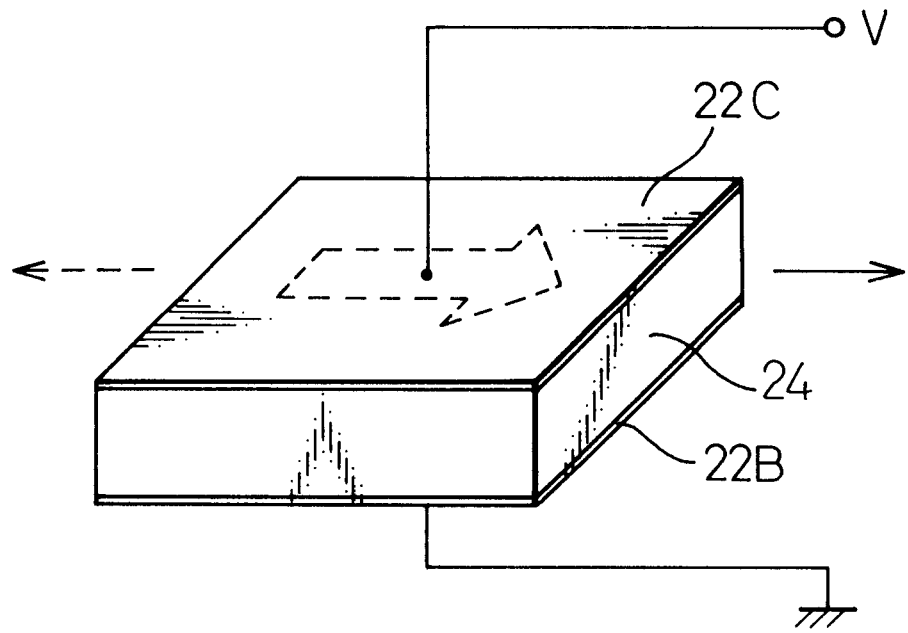
FIG. 30A is a diagram for explaining the directions of polarization and the direction of voltage application for a shear-type piezoelectric element using an actuator according to the invention.
Figure 30B:
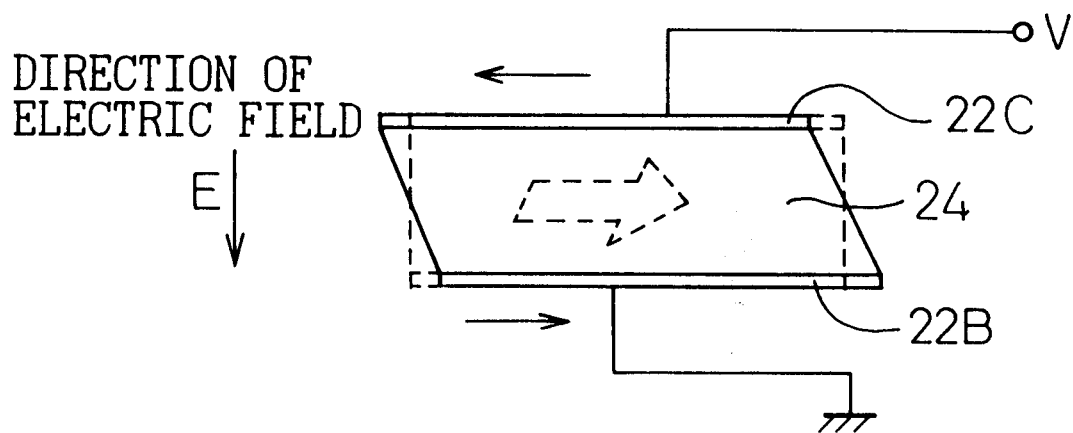
FIG. 30B is a diagram for explaining the principle of deformation of the piezoelectric element shown in FIG. 30A upon application of a voltage thereto.

Prior to describing embodiments of the invention, an explanation will be made with reference to FIGS. 30A, 30B about the operating principle of a piezoelectric element 24 (hereinafter simply termed as the shear-type piezoelectric element 24) which is polarized in the direction perpendicular to the thickness thereof and is subjected to deformation by shearing upon application of a voltage between the electrodes arranged on the two sides along the thickness thereof. As shown in FIG. 30A, electrodes 22C, 22B are mounted on the upper and lower surfaces of the piezoelectric element 24 (polarized in the direction along the dotted arrow, the direction of polarization being indicated by dotted arrow hereinafter), which is polarized in the direction perpendicular to the thickness thereof. Assume that the electrode 22B is grounded and the electrode 22C is impressed with a voltage V. The shear-type piezoelectric element 24 is known to be deformed by sliding (deformed by shearing). Upon application of the voltage V to the electrode 22C with the electrode 22B grounded, therefore, the portion of the shear-type piezoelectric element 24 nearer to the electrode 22C is deformed leftward from the original state shown by the dashed line, while the portion thereof nearer to the electrode 22B is deformed rightward, as shown in FIG. 30B.

In the case where the portion of the piezoelectric element 24 nearer to the electrode 22B is fixed, therefore, the portion thereof nearer to the electrode 22C is deformed in the direction indicated by the dashed arrow in FIG. 30A. Conversely, if the electrode 22C is grounded and the electrode 22B is impressed with the voltage V under this condition, the portion nearer to the electrode 22C is deformed in the direction indicated by solid arrow in FIG. 30A. The embodiments described below are based on this operating principle of the shear-type piezoelectric element 24.

Now, the present invention will be explained specifically and in detail with reference to embodiments.

FIG. 1A shows a basic configuration of an actuator 20 according to the present invention using a shear-type piezoelectric element 24. This diagram shows an exploded configuration of an example of the actuator 20 having a single shear-type piezoelectric element. The actuator 20 is configured in such a manner that two electrodes 22, 23 of a predetermined shape are juxtaposed in spaced relationship to each other at a fixed end 21, and a shear-type piezoelectric element 24 having a predetermined thickness is arranged as a layer on the two electrodes 22, 23. An opposite electrode 25 is arranged over the entire surface of a free end in opposed relation to the two electrodes 22, 23 of the shear-type piezoelectric element 24. The two electrodes 22, 23 are connected to lead patterns 26, 27, respectively.

FIG. 1B shows the assembled state of the actuator 20 of FIG. 1A. The actuator 20 is operated by connecting a voltage amplifier 28 and a controller 29 at the forward end of the lead patterns 26, 27. Specifically, the actuator 20 has the shear-type piezoelectric element 24 deformed by applying a voltage between the two electrodes 22, 23 using the voltage amplifier 28 and the controller 29, so that the opposed electrode 25 can be displaced in the direction of rotation, indicated by a two-dot chain, for example, in the same plane.

The direction in which the actuator 20 is displaced varies depending on the direction of polarization of the shear-type piezoelectric element 24 with respect to the electrodes 22, 23 arranged at the fixed end 21 or the direction of the voltage applied to the electrodes 22, 23. The direction of the voltage applied to the electrodes 22, 23 is determined by the polarity of the driving signal output from the controller 29. In view of this, various embodiments and examples of operation of the actuator 20 will be explained with reference to FIGS. 2 to 5 below.

FIGS. 2A to 2D show example configurations of the actuators according to first and second embodiments of the invention. The actuators according to the first and second embodiments use a single shear-type piezoelectric element 24.

Figure 2A:
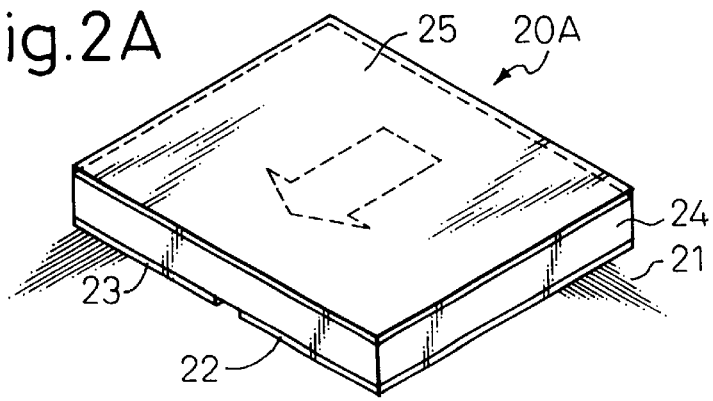
FIG. 2A is a perspective view showing a configuration of an actuator using a single shear-type piezoelectric element according to a first embodiment of the invention.

FIG. 2A shows a configuration of the actuator 20A according to the first embodiment in which the shear-type piezoelectric element is polarized in one direction. The actuator 20A according to the first embodiment has a shear-type piezoelectric element 24 laid on electrodes 22, 23 arranged at a fixed end 21. The direction of polarization of the shear-type piezoelectric element 24 is parallel to the direction in which the two electrodes 22, 23 are juxtaposed.

Figure 2B:
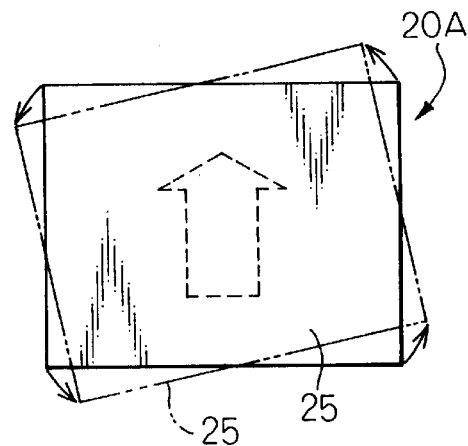
FIG. 2B is a plan view showing the direction in which the actuator of FIG. 2A is deformed upon application of a voltage thereto.

FIG. 2B shows the direction in which the actuator 20A is deformed when a voltage is applied between the electrodes 22, 23 of the actuator 20A according to the first embodiment shown in FIG. 2A. Suppose a voltage is applied between the two electrodes 22, 23. Upon application of a positive voltage to the electrode 23 and a negative voltage to the electrode 22, for example, the same situation develops as if two shear-type piezoelectric elements 24 having different directions of polarization are electrically connected in series, so that the portions of the shear-type piezoelectric element 24 arranged on the two electrodes 22, 23 are sheared in opposite directions. In such a case, the opposed electrode 25 is rotated, in the direction indicated by the two-dot chain, about the central portion of the shear-type piezoelectric element 24. In the case where the polarities of the voltages applied to the electrodes 22, 23 are reversed, in contrast, the opposed electrode 25 rotates in the direction opposite to the rotational direction shown in FIG. 2B.

Figure 2C:
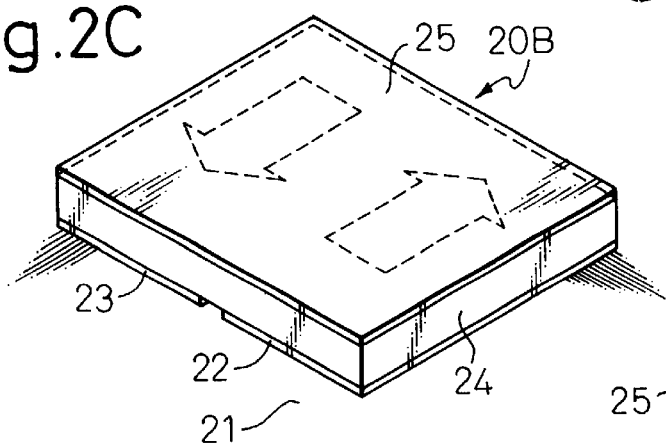
FIG. 2C is a perspective view showing a configuration of an actuator using a single shear-type piezoelectric element according to a second embodiment of the invention.

FIG. 2C shows a configuration of an actuator 20B according to a second embodiment in which the shear-type piezoelectric element 24 has two directions of polarization. The actuator 20B according to the second embodiment is also so configured that a shear-type piezoelectric element 24 is laid on the electrodes 22, 23 arranged at the fixed end 21. The directions of polarization of the two portions of the shear-type piezoelectric element 24 are opposite to each other and parallel to the direction in which the two electrodes 22, 23 are juxtaposed. The opposed electrode 25 is arranged on the shear-type piezoelectric element 24.

Figure 2D:
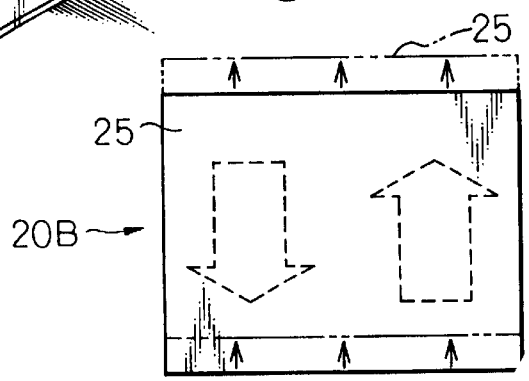
FIG. 2D is a plan showing the direction in which the actuator of FIG. 2C is deformed upon application of a voltage thereto.

FIG. 2D shows the direction in which the actuator 20B according to the second embodiment shown of FIG. 2C is deformed upon application of a voltage between the electrodes 22, 23 of the actuator 20B. Assume that a voltage is applied between the two electrodes 22, 23. For example, assume that a positive voltage is applied to the electrode 23 and a negative voltage is applied to the electrode 22. A situation develops as if two shear-type piezoelectric elements 24 having the same direction of polarization were connected electrically in series with each other, so that the two portions of the shear-type piezoelectric element 24 arranged on the two electrodes 22, 23 are sheared in the same direction. In this case, therefore, the opposed electrode 25 moves, in parallel, in the direction indicated by two-dot chain. Upon reversal of the polarities of the voltages applied to the electrodes 22, 23, on the other hand, the opposed electrode 25 proceeds in parallel in the direction opposite to the direction shown in FIG. 2D.

FIGS. 3A to 3D show example configurations of the actuators according to the third and fourth embodiments of the invention, respectively. The actuators according to the third and fourth embodiments also use a single shear-type piezoelectric element 24. A partitioning groove 241 is formed in parallel to the direction in which the electrodes are juxtaposed at the central portion of the shear-type piezoelectric element 24. The direction of polarization of the two portions of the shear-type piezoelectric element 24 is differentiated on the two sides of the partitioning groove 241.

FIG. 3A shows a configuration of an actuator 20C according to a third embodiment of a shear-type piezoelectric element 24 having two directions of polarization. In the actuator 20C according to the third embodiment, the shear-type piezoelectric element 24 with two portions thereof having the directions of polarization away from each other on both sides of the partitioning groove 241 is laid on the electrodes 23, 24 arranged at the fixed end 21. An opposed electrode 25 is formed over the entire surface of the shear-type piezoelectric element 24 including the partitioning groove 241.

FIG. 3B shows the direction in which the actuator 20C according to the third embodiment of FIG. 3A is deformed upon application of a voltage between the electrodes 22, 23. When a voltage is applied between the two electrodes 22, 23, the same situation develops as if the two portions of the shear-type piezoelectric element 24 having the same direction of polarization are connected in series electrically, so that the two portions of the shear-type piezoelectric element 24 arranged on the two electrodes 22, 23 are sheared in the same direction. In this case, therefore, the opposed electrode 25 proceeds in parallel in the direction indicated by two-dot chain. If the polarities of the voltages applied to the electrodes 22, 23 are reversed, on the other hand, the opposed electrode 25 proceeds in parallel in the direction opposite to the direction of proceeding shown in FIG. 3B.

FIG. 3C shows a configuration of an actuator 20D according to a fourth embodiment in which the shear-type piezoelectric element 24 has two directions of polarization. In the actuator 20D according to the fourth embodiment, two portions of the shear-type piezoelectric element 24 having opposed directions of polarization on each side of the partitioning groove 241 are arranged on the electrodes 22, 23 at the fixed end 21. An opposed electrode 25 is arranged over the entire surface of the shear-type piezoelectric element 24 including the partitioning groove 241.

FIG. 3D shows the direction in which the actuator 20D is deformed upon application of a voltage between the electrodes 22, 23 of the actuator 20D according to the fourth embodiment of FIG. 3C. When a voltage is applied between the two electrodes 22, 23, a situation develops as if two portions of the shear-type piezoelectric element 24 having the same direction of polarization were electrically connected in series with each other. As a result, like in the actuator 20C according to the third embodiment, the opposed electrode 25 proceeds in parallel in the direction indicated by two-dot chain. In the case where the polarities of the voltages applied to the electrodes 22, 23 are reversed, the opposed electrode 25 proceeds in the direction opposite to the direction shown in FIG. 3D.

FIGS. 4A to 4D show example configurations of actuators according to fifth and sixth embodiments of the present invention. The actuators according to the fifth and sixth embodiments each use two shear-type piezoelectric elements 24A, 24B.

FIG. 4A shows a configuration of an actuator 20E according to a fifth embodiment in which the shear-type piezoelectric elements 24A, 24B have the same direction of polarization. The actuator 20E according to the fifth embodiment includes shear-type piezoelectric elements 24A, 24B which are laid on the electrodes 22, 23 at the fixed end 21 and which have the direction of polarization identical to the longitudinal direction of the electrodes 22, 23, respectively. An opposed electrode 25 is arranged on the shear-type piezoelectric elements 24A, 24B.

FIG. 4B shows the direction in which the actuator 20E according to the fifth embodiment of the invention of FIG. 4A is deformed when a voltage is applied between the electrodes 22, 23 of the actuator 20E. Upon application of a voltage between the two electrodes 22, 23, e.g., upon application of a positive voltage to the electrode 23 and a negative voltage to the electrode 22, then the shear-type piezoelectric elements 24A, 24B having different directions of polarization are connected in series electrically, so that the shear-type piezoelectric elements 24A, 24B on the two electrodes 22, 23 are sheared in opposite directions. In such a case, the opposed electrode 25 of the two electrodes 22, 23 rotates in the direction indicated by two-dot chain about the central portion of the shear-type piezoelectric elements 24A, 24B. If the polarities of the voltages applied to the electrodes 22, 23 are reversed, the opposed electrode 25 rotates in the direction opposite to the rotational direction shown in FIG. 4B.

FIG. 4C shows a configuration of an actuator 20F according to the sixth embodiment in which the directions of the polarization of the shear-type piezoelectric elements 24A, 24B are opposite to each other. In the actuator 20F according to the sixth embodiment, the shear-type piezoelectric elements 24A, 24B having directions of polarization longitudinal of the electrodes 22, 23, respectively, at the fixed end 21, are disposed in opposite directions to each other. An opposed electrode 25 is arranged on the shear-type piezoelectric elements 24A, 24B.

FIG. 4D shows the direction in which the actuator 20F according to the sixth embodiment of FIG. 4C is deformed upon application of a voltage between the electrodes 22, 23 of the actuator 20F. When a voltage is applied between the two electrodes 22, 23, or when a positive voltage is applied to the electrode 23 and a negative voltage is applied to the electrode 22, for example, the shear-type piezoelectric elements 24A, 24B having the same direction of polarization are connected in series electrically, so that the shear-type piezoelectric elements 24A, 24B disposed on the two electrodes 22, 23 are sheared in the same direction. In this case, therefore, the opposed electrode 25 proceeds in parallel in the direction indicated by two-dot chain. In the case where the polarities of the voltage applied to the electrodes 22, 23 are reversed, on the other hand, the opposed electrode 25 proceeds in parallel in the direction opposite to the direction of proceeding shown in FIG. 4D.

FIGS. 5A to 5D show actuators according to seventh and eighth embodiments of the invention. The actuators according to the seventh and eighth embodiments also use two shear-type piezoelectric elements 24A, 24B. The directions of polarization of the shear-type piezoelectric elements 24A, 24B, however, are different from those for the actuators according to the fifth and sixth embodiments.

FIG. 5A shows a configuration of an actuator 20G according to the seventh embodiment in which the shear-type piezoelectric elements 24A, 24B have two directions of polarization. In the actuator 20G according to the seventh embodiment, the shear-type piezoelectric elements 24A, 24B having two directions of polarization away from each other along the direction at the right angle to the two electrodes 22, 23 are laid on the electrodes 22, 23 arranged at the fixed end 21. An opposed electrode 25 is arranged over the entire surface of the shear-type piezoelectric elements 24A, 24B.

FIG. 5B shows the direction in which the actuator 20G according to the seventh embodiment of FIG. 5A is deformed in the case where a voltage is applied between the electrodes 22, 23 of the actuator 20G. When a voltage is applied between the two electrodes 22, 23, the shear-type piezoelectric elements 24A, 24B having the same direction of polarization are connected electrically in series to each other. Thus, the shear-type piezoelectric elements 24A, 24B arranged on the two electrodes 22, 23 are sheared in the same direction. In this case, therefore, the opposed electrode 25 proceeds in parallel in the direction indicated by two-dot chain. When the polarities of the voltages applied to the electrodes 22, 23 are reversed, on the other hand, the opposed electrode 25 proceeds in parallel in the direction shown in FIG. 5B.

FIG. 5C shows a configuration of an actuator 20H according to an eighth embodiment in which the shear-type piezoelectric elements 24 have two directions of polarization. In the actuator 20H according to the eighth embodiment, shear-type piezoelectric elements 24A, 24B having two directions of polarization and arranged in opposed relationship to each other in the directions perpendicular to the electrodes 22, 23 are laid on the electrodes 22, 23 at the fixed end 21. An opposed electrode 25 is arranged over the entire surface of the shear-type piezoelectric elements 24A, 24B.

FIG. 5D shows the direction in which the actuator 20H according to the eighth embodiment of FIG. 5C is deformed when a voltage is applied between the electrodes 22, 23 of the actuator 20H. When a voltage is applied between the two electrodes 22, 23, the shear-type piezoelectric elements 24 having the same direction of polarization are electrically connected in series with each other. As in the case of the actuator 20G according to the seventh embodiment, the opposed electrode 25 proceeds in parallel in the direction indicated by two-dot chain. When the polarities of the voltages applied to the electrodes 22, 23 are reversed, on the other hand, the opposed electrode 25 proceeds in parallel in the direction opposite to the direction shown in FIG. 5D.

The actuators according to the first to eighth embodiments of the present invention described above have a simple configuration. As described with reference to FIG. 1B, upon application of a voltage to the two electrodes 22, 23 through the lead patterns 26, 27 formed at the fixed end 21, the opposed electrode 25 can be rotated or driven to proceed in parallel in accordance with the direction of polarization of the single shear-type piezoelectric element 24 or the two shear-type piezoelectric elements 24A, 24B laid on the two electrodes 22, 23.

Any one of the actuators according to the invention configured as described above is incorporated into a head actuator having a head arranged at the forward end thereof for reading and writing data from and into the information recording surface of a recording disk. In this way, the head can be finely displaced independently of the motion of the head actuator. Now, a configuration of this head-positioning mechanism will be explained.

Figure 6A:
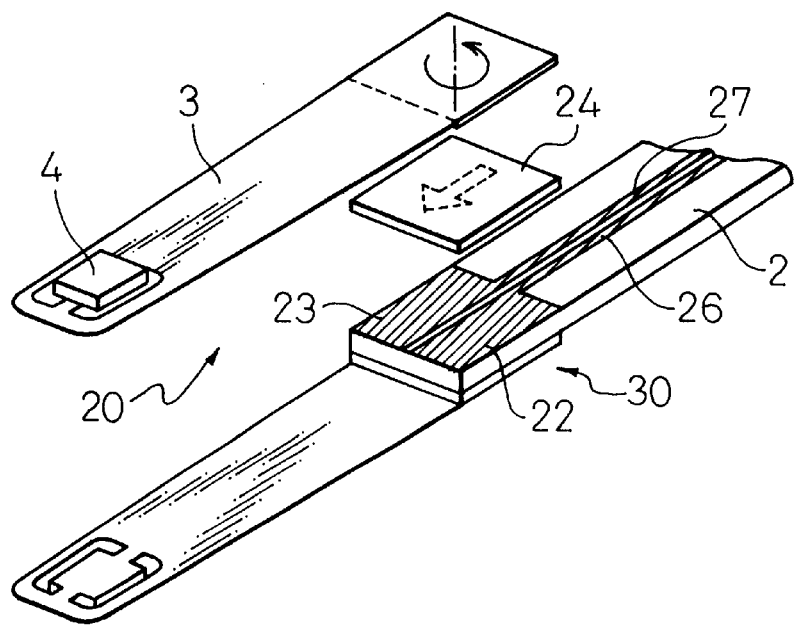
FIG. 6A is a perspective view for assembly showing a basic configuration of a head-positioning mechanism according to a first application in the case where the actuator according to the invention is used between the arm of the head actuator and a support spring mounted on the arm of the disk drive.
Figure 6B:
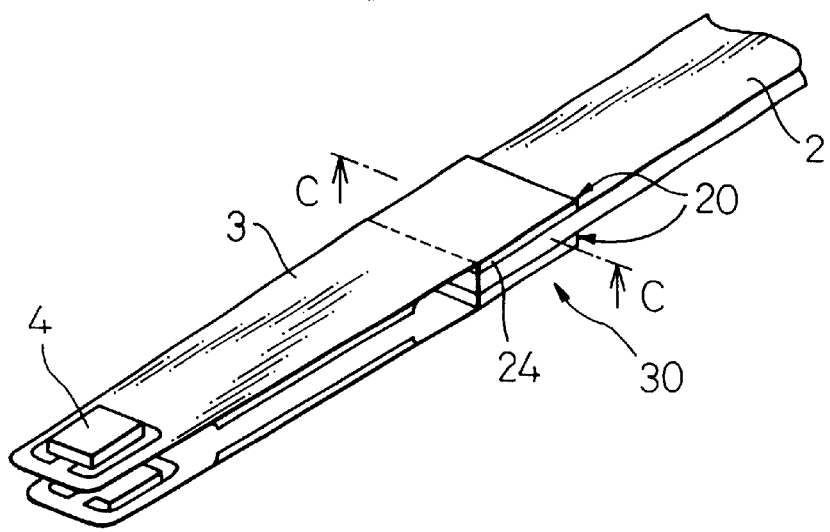
FIG. 6B is a perspective view showing the assembled state of the head-positioning mechanism of FIG. 6A.

FIG. 6A shows a basic configuration of a head-positioning mechanism 30 according to a first application in which an actuator 20 is used between an access arm 2 of a head actuator of a disk drive and one of support springs 3 mounted on the arm 2. FIG. 6B shows an assembled state of the head-positioning mechanism 30 of FIG. 6A.

The head-positioning mechanism 30 includes two electrodes 22, 23 arranged at a fixed end constituting the forward end of an access arm 2 of the head actuator. The base of a support spring 3 having a head 4 at the forward end thereof is mounted on the electrodes 22, 23 through a single shear-type piezoelectric element 24. The support spring 3 is mounted on each side of the access arm 2, as shown in FIG. 6B. Thus, two support springs 3 are mounted on the head-positioning mechanism 30 for each access arm 2. Also, the lead patterns 26, 27 of the actuator 20 are formed on the access arm 2.

Figure 6C:
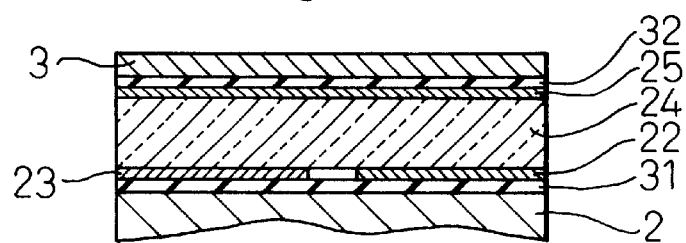
FIG. 6C is a sectional view taken in line C—C in FIG. 6B.

FIG. 6C is a sectional view showing a detailed configuration of the head-positioning mechanism 30 shown in FIG. 6B. Only the upper half portion of the head-positioning mechanism 30 is shown. An insulating layer 31 is arranged on the access arm 2, and the electrodes 22, 23 are formed on the insulating layer 31. The shear-type piezoelectric element 24 is laid on the electrodes 22, 23, and the opposed electrode 25 is formed on the shear-type piezoelectric element 24. The base of the support spring 3 is mounted on the opposed electrode 25 through an insulating layer 32.

FIG. 7 is a diagram for explaining the steps of mounting the actuator 20 between the arm 2 of the head actuator and the support spring 3 mounted on the arm 2 of the disk drive. In mounting the actuator 20 on the arm 2, a solder paste 33 is coated on the electrodes 22, 23 formed on the arm 2, and the shear-type piezoelectric element 24 carrying the base of the support spring 3 is mounted while being heated on the solder paste 33.

The head-positioning mechanism 30 according to the first application of the invention arranged in this way between the access arm 2 of the head actuator and the support spring 3 permits the head 4 at the forward end of the support spring 3 to move finely and independently of the motion of the head actuator. The direction in which the head 4 is finely moved is varied depending on which one of the actuators according to the first to eighth embodiments described above is used for the head-positioning mechanism 30. With reference to FIGS. 8 to 13, explanation will be made about various embodiments and example operations of the head-positioning mechanism 30 according to the first application of the invention.

FIGS. 8A to 8D show various example configurations of the head-positioning mechanism 30A according to the first embodiment in the first application of the invention. With the head-positioning mechanism 30A, the actuator 20A according to the first embodiment of the invention is used between the forward end of the access arm 2 of the head actuator and the support spring 3.

Figure 8A:
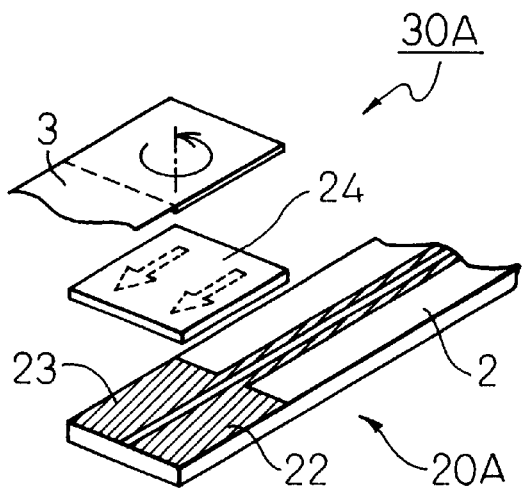
FIGS. 8A to 8D are perspective views for assembly showing various configurations of a head-positioning mechanism according to a first embodiment comprising the actuator of the first embodiment of the invention.
Figure 8B:
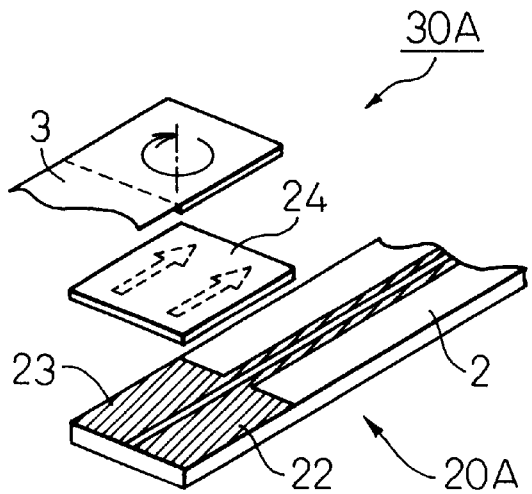

In the configuration shown in FIG. 8A, the electrodes 22, 23 are arranged in parallel and longitudinally on the arm 2 at the forward end of the arm 2, and the shear-type piezoelectric elements 24 is polarized toward the forward end of the arm 2. In this case, upon application of a voltage to the electrodes 22, 23, the support spring 3 is rotated. The configuration shown in FIG. 8B is different from that of FIG. 8A only in that the shear-type piezoelectric element 24 is polarized toward the base of the arm 2. In this case, too, the support spring 3 is rotated upon application of a voltage to the electrodes 22, 23. The rotational direction, however, is opposite to that for the configuration shown in FIG. 8A.

Figure 8C:
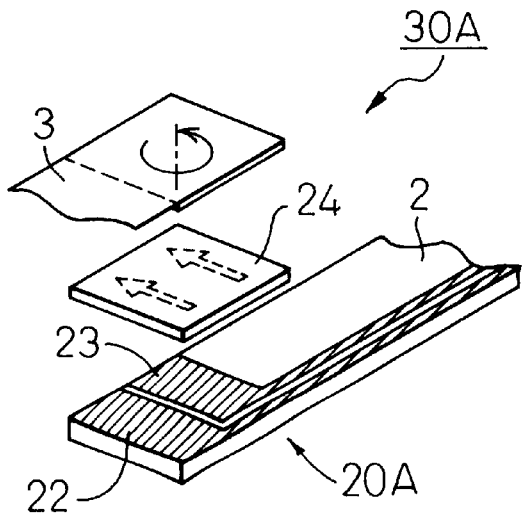
Figure 8D:
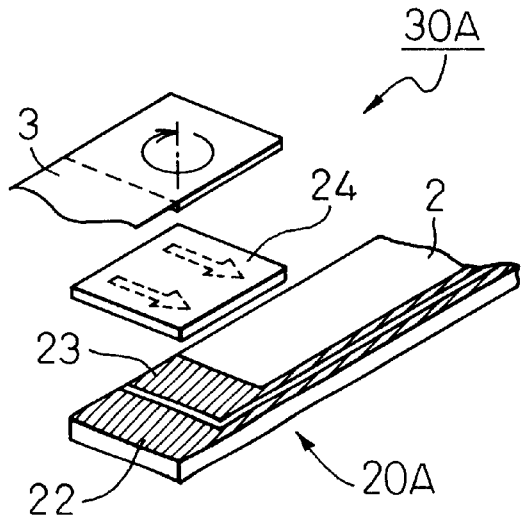

With the configuration shown in FIG. 8C, the electrodes 22, 23 are arranged in juxtaposition perpendicular to the longitudinal direction of the arm 2 at the forward end of the arm 2, and the shear-type piezoelectric element 24 is polarized toward the forward end of the electrodes 22, 23. The support spring 3 is rotationally also driven, in this case, by applying a voltage to the electrodes 22, 23. The configuration shown in FIG. 8D is different from that of FIG. 8C only in that the shear-type piezoelectric element 24 is polarized toward the base of the electrodes 22, 23. In this case, too, upon application of a voltage to the electrodes 22, 23, the support spring 3 is rotationally driven, but the direction of rotation thereof is opposite to that for the configuration shown in FIG. 8C.

The driving directions of the actuator 20A as explained by using FIGS. 8A to 8D are examples when the voltage is applied to the electrodes 22, 23 from the voltage amplifying circuit (not shown) in the specific direction. The driving directions of the actuator 20A as shown in FIGS. 8A to 8D are reversed when the polarity of the applied voltage to the electrodes 22, 23 is reversed.

FIGS. 9A to 9D show various example configurations of the head-positioning mechanism 30B according to the second embodiment in the first application of the invention. The head-positioning mechanism 30B uses the actuator 20B according to the second embodiment of the invention between the forward end of the access arm 2 of the head actuator and the support spring 3.

Figure 9A:
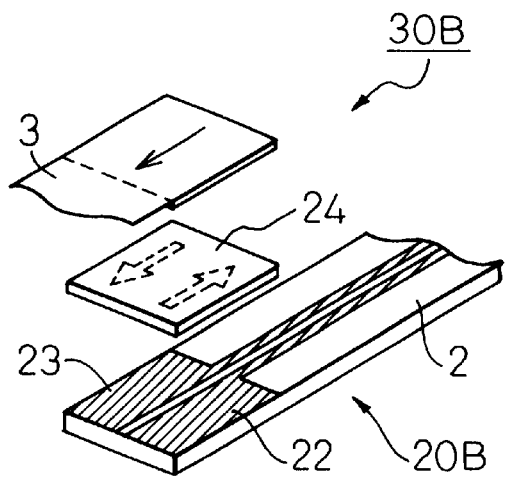
FIGS. 9A to 9D are perspective views for assembly showing various configurations of a head-positioning mechanism according to a second embodiment comprising the actuator of the second embodiment of the invention.
Figure 9B:
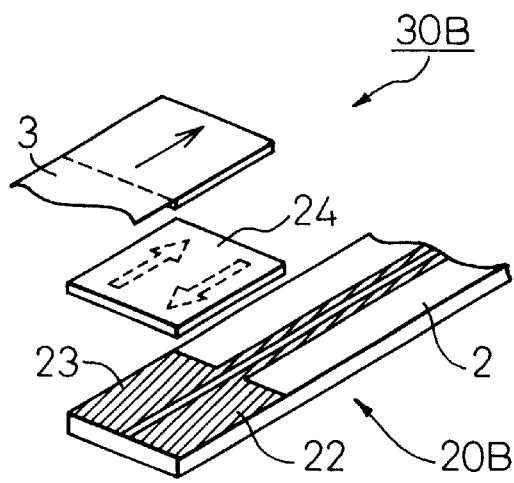

With the configuration shown in FIG. 9A, the electrodes 22, 23 are arranged in juxtaposition longitudinally of the arm 2 at the forward end of the arm 2, and one portion of the shear-type piezoelectric element 24 is polarized toward the forward end of the arm 2 while the other portion of the shear-type piezoelectric element 24 is polarized toward the base of the arm 2. In this case, the support spring 3 is driven to proceed in parallel and longitudinally on the arm 2 by applying a voltage to the electrodes 22, 23. The configuration shown in FIG. 9B is different from the configuration shown in FIG. 9A only in that the directions of polarization of the shear-type piezoelectric element 24 are opposite to those for the configuration of FIG. 9A. In this case also, by applying a voltage to the electrodes 22, 23, the support spring 3 is driven to proceed in parallel but in the direction opposite to that for the configuration shown in FIG. 9A.

Figure 9C:
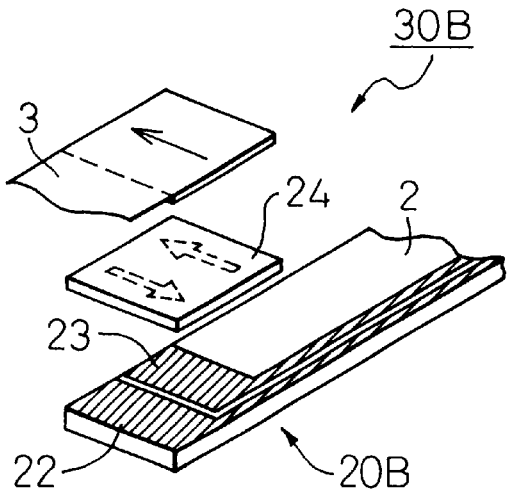
Figure 9D:
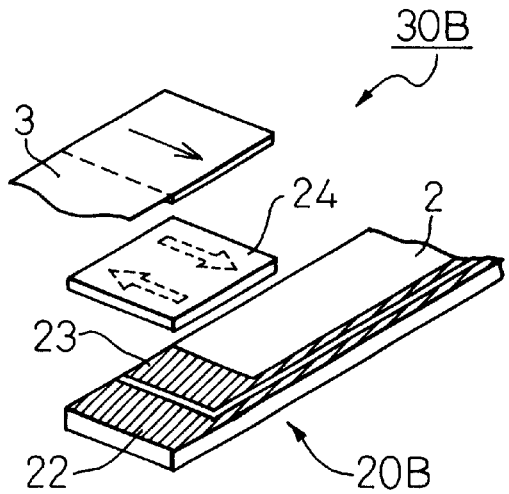

In the configuration shown in FIG. 9C, the electrodes 22, 23 are arranged in juxtaposition and perpendicular to the longitudinal direction of the arm 2 at the forward end of the arm 2, and one portion of the shear-type piezoelectric element 24 is polarized toward the left end of the arm 2, while the other portion of the shear-type piezoelectric element 24 is polarized toward the right end of the arm 2. In this case also, by applying a voltage to the electrodes 22, 23, the support spring 3 is driven to proceed in parallel in the direction perpendicular to the longitudinal direction of the arm 2. The configuration shown in FIG. 9D, however, is different from the configuration shown in FIG. 9C only in that the directions of polarization of the shear-type piezoelectric element 24 are opposite to those for the configuration shown in FIG. 9C. In this case, too, the support spring 3 is driven to proceed in parallel in the direction perpendicular to the longitudinal direction of the arm 2 but in the direction opposite to that for the configuration shown in FIG. 9C.

The driving directions of the actuator 20B as explained by using FIGS. 9A to 9D are examples when the voltage is applied to the electrodes 22, 23 from the voltage amplifying circuit (not shown) in the specific direction. The driving directions of the actuator 20B as shown in FIGS. 9A to 9D are reversed when the polarity of the applied voltage to the electrodes 22, 23 is reversed.

Figure 10A:
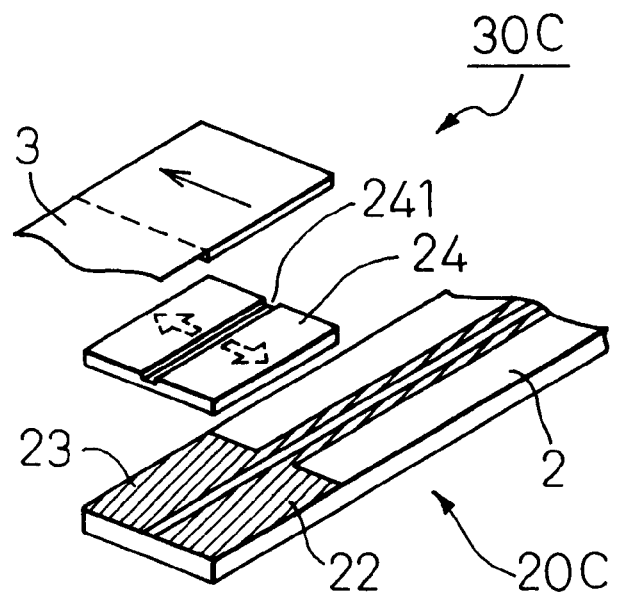
FIG. 10A is a perspective view for assembly showing a configuration of a head-positioning mechanism according to a third embodiment comprising the actuator of the third embodiment of the invention.

FIG. 10A shows an example configuration of a head-positioning mechanism 30C according to a third embodiment in the first application of the invention. In the head-positioning mechanism 30C, an actuator 20C according to the third embodiment of the invention is used between the forward end of the access arm 2 of the head actuator and the support spring 3.

In the configuration shown in FIG. 10A, the electrodes 22, 23 are arranged in juxtaposition and longitudinally on the arm 2 at the forward end of the arm 2, and the two portions of the shear-type piezoelectric element 24 on the opposite sides of a partitioning groove 241 are polarized in directions away from each other. In this case, the support spring 3 is driven to proceed in parallel in the direction perpendicular to the longitudinal direction of the arm 2 by applying a voltage to the electrodes 22, 23.

Also in the head-positioning mechanism 30C, the electrodes 22, 23 can alternatively be arranged in juxtaposition and perpendicular to the longitudinal direction of the arm 2 at the forward end of the arm 2, and the portions of the shear-type piezoelectric element 24 can be polarized longitudinally of the arm 2. In this case, the support spring 3 is driven to proceed in parallel longitudinally of the arm 2 by applying a voltage to the electrodes 22, 23.

Figure 10B:
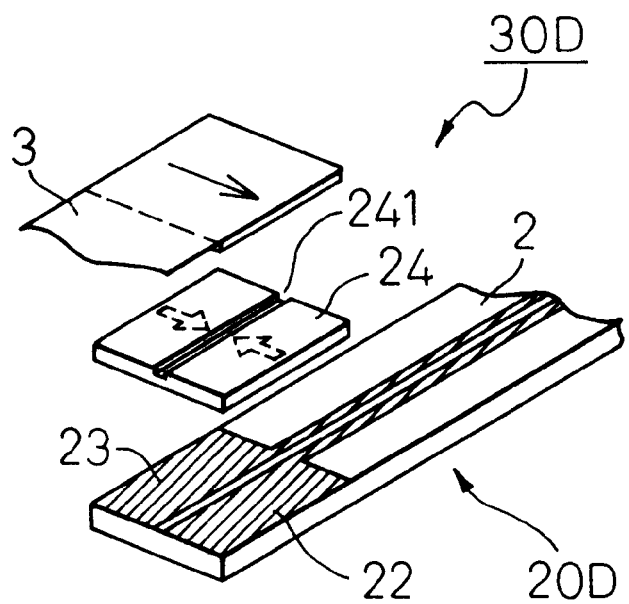
FIG. 10B is a perspective view for assembly showing a configuration of a head-positioning mechanism according to a fourth embodiment comprising the actuator of the fourth embodiment of the invention.

FIG. 10B shows an example configuration of a head-positioning mechanism 30D according to a fourth embodiment in the first application of the invention. In the head-positioning mechanism 30D, an actuator 20D according to the fourth embodiment of the invention is used between the forward end of the access arm 2 of the head actuator and the support spring 3.

In the configuration shown in FIG. 10B, the electrodes 22, 23 are arranged in juxtaposition and longitudinally on the arm 2 at the forward end of the arm 2, and the two portions of the shear-type piezoelectric element 24 on the two opposite sides of a partitioning groove 241 are polarized toward each other. In this case, the support spring 3 is driven to proceed in parallel in the direction perpendicular to the longitudinal direction of the arm 3, but in the direction opposite for the configuration of FIG. 10A, by applying a voltage to the electrodes 22, 23.

Also in the head-positioning mechanism 30D, the electrodes 22, 23 can alternatively be arranged in juxtaposition and perpendicular to the longitudinal direction of the arm 2 at the forward end of the arm 2, and the portions of the shear-type piezoelectric element 24 can be polarized longitudinally of the arm 2. In this case, the support spring 3 is driven to proceed in parallel longitudinally of the arm 2 by applying a voltage to the electrodes 22, 23.

FIGS. 11A to 11D show various example configurations of a head-positioning mechanism 30E according to a fifth embodiment in the first application of the invention. In the head-positioning mechanism 30E, an actuator 20E according to the fifth embodiment of the invention is used between the forward end of the access arm 2 of the head actuator and the support spring 3.

Figure 11A:
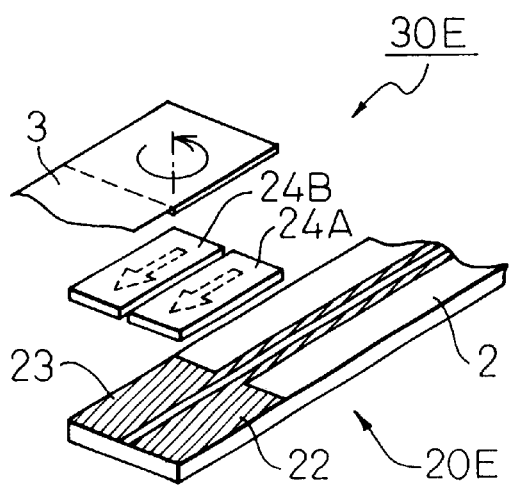
FIGS. 11A to 11D are perspective views for assembly showing various configurations of a head-positioning mechanism according to a fifth embodiment comprising the actuator of the fifth embodiment of the invention.
Figure 11B:
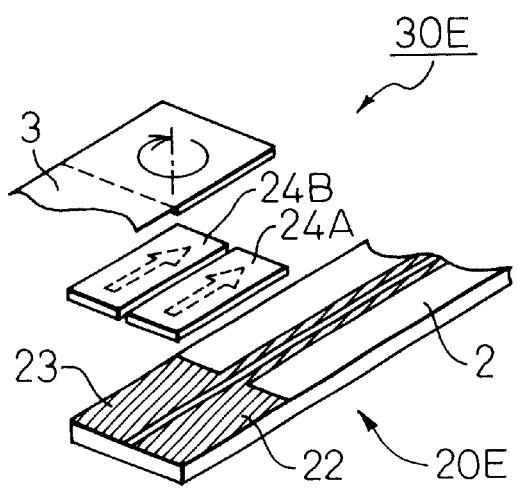

In the configuration shown in FIG. 11A, the electrodes 22, 23 are arranged in juxtaposition and longitudinally on the arm 2 at the forward end of the arm 2, and shear-type piezoelectric elements 24A, 24B are laid on the electrodes 22, 23. The shear-type piezoelectric elements 24A, 24B are polarized toward the forward end of the arm 2. In this case, the support spring 3 is rotationally driven by applying a voltage to the electrodes 22, 23. The configuration shown in FIG. 11B is different from the configuration of FIG. 11A only in that the shear-type piezoelectric elements 24A, 24B are polarized toward the base of the arm 2. In this case also, by applying a voltage to the electrodes 22, 23, the support spring 3 is rotationally driven but in the direction opposite to that for the configuration of FIG. 11A.

Figure 11C:
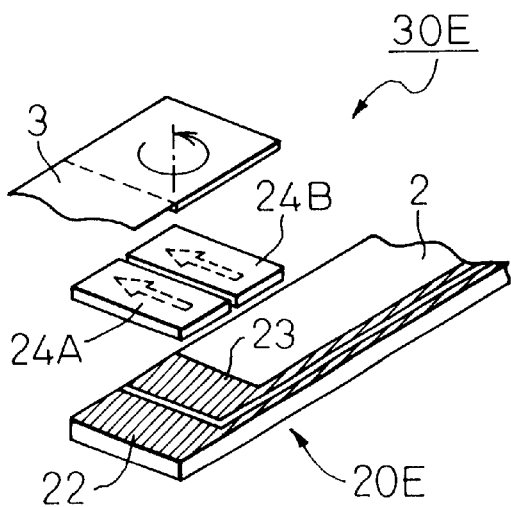
Figure 11D:
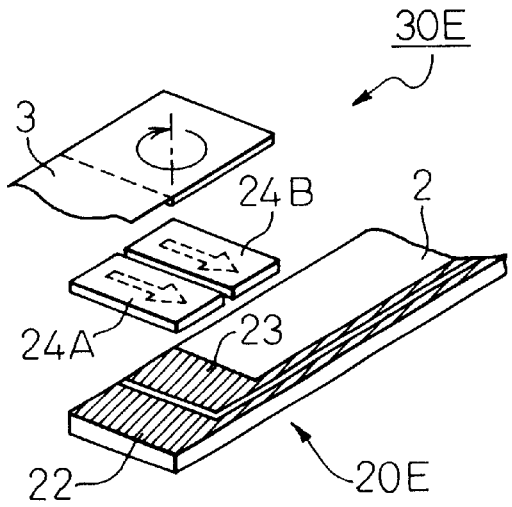

In the configuration shown in FIG. 11C, the electrodes 22, 23 are arranged in juxtaposition and perpendicular to the longitudinal direction of the arm 2 at the forward end of the arm 2. The shear-type piezoelectric elements 24A, 24B are polarized toward the forward ends of the electrodes 22, 23, respectively. In this case also, the support spring 3 is rotationally driven by applying a voltage to the electrodes 22, 23. The configuration shown in FIG. 11D is different from that of FIG. 11C only in that the shear-type piezoelectric elements 24A, 24B are polarized toward the base of the electrodes 22, 23. In this case, too, by applying a voltage to the electrodes 22, 23, the support spring 3 is rotationally driven but in the direction opposite to that for the configuration of FIG. 11C.

FIGS. 12A to 12D show various example configurations of a head-positioning mechanism 30F according to the sixth embodiment in the first application of the invention. The head-positioning mechanism 30F uses an actuator 20F according to the sixth embodiment of the invention between the forward end of the access arm 2 of the head actuator and the support spring 3.

Figure 12A:
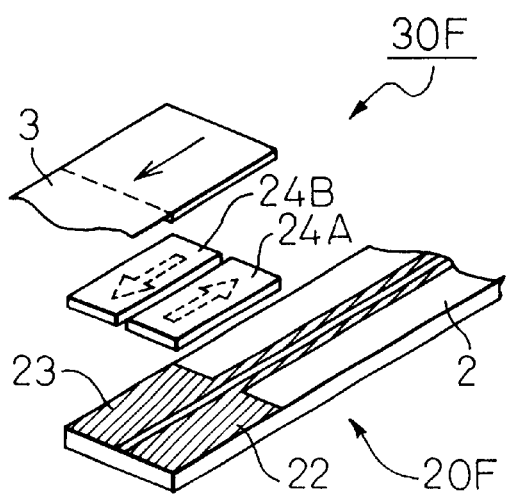
FIGS. 12A to 12D are perspective views for assembly showing various configurations of a head-positioning mechanism according to a sixth embodiment comprising the actuator of the sixth embodiment of the invention.
Figure 12B:
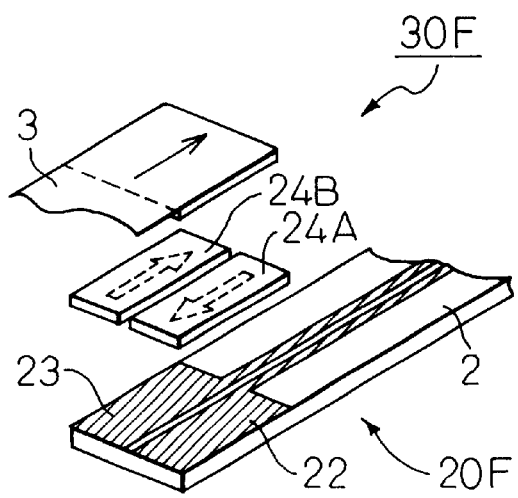

With the configuration shown in FIG. 12A, the electrodes 22, 23 are arranged in juxtaposition longitudinally of the arm 2 at the forward end of the arm 2, and one of the shear-type piezoelectric elements 24A, 24B is polarized toward the forward end of the arm 2 while the other shear-type piezoelectric element is polarized toward the base of the arm 2. In this case, the support spring 3 is driven to proceed in parallel and longitudinally on the arm 2 by applying a voltage to the electrodes 22, 23. The configuration shown in FIG. 12B is different from the configuration shown in FIG. 12A only in that the shear-type piezoelectric elements 24A, 24B are polarized in the direction opposite to that for the configuration of FIG. 12A. In this case also, by applying a voltage between the electrodes 22, 23, the support spring 3 is driven to proceed in parallel but in the direction opposite to that for the configuration shown in FIG. 12A.

Figure 12C:
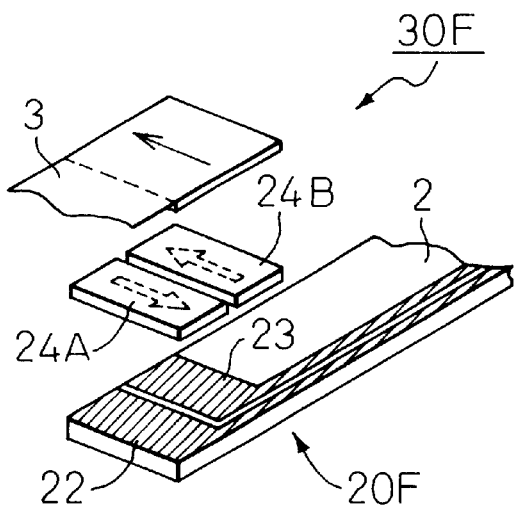
Figure 12D:
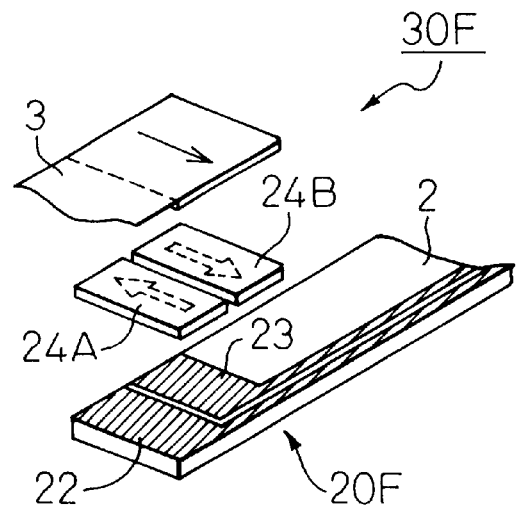

In the configuration shown in FIG. 12C, the electrodes 22, 23 are arranged in juxtaposition and perpendicular to the longitudinal direction of the arm 2 at the forward end of the arm 2, and one of the shear-type piezoelectric elements 24A, 24B is polarized toward the left end of the arm 2, while the other shear-type piezoelectric element is polarized toward the right end of the arm 2. In this case also, by applying a voltage between the electrodes 22, 23, the support spring 3 is driven to proceed in parallel in the direction perpendicular to the longitudinal direction of the arm 2. The configuration shown in FIG. 12D is different from the configuration shown in FIG. 12C only in that the directions of polarization of the shear-type piezoelectric elements 24A, 24B are opposite to those for the configuration shown in FIG. 12C. In this case, too, the support spring 3 is driven to proceed in parallel in the direction perpendicular to the longitudinal direction of the arm 2 but in the direction opposite to that for the configuration shown in FIG. 12C.

Figure 13A:
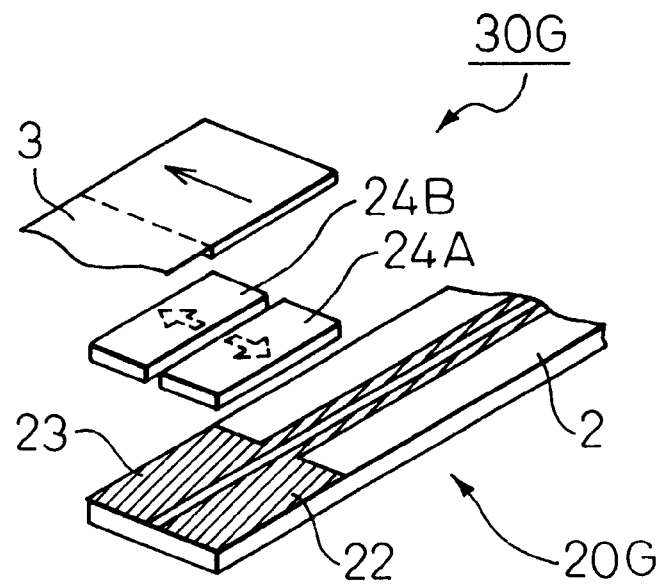
FIG. 13A is a perspective view for assembly showing a configuration of a head-positioning mechanism according to a seventh embodiment comprising the actuator of the seventh embodiment of the invention.

FIG. 13A shows an example configuration of a head-positioning mechanism 30G according to a seventh embodiment in the first application of the invention. In the head-positioning mechanism 30G, an actuator 20G according to the seventh embodiment of the invention is used between the forward end of the access arm 2 of the head actuator and the support spring 3.

In the configuration shown in FIG. 13A, the electrodes 22, 23 are arranged in juxtaposition longitudinally of the arm 2 at the forward end of the arm 2, and the shear-type piezoelectric elements 24A, 24B are polarized away from each other in the direction perpendicular to the longitudinal direction of the arm 2. In this case, the support spring 3 is driven to proceed in parallel perpendicular to the longitudinal direction of the arm 3 by applying a voltage to the electrodes 22, 23.

Also in the head-positioning mechanism 30G, the electrodes 22, 23 can alternatively be arranged in juxtaposition and perpendicular to the longitudinal direction of the arm 2 at the forward end of the arm 2, and the shear-type piezoelectric elements 24A, 24B can be polarized longitudinally of the arm 2. In this case, the support spring 3 is driven to proceed in parallel and longitudinally on the arm 2 by applying a voltage to the electrodes 22, 23.

Figure 13B:
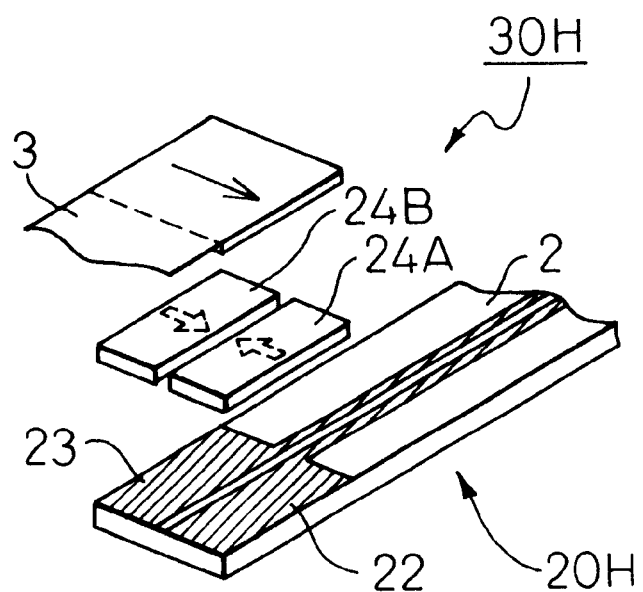
FIG. 13B is a perspective view for assembly showing a configuration of a head-positioning mechanism according to an eighth embodiment comprising the actuator of the eighth embodiment of the invention.

FIG. 13B shows an example configuration of a head-positioning mechanism according to an eighth embodiment in the first application of the invention. In the head-positioning mechanism 30H, an actuator 20H according to the eighth embodiment of the invention is used between the forward end of the access arm 2 of the head actuator and the support spring 3.

In the configuration shown in FIG. 13B, the electrodes 22, 23 are arranged in juxtaposition and longitudinally on the arm 2 at the forward end of the arm 2, and the shear-type piezoelectric elements 24A, 24B are polarized toward each other in the directions perpendicular to the longitudinal direction of the arm 2. In this case, the support spring 3 is driven to proceed in parallel in the direction perpendicular to the longitudinal direction of the arm 3 but in the direction opposite to that for the configuration of FIG. 13A by applying a voltage to the electrodes 22, 23.

Also in the head-positioning mechanism 30H, the electrodes 22, 23 can alternatively be arranged in juxtaposition perpendicular to the longitudinal direction of the arm 2 at the forward end of the arm 2, and the shear-type piezoelectric elements 24A, 24B can be polarized longitudinally of the arm 2. In this case, the support spring 3 is driven to proceed in parallel and longitudinally on the arm 2 by applying a voltage to the electrodes 22, 23.

Figure 14A:
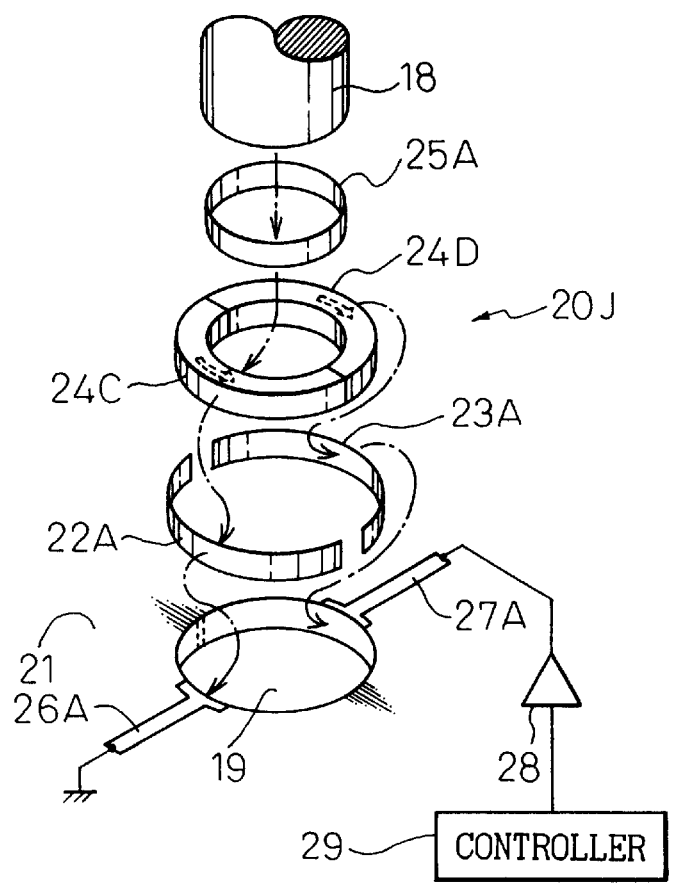
FIG. 14A is a perspective view for assembly showing a configuration of an actuator according to a ninth embodiment of the invention.

FIG. 14A shows a configuration of an actuator according to a ninth embodiment of the invention, and is an exploded view of the configuration of an actuator 20J according to the ninth embodiment. The actuator 20J includes a circular aperture 19 of a predetermined depth formed at the fixed end 21. Two electrodes 22A, 23A are arranged on the inner peripheral surface of the circular aperture 19 in such positions as to split the inner peripheral surface into two symmetric portions. Two semi-annular shear-type piezoelectric elements 24C, 24D having a predetermined thickness are laid on the inner peripheral surfaces of the two electrodes 22A, 23A. The two semi-annular shear-type piezoelectric elements 24C, 24D are polarized along the peripheral direction symmetrically about the dividing line. Further, an opposite electrode 25A is fitted over the inner peripheral surfaces of the two semi-annular shear-type piezoelectric elements 24C, 24D. A rotational shaft 18 is fixedly secured to the inner peripheral surface of the opposed electrode 25A thereby to constitute the actuator 20J according to the ninth embodiment.

Lead patterns 26A, 27A are connected to the opposed edges of the circular aperture 19. An amplifier 28 and a controller 29 are connected to the forward end of the lead pattern 27A. In this actuator 20J, a drive signal of a predetermined polarity output from the controller 29 is amplified by the amplifier 28, and a voltage is applied between the two electrodes 22A, 23A. In this way, the shear-type piezoelectric elements 24C, 24D are deformed to thereby rotate the opposed electrode 25A. As a result, the rotational shaft 18 fixedly secured to the opposed electrode 25A can be rotationally driven. The controller 29 can output drive signals of positive and negative polarities. By changing the polarity of the drive signal, therefore, the amount and direction of rotation of the rotational shaft 18 can be controlled.

In FIG. 14A, the lead pattern 26A is connected to the ground. However, the shear-type piezoelectric elements 24C, 24D may be differentially driven by connecting another voltage amplifier to the lead pattern 26A.

Figure 14B:
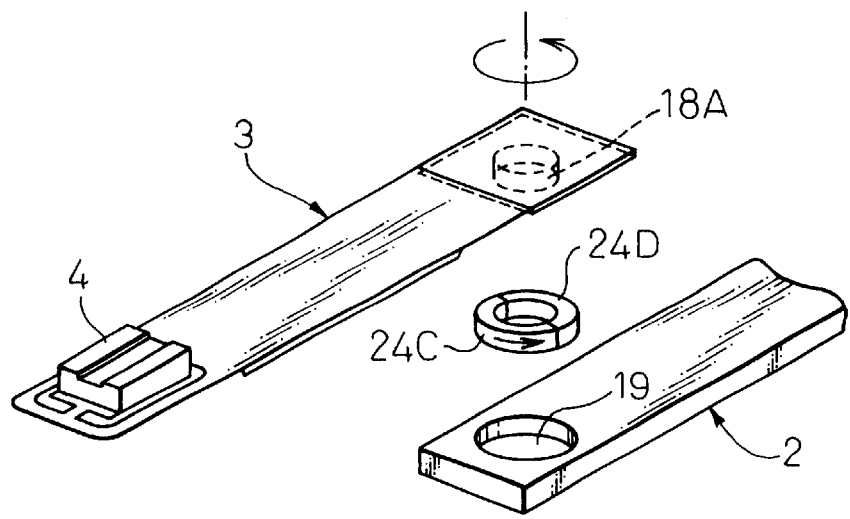
FIG. 14B is a perspective view for assembly showing a configuration and the direction of fine movement of a head-positioning mechanism according to the ninth embodiment using the actuator of FIG. 14A.

FIG. 14B shows the manner in which the actuator 20J of FIG. 14A is mounted between the arm 2 of the head actuator and the support spring 3 of the disk drive thereby to constitute a head-positioning mechanism 30J according to the ninth embodiment in the first application of the invention. A circular aperture 18 making up a part of a fixed end of the actuator 20J is formed at the forward end of the arm 2 of the head actuator. The two electrodes 22A, 23A, the shear-type piezoelectric elements 24C, 24D and the opposed electrode 25A are accommodated in the circular aperture 19. A boss 18A protruded from the reverse side of the base of the support spring 3 is fixedly secured to the opposed electrode 25A, thereby constituting the head-positioning mechanism 30J.

Figure 15A:
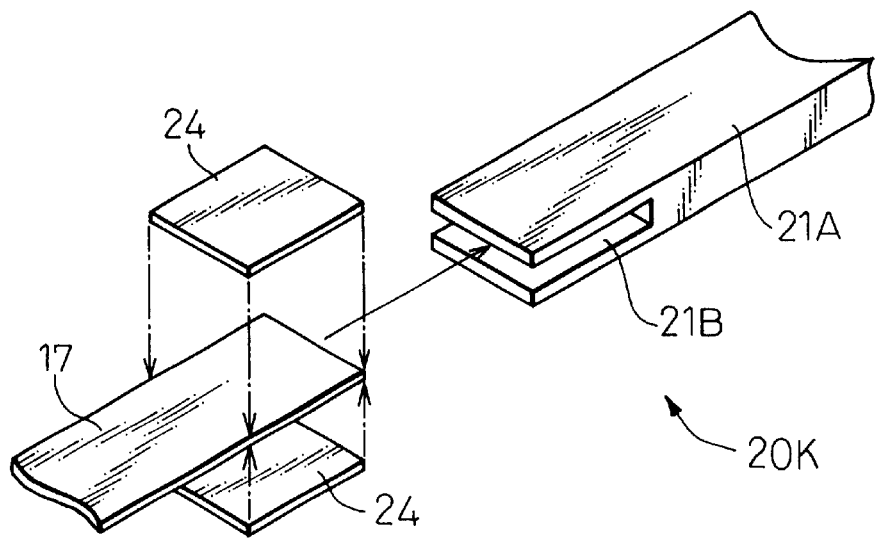
FIG. 15A is a perspective view for assembly showing a configuration of an actuator according to a tenth embodiment of the invention.

FIG. 15A shows a configuration of an actuator 20K according to a tenth embodiment of the invention. A fixed end 21A is tabular in shape and has the forward end thereof formed with a recess 21B. An electrode is arranged in each of two opposed surfaces in the recess 21B. In the case where the fixed end 21A is made of a conductive metal, however, the electrodes are not required. Two shear-type piezoelectric elements 24 sandwiching a movable plate 17 are fitted between the two electrodes. In the case where the movable plate 17 is made of a metal, no electrode is required on the end surfaces of the shear-type piezoelectric elements 24 nearer to the movable plate 17.

Figure 15B:
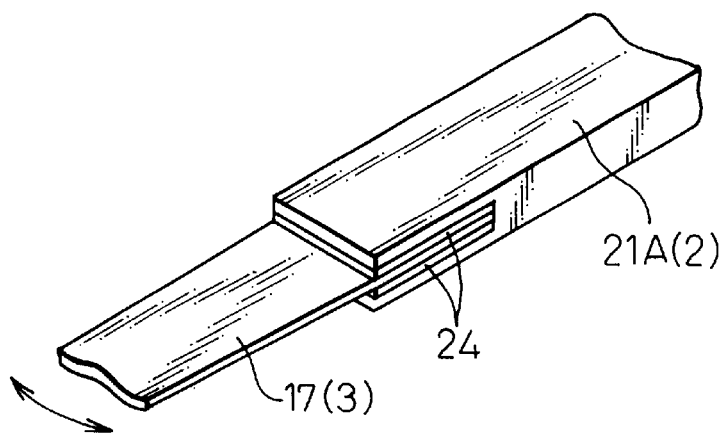
FIG. 15B is a perspective view showing the assembled state of the actuator of FIG. 15A.
Figure 15C:
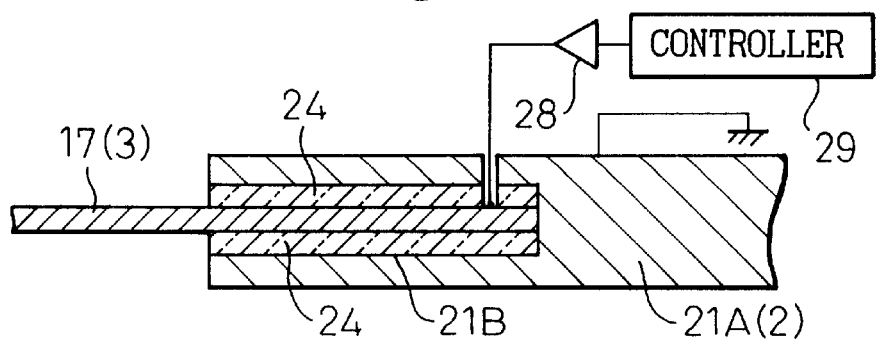
FIG. 15C is a circuit configuration diagram showing the connection between the actuator of FIG. 15B and a controller.

FIG. 15B shows the actuator 20K in assembled state. FIG. 15C is a circuit configuration diagram showing the connection of the actuator 20K of FIG. 15B to a voltage amplifier 28. The actuator 20K has the voltage amplifier 28 and a controller 29 inserted between the movable plate 17 and the fixed end 21A. By controlling the magnitude of the voltage between the electrodes and the direction of application of the voltage, it is possible to swing the movable plate 17 in the manner shown in FIG. 15B.

In FIG. 15C, the fixed end 21A is connected to the ground. However, two shear-type piezoelectric elements 24 may be differentially driven by connecting another voltage amplifier to the fixed end 21A.

Incidentally, in the case where the fixed end 21A is assumed to constitute the arm 2 of the head actuator and the movable plate 17 to constitute the support spring 3 of the head actuator, then the actuator 20J can be used directly for the head-positioning mechanism 30K according to the tenth embodiment in the first application of the invention.

The head-positioning mechanisms 30A to 30K according to the first to tenth embodiments in the first application described above use the actuators 20A to 20K according to the first to tenth embodiments and are simple in configuration and high in positioning accuracy. Thus the fabrication and assembly efficiency are improved with a high displacement accuracy.

Figure 16A:
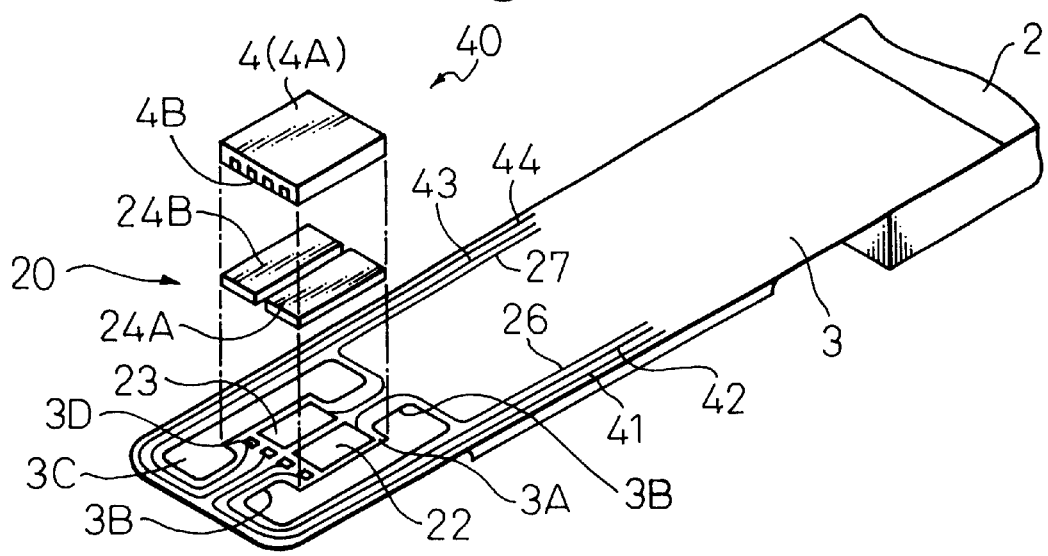
FIG. 16A is a perspective view for assembly showing a basic configuration according to a second application of a head-positioning mechanism using an actuator according to the invention between the support spring mounted on the arm of the head actuator and the head slider of the disk drive.
Figure 16B:
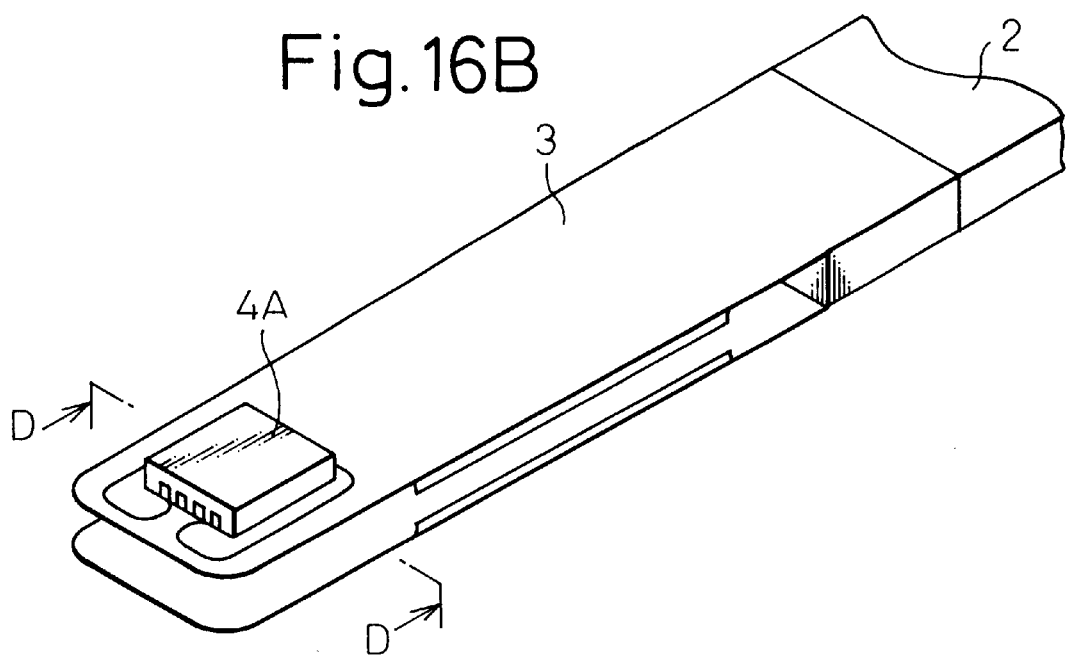
FIG. 16B is a perspective view showing the assembled state of the head-positioning mechanism of FIG. 16A.

FIG. 16A shows a basic configuration of a head-positioning mechanism 40 in the second application in which the actuator 20 is used between the support spring 3 mounted on the access arm 2 of the head actuator and the head 4 (actually, a head slider 4A having an inductive head or a MR head) arranged at the forward end of the support spring 3 of the disk drive. FIG. 16B shows the state of the head-positioning mechanism 40 of FIG. 16A after assembly.

In the head-positioning mechanism 40, the two electrodes 22, 23 of the actuator 20 are arranged at a fixed end constituted of an island portion 3A at the forward end of the support spring 3 of the head actuator. This island portion 3A is connected to the forward end of the support spring 3 by two bridges 3B. Holes 3B, 3C are formed around the island portion 3A. In addition to the electrodes 22, 23, the island portion 3A has four pads 3D for electrically connecting to the head 4. Also, lead patterns 26, 27 connected to the two electrodes 22, 23 and lead patterns 41 to 44 connected to the four pads 3D are arranged on the support spring 3. The lead patterns 26, 27 are connected to the two electrodes 22, 23 through one of the bridges 3B, while the lead patterns 41 to 44 are connected through the other bridge 3B to the four pads 3D. The head slider 4A with a head 4 at the forward end thereof is mounted on the electrodes 22, 23 through, in this case, two shear-type piezoelectric elements 24A, 24B. Although it is not shown in FIGS. 16A and 16B, the four pads 3D and the head 4(4B) can be connected by a flexible connecting member such as a flexible lead wire.

The support spring 3, as shown in FIG. 16B, is mounted on each of the two sides of the access arm 2, and therefore it follows that two head-positioning mechanisms 40 according to the second application are provided for each access arm 2.

Figure 16C:
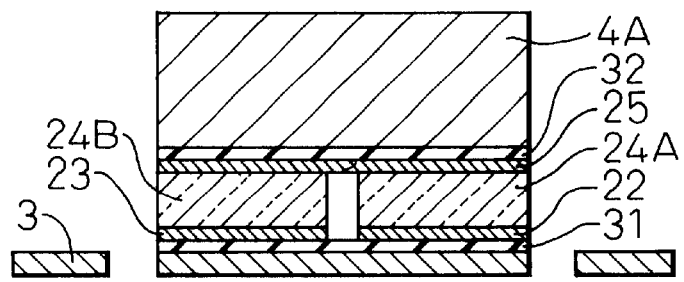
FIG. 16C is a local sectional view taken in line D—D in FIG. 16B.

FIG. 16C is a sectional view taken in line D—D in FIG. 16B showing a detailed configuration of the head-positioning mechanism 40. An insulating layer 31 is formed on the support spring 3, and the electrodes 22, 23 are arranged on the insulating layer 31. The shear-type piezoelectric elements 24A, 24B are laid on the electrodes 22, 23, respectively. An opposed electrode 25 is arranged over the shear-type piezoelectric elements 24A, 24B. The head slider 4A is mounted on the opposed electrode 25 through the insulating layer 32.

In this way, the head-positioning mechanism 40 interposed between the support spring 3 of the head actuator and the head slider 4A can cause the head 4 at the forward end of the head slider 4A to move finely and independently of the motion of the head actuator. Incidentally, the direction in which the head 4 is finely moved is varied depending on which of the actuators 20 according to the first to eighth embodiments is used for the head-positioning mechanism 40. In view of this, various embodiments and operation examples of the head-positioning mechanism 40 according to the second application of the invention will be described with reference to FIGS. 17A to 22B below.

FIGS. 17A to 17D show various example configurations of the head-positioning mechanism 40A according to the first embodiment in the second application of the invention. In the head-positioning mechanism 40A, the actuator 20A according to the first embodiment of the invention is used between the forward end of the support spring 3 of the head actuator and the head slider 4A.

Figure 17A:
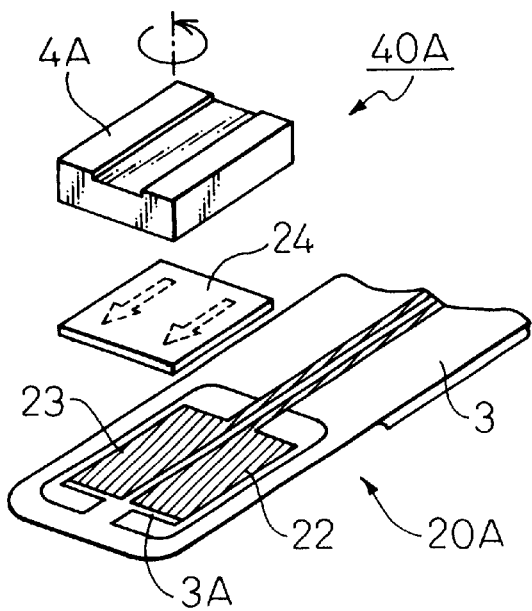
FIGS. 17A to 17D are perspective views for assembly showing various configurations of the head-positioning mechanism in the second application of the invention using an actuator according to the first embodiment of the invention.
Figure 17B:
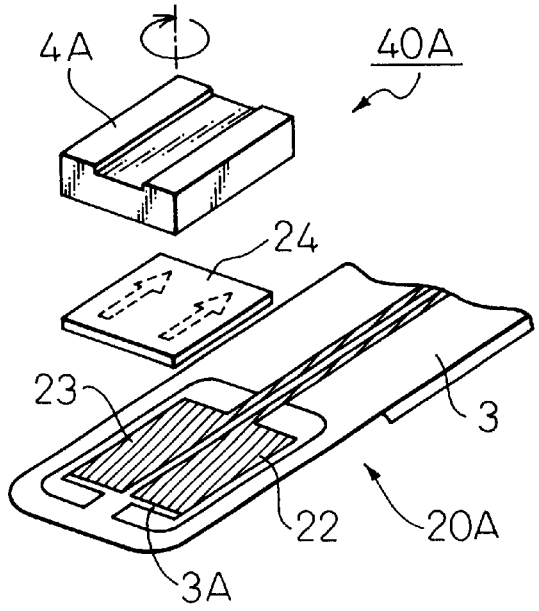

In the configuration shown in FIG. 17A, the electrodes 22, 23 are arranged in juxtaposition longitudinally of the support spring 3 on the island portion 3A at the forward end of the support spring 3, and a shear-type piezoelectric element 24 is polarized toward the forward end of the arm 2. In this case, the head slider 4A is rotationally driven by applying a voltage to the electrodes 22, 23. The configuration shown in FIG. 17B is different from that shown in FIG. 17A only in that the shear-type piezoelectric element 24 is polarized toward the base of the support spring 3. In this case, too, by applying a voltage to the electrodes 22, 23, the head slider 4A is rotationally driven but in the direction opposite to that for the configuration of FIG. 17A.

Figure 17C:
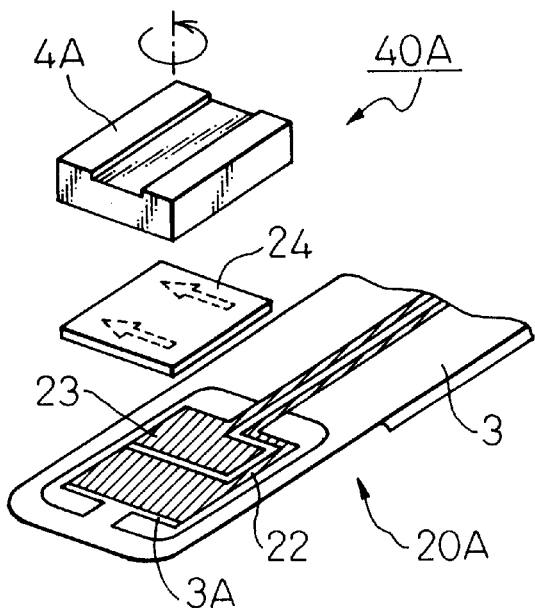
Figure 17D:
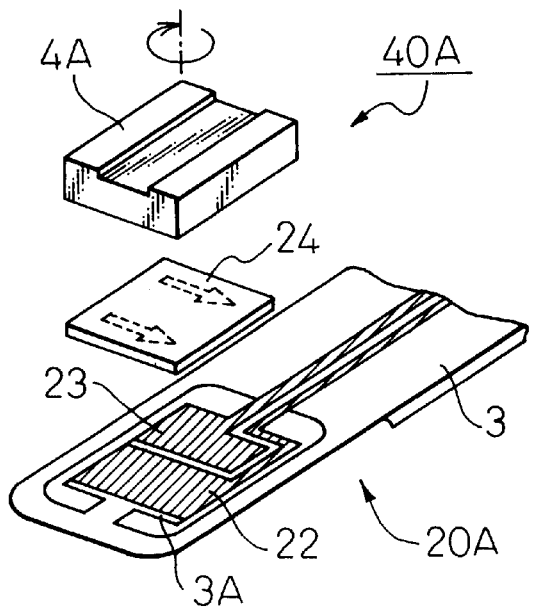

With the configuration shown in FIG. 17C, the electrodes 22, 23 are arranged in juxtaposition perpendicular to the longitudinal direction of the support spring 3 in the island portion 3A at the forward end of the support spring 3, and the shear-type piezoelectric element 24 is polarized toward the forward end of the electrodes 22, 23. In this case, too, the head slider 4A is rotationally driven by applying a voltage to the electrodes 22, 23. The configuration shown in FIG. 17D is different from that of FIG. 17C only in that the shear-type piezoelectric element 24 is polarized toward the base of the electrodes 22, 23. Also in this case, by applying a voltage to the electrodes 22, 23, the head slider 4A is rotationally driven but in the direction opposite to that for the configuration of FIG. 17C.

The driving directions of the actuator 20A as explained by using FIGS. 17A to 17D are examples when the voltage is applied to the electrodes 22, 23 from the voltage amplifying circuit (not shown) in the specific direction. The driving directions of the actuator 20A as shown in FIGS. 17A to 17D are reversed when the polarity of the applied voltage to the electrodes 22, 23 is reversed.

FIGS. 18A to 18D show various example configurations of the head-positioning mechanism 40B according to the second embodiment in the second application of the invention. In the head-positioning mechanism 40B, an actuator 20B according to the second embodiment of the invention is used between the forward end of the support spring 3 of the head actuator and the head slider 4A.

Figure 18A:
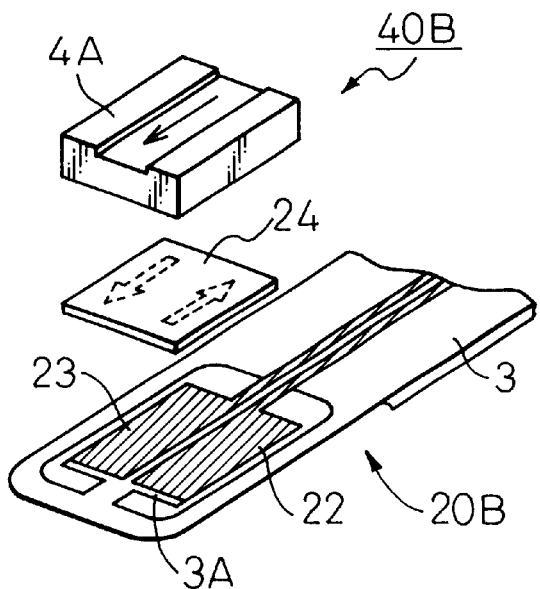
FIGS. 18A to 18D are perspective views for assembly showing various configurations of the head-positioning mechanism in the second application using an actuator according to the second embodiment of the invention.
Figure 18B:
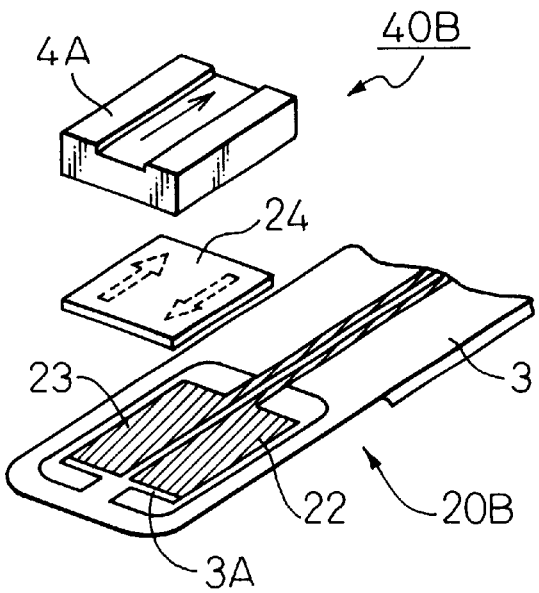

In the configuration shown in FIG. 18A, the electrodes 22, 23 are arranged in juxtaposition and longitudinally on the support spring 3 in the island portion 3A at the forward end of the support spring 3, and one portion of the shear-type piezoelectric element 24 is polarized toward the forward end of the support spring 3, and the other portion of the shear-type piezoelectric element 24 is polarized toward the base of the support spring 3. In this case, the head slider 4A is driven to proceed in parallel and longitudinally of the support spring 3 by applying a voltage to the electrodes 22, 23. The configuration shown in FIG. 18B is different from that shown in FIG. 18A only in that the two portions of the shear-type piezoelectric element 24 are polarized in the directions opposite to those in the configuration shown in FIG. 18A. In this case, too, by applying a voltage to the electrodes 22, 23, the head slider is driven to proceed in parallel but in the direction opposite to that for the configuration of FIG. 18A.

Figure 18C:
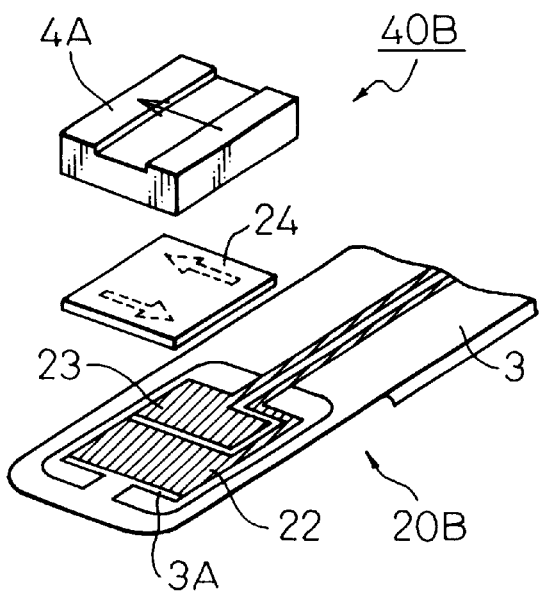
Figure 18D:
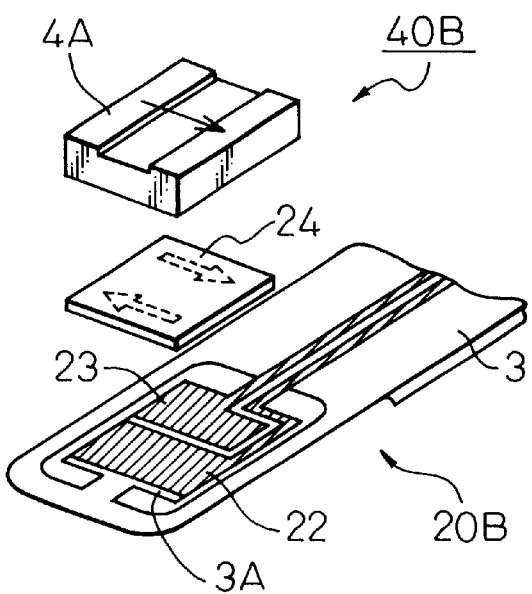

With the configuration shown in FIG. 18C, the electrodes 22, 23 are arranged in juxtaposition perpendicular to the longitudinal direction of the support spring 3 in the island portion 3A at the forward end of the support spring 3, and one portion of the shear-type piezoelectric element 24 is polarized toward the left end of the island portion 3A and the other portion of the shear-type piezoelectric element 24 is polarized toward the right end of the island portion 3A. In this case, too, the head slider 4A is driven to proceed in parallel in the direction perpendicular to the longitudinal direction of the support spring 3 by applying a voltage to the electrodes 22, 23. The configuration shown in FIG. 18D is different from that of FIG. 18C only in that the two portions of the shear-type piezoelectric elements 24 are polarized in the directions opposite to those in the configuration of FIG. 18C. Also in this case, by applying a voltage to the electrodes 22, 23, the head slider 4A is driven to proceed in parallel in the direction perpendicular to the longitudinal direction of the support spring 3 but in the direction opposite to that for the configuration of FIG. 18C.

The driving directions of the actuator 20B as explained by using FIGS. 18A to 18D are examples when the voltage is applied to the electrodes 22, 23 from the voltage amplifying circuit (not shown) in the specific direction. The driving directions of the actuator 20B as shown in FIGS. 18A to 18D are reversed when the polarity of the applied voltage to the electrodes 22, 23 is reversed.

Figure 19A:
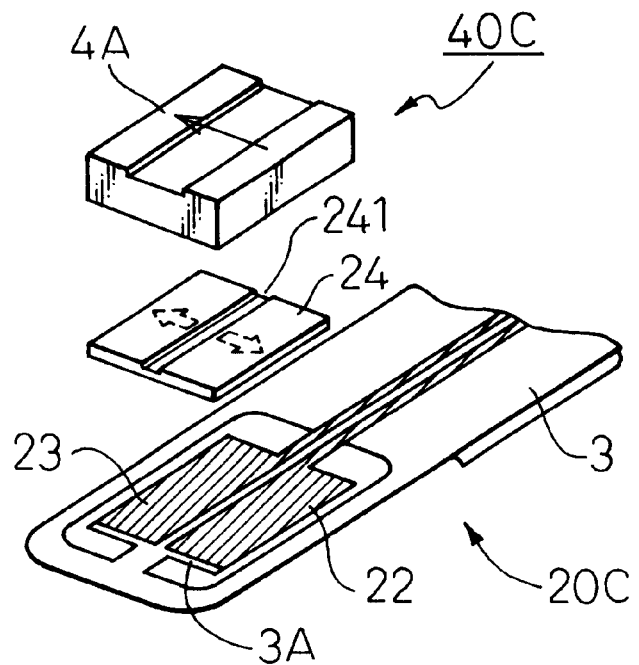
FIG. 19A is a perspective view for assembly showing a configuration of the head-positioning mechanism in the second application using an actuator according to the third embodiment of the invention.

FIG. 19A shows an example configuration of a head-positioning mechanism 40C according to the third embodiment in the second application of the invention. In the head-positioning mechanism 40C, an actuator 20C according to the third embodiment of the invention is used between the forward end of the support spring 3 of the head actuator and the head slider 4A.

In the configuration shown in FIG. 19A, the electrodes 22, 23 are arranged in juxtaposition and longitudinally on the support spring 3 in the island portion 3A at the forward end of the support spring 3, and the two portions of the shear-type piezoelectric elements 24 on the two sides of a partitioning groove 241 are polarized in the directions away from each other. In this case, the head slider 4A is driven to proceed in parallel in the direction perpendicular to the longitudinal direction of the support spring 3 by applying a voltage to the electrodes 22, 23.

Also in the head-positioning mechanism 40C, the electrodes 22, 23 can alternatively be arranged in juxtaposition and perpendicular to the longitudinal direction of the support spring 3 in the island portion 3A at the forward end of the support spring 3, so that the shear-type piezoelectric element 24 is polarized longitudinally of the support spring 3. In this case, the head slider 4A is driven to proceed in parallel and longitudinally to the support spring 3 by applying a voltage to the electrodes 22, 23.

Figure 19B:
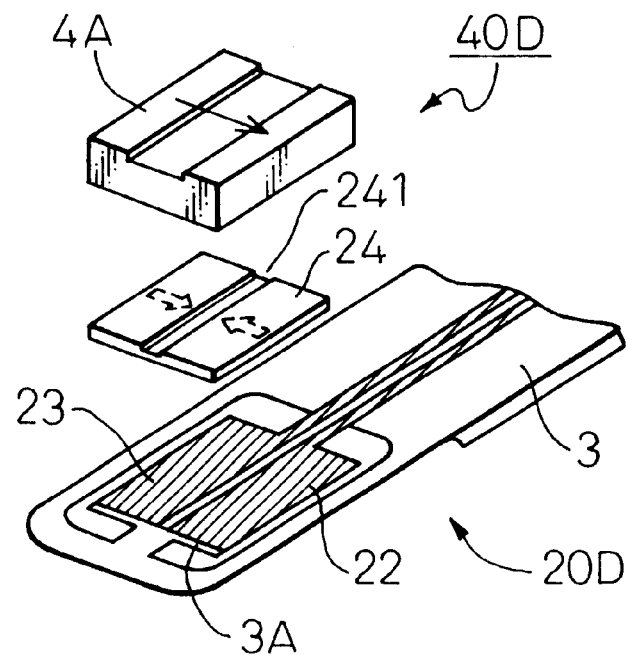
FIG. 19B is a perspective view for assembly showing a configuration of the head-positioning mechanism in the second application using an actuator according to the fourth embodiment of the invention.

FIG. 19B shows an example configuration of a head-positioning mechanism 40D according to the fourth embodiment in the second application of the invention. In the head-positioning mechanism 40D, an actuator 20D according to the fourth embodiment of the invention is used between the forward end of the support spring 3 of the head actuator and the head slider 4A.

In the configuration shown in FIG. 19B, the electrodes 22, 23 are arranged in juxtaposition and longitudinally on the support spring 3 in the island portion 3A at the forward end of the support spring 3, so that the two portions of the shear-type piezoelectric element 24 on the two sides of the partitioning groove 241 are polarized toward each other. In this case, the head slider 4A is driven to proceed in parallel in the direction perpendicular to the longitudinal direction of the support spring 3, but in the direction opposite to the configuration of FIG. 19A, by applying a voltage to the electrodes 22, 23.

Also in the head-positioning mechanism 40D, the electrodes 22, 23 can alternatively be arranged in juxtaposition and perpendicular to the longitudinal direction of the arm 2 in the island portion 3A at the forward end of the support spring 3, so that the shear-type piezoelectric element 24 is polarized longitudinally to the support spring 3. In this case, the head slider 4A is driven to proceed in parallel and longitudinally to the support spring 3 by applying a voltage to the electrodes 22, 23.

The driving directions of the actuators 20C and 20D as explained by using FIGS. 19A and 19B are examples when the voltage is applied to the electrodes 22, 23 from the voltage amplifying circuit (not shown) in the specific direction. The driving directions of the actuators 20C and 20D as shown in FIGS. 19A and 19B are reversed when the polarity of the applied voltage to the electrodes 22, 23 is reversed.

FIGS. 20A to 20D show various example configurations of a head-positioning mechanism 40E according to the fifth embodiment in the second application of the invention. In the head-positioning mechanism 40E, the actuator 20E according to the fifth embodiment of the invention is used between the forward end of the support spring 3 of the head actuator and the head slider 4A.

Figure 20A:
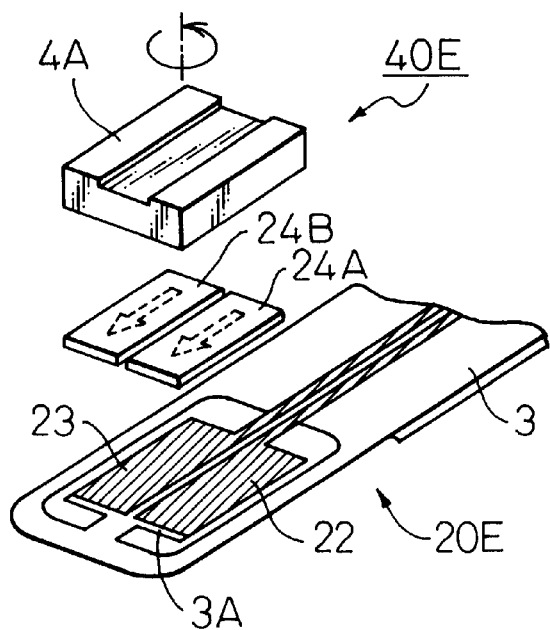
FIGS. 20A to 20D are perspective views for assembly showing a configuration of the head-positioning mechanism in the second application using an actuator according to the fifth embodiment of the invention.
Figure 20B:
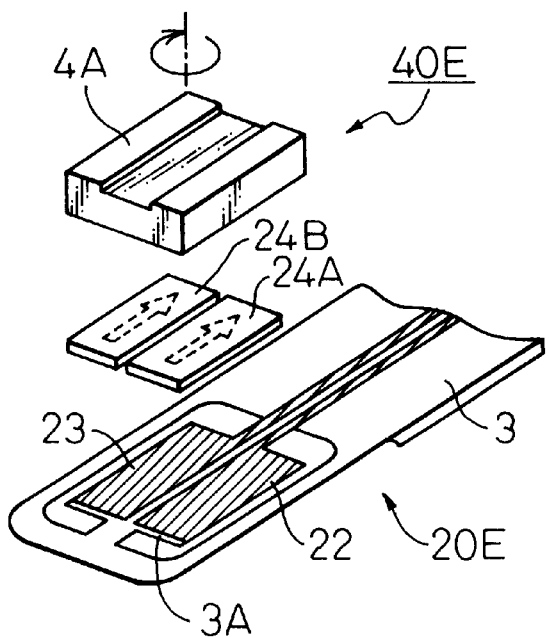

In the configuration shown in FIG. 20A, the electrodes 22, 23 are arranged in juxtaposition longitudinally of the arm 2 in the island portion 3A at the forward end of the support spring 3, so that the shear-type piezoelectric elements 24A, 24B are laid on the electrodes 22, 23. The shear-type piezoelectric elements 24A, 24B are polarized toward the forward end of the support spring 3. In this case, the head slider 4A is rotationally driven by applying a voltage to the electrodes 22, 23. The configuration shown in FIG. 20B is different from that shown in FIG. 20A only in that the shear-type piezoelectric elements 24A, 24B are polarized toward the base of the support spring 3. In this case, too, by applying a voltage to the electrodes 22, 23, the head slider 4A is rotationally driven but in the direction opposite to that for the configuration of FIG. 20A.

Figure 20C:
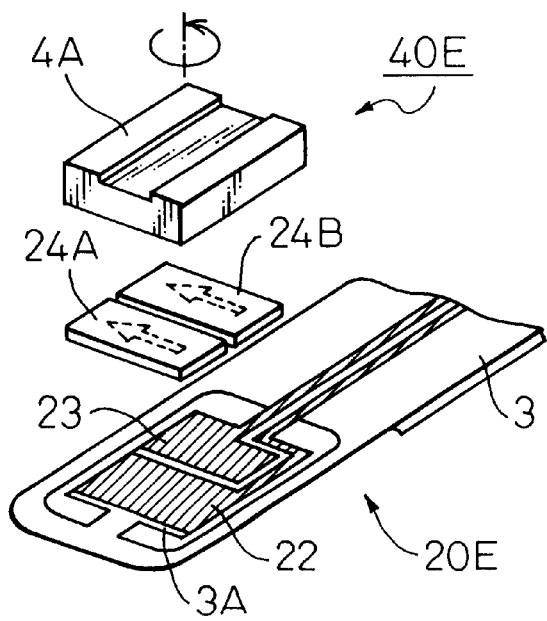
Figure 20D:
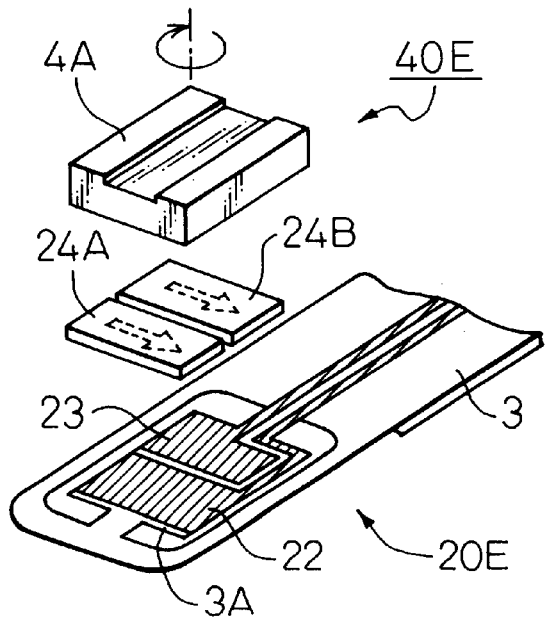

With the configuration shown in FIG. 20C, the electrodes 22, 23 are arranged in juxtaposition and perpendicular to the longitudinal direction of the support spring 3 in the island portion 3A at the forward end of the support spring 3, so that the shear-type piezoelectric elements 24A, 24B are polarized toward the forward ends of the electrodes 22, 23, respectively. In this case, too, the head slider 4A is rotationally driven by applying a voltage to the electrodes 22, 23. The configuration shown in FIG. 20D is different from that of FIG. 20C only in that the shear-type piezoelectric elements 24A, 24B are polarized toward the base of the electrodes 22, 23. Also in this case, by applying a voltage to the electrodes 22, 23, the head slider 4A is rotationally driven but in the direction opposite to that for the configuration of FIG. 20C.

The driving directions of the actuator 20E as explained by using FIGS. 20A to 20D are examples when the voltage is applied to the electrodes 22, 23 from the voltage amplifying circuit (not shown) in the specific direction. The driving directions of the actuator 20E as shown in FIGS. 20A to 20D are reversed when the polarity of the applied voltage to the electrodes 22, 23 is reversed.

FIGS. 21A to 21D show various example configurations of the head-positioning mechanism 40F according to the sixth embodiment in the second application of the invention. The head-positioning mechanism 40F uses an actuator 20F according to the sixth embodiment of the invention between the forward end of the support spring 3 of the head actuator and the head slider 4A.

Figure 21A:
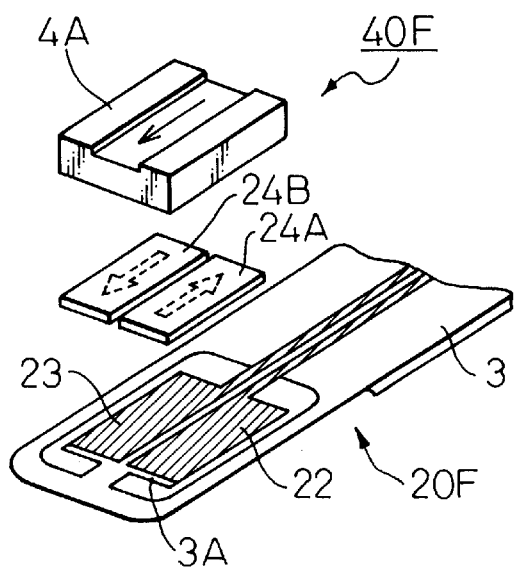
FIGS. 21A to 21D are perspective views for assembly showing a configuration of the head-positioning mechanism in the second application using an actuator according to the sixth embodiment of the invention.
Figure 21B:
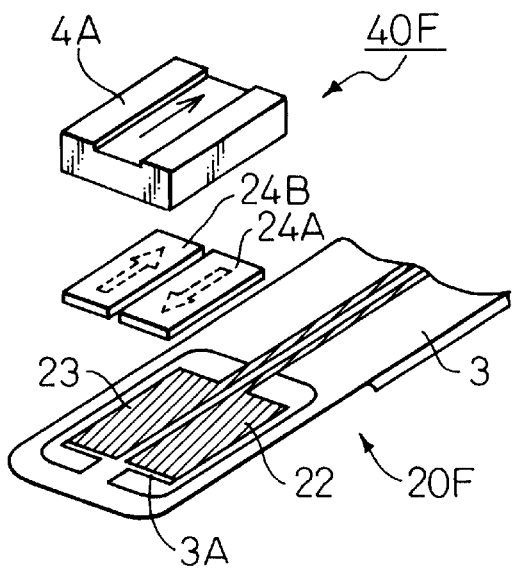

With the configuration shown in FIG. 21A, the electrodes 22, 23 are arranged in juxtaposition longitudinally of the support spring 3 in the island portion 3A at the forward end of the support spring 3, and one of the shear-type piezoelectric elements 24A, 24B is polarized toward the forward end of the support spring 3 while the other shear-type piezoelectric element is polarized toward the base of the support spring 3. In this case, the head slider 4A is driven to proceed in parallel longitudinally of the support spring 3 by applying a voltage to the electrodes 22, 23. The configuration shown in FIG. 21B is different from the configuration shown in FIG. 21A only in that the shear-type piezoelectric elements 24A, 24B are polarized in the directions opposite to those for the configuration of FIG. 21A. In this case also, by applying a voltage to the electrodes 22, 23, the head slider 4A is driven to proceed in parallel but in the direction opposite to that for the configuration shown in FIG. 21A.

Figure 21C:
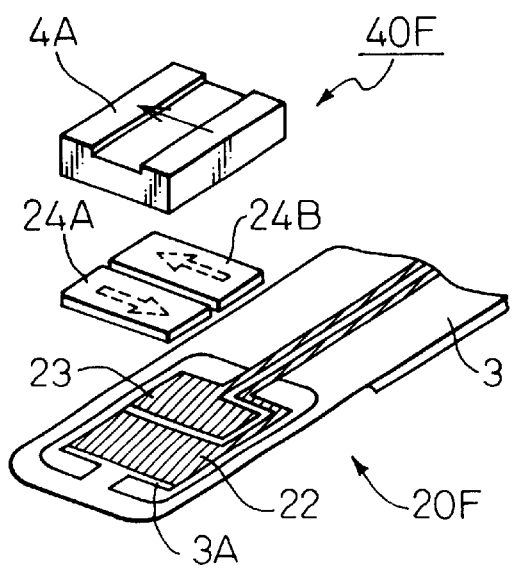
Figure 21D:
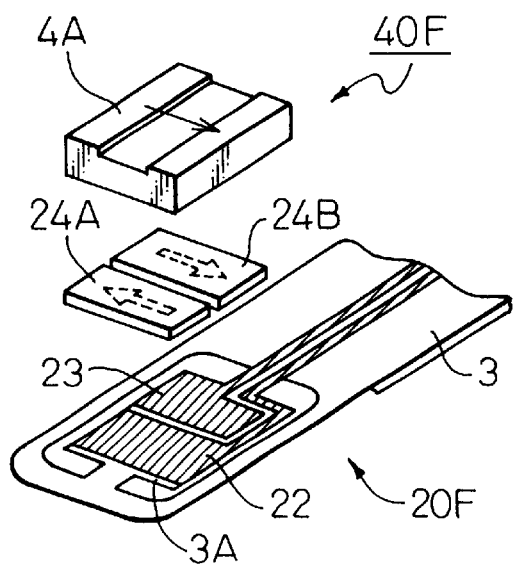

In the configuration shown in FIG. 21C, the electrodes 22, 23 are arranged in juxtaposition perpendicular to the longitudinal direction of the support spring 3 in the island portion 3A at the forward end of the support spring 3, so that one of the shear-type piezoelectric elements 24A, 24B is polarized toward the left end of the island portion 3A, while the other shear-type piezoelectric element is polarized toward the right end of the island portion 3A. In this case also, by applying a voltage to the electrodes 22, 23, the head slider 4A is driven to proceed in parallel in the direction perpendicular to the longitudinal direction of the support spring 3. The configuration shown in FIG. 21D is different from the configuration shown in FIG. 21C only in that the directions of polarization of the shear-type piezoelectric elements 24A, 24B are opposite to those for the configuration shown in FIG. 21C. In this case, too, the head slider 4A is driven to proceed in parallel in the direction perpendicular to the longitudinal direction of the support spring 3 but in the direction opposite to that for the configuration shown in FIG. 21C.

The driving directions of the actuator 20F as explained by using FIGS. 21A to 21D are examples when the voltage is applied to the electrodes 22, 23 from the voltage amplifying circuit (not shown) in the specific direction. The driving directions of the actuator 20F as shown in FIGS. 21A to 21D are reversed when the polarity of the applied voltage to the electrodes 22, 23 is reversed.

Figure 22A:
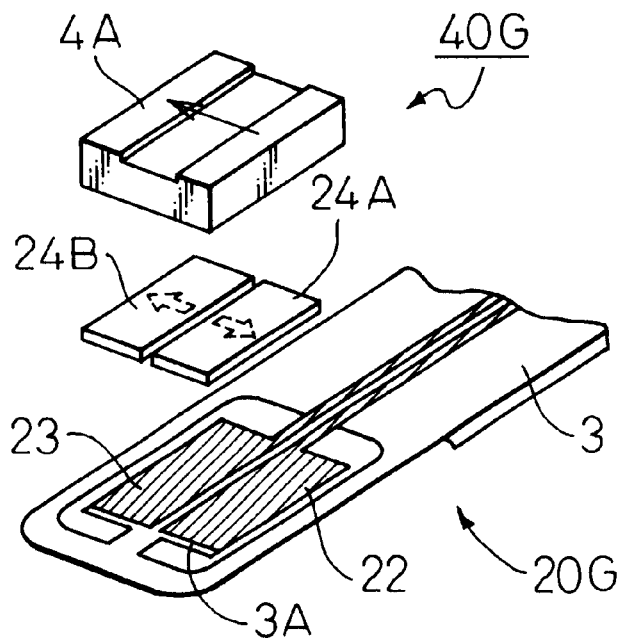
FIG. 22A is a perspective view for assembly showing a configuration of the head-positioning mechanism in the second application using an actuator according to the seventh embodiment of the invention.

FIG. 22A shows an example configuration of a head-positioning mechanism 40G according to a seventh embodiment in the second application of the invention. In the head-positioning mechanism 40G, an actuator 20G according to the seventh embodiment of the invention is used between the forward end of the support spring 3 of the head actuator and the head slider 4A.

In the configuration shown in FIG. 22A, the electrodes 22, 23 are arranged in juxtaposition longitudinally of the support spring 3 in the island portion 3A at the forward end of the support spring 3, so that the shear-type piezoelectric elements 24A, 24B are polarized away from each other in the direction perpendicular to the longitudinal direction of the support spring 3. In this case, the head slider 4A is driven to proceed in parallel in the direction perpendicular to the longitudinal direction of the support spring 3 by applying a voltage to the electrodes 22, 23.

Also in the head-positioning mechanism 40G, the electrodes 22, 23 can alternatively be arranged in juxtaposition and perpendicular to the longitudinal direction of the support spring 3 in the island portion 3A at the forward end of the support spring 3, so that the shear-type piezoelectric elements 24A, 24B can be polarized longitudinally of the support spring 3. In this case, the head slider 4A is driven to proceed in parallel longitudinally of the support spring 3 by applying a voltage to the electrodes 22, 23.

Figure 22B:
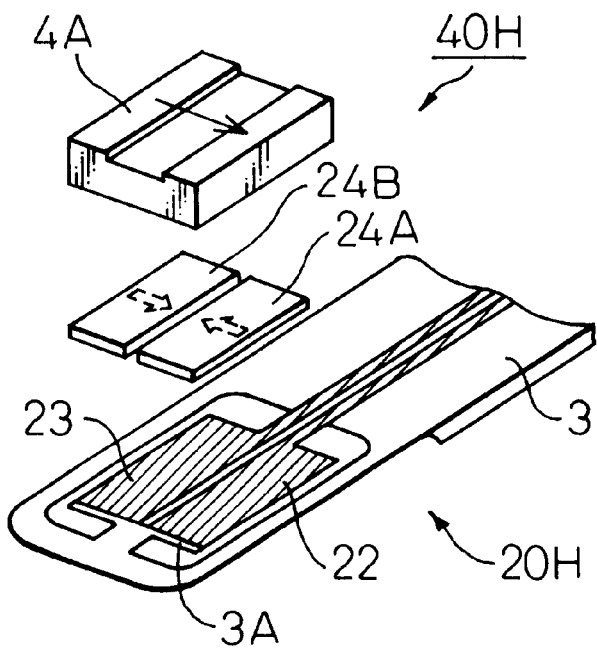
FIG. 22B is a perspective view for assembly showing a configuration of the head-positioning mechanism in the second application using an actuator according to the eighth embodiment of the invention.

FIG. 22B shows an example configuration of a head-positioning mechanism 40H according to an eighth embodiment in the second application of the invention. In the head-positioning mechanism 40H, an actuator 20H according to the eighth embodiment of the invention is used between the forward end of the support spring 3 of the head actuator and the head slider 4A.

In the configuration shown in FIG. 22B, the electrodes 22, 23 are arranged in juxtaposition and longitudinally to the support spring 3 in the island portion 3A at the forward end of the support spring 3, so that the shear-type piezoelectric elements 24A, 24B are polarized toward each other in the directions perpendicular to the longitudinal direction of the support spring 3. In this case, the head slide 4A is driven to proceed in parallel in the direction perpendicular to the longitudinal direction of the support spring 3 but in the direction opposite to that for the configuration of FIG. 22A by applying a voltage to the electrodes 22, 23.

Also in the head-positioning mechanism 40H, the electrodes 22, 23 can alternatively be arranged in juxtaposition and perpendicular to the longitudinal direction of the support spring 3 in the island portion 3A at the forward end of the support spring 3, so that the shear-type piezoelectric elements 24A, 24B are polarized longitudinally of the support spring 3. In this case, the head slider 4A is driven to proceed in parallel longitudinally of the support spring 3 by applying a voltage to the electrodes 22, 23.

In the head-positioning mechanisms 40A to 40H according to the first to eighth embodiments in the second application of the invention described above, only the head slider 4A is driven by the actuators 20A to 20H according to the first to eighth embodiments, and the mass of the movable portions can improve the resonance point of the actuator.

The driving directions of the actuators 20G and 20H as explained by using FIGS. 22A and 22B are examples when the voltage is applied to the electrodes 22, 23 from the voltage amplifying circuit (not shown) in the specific direction. The driving directions of the actuators 20G and 20H as shown in FIGS. 22A and 22B are reversed when the polarity of the applied voltage to the electrodes 22, 23 is reversed.

FIG. 23A shows an example configuration of a head-positioning mechanism 40J according to a ninth embodiment in the second application of the invention. With the head-positioning mechanism 40J, an actuator 20C according to the third embodiment of the invention can be used between the forward end of the head slider 4A and a head element board 4B.

In the configuration shown in FIG. 23A, the electrodes 22, 23 are arranged in juxtaposition on the end surface of the head slider 4A mounted in the island portion 4A at the forward end of the support spring 3 before the head element boards 4B is mounted. The head element board 4B is mounted on the electrodes 22, 23 with the shear-type piezoelectric element 24 sandwiched therebetween. An opposed electrode is arranged, though not shown, over the entire surface of the head element board 4B nearer to the shear-type piezoelectric element 24. In this case, the two portions of the shear-type piezoelectric element 24 are polarized away from each other in the directions perpendicular to the longitudinal direction of the support spring 3.

FIG. 23B shows a configuration of the head-positioning mechanism 40J in an assembled state according to the ninth embodiment in the second application. In the head-positioning mechanism 40J, the head element board 4B is driven to proceed in parallel in the directions perpendicular to the longitudinal direction of the head slider 4A as indicated by arrow by applying a voltage to the electrodes 22, 23.

The head-positioning mechanisms 40A to 40J according to the first to ninth embodiments in the second application of the invention described above use the actuators 20A to 20J, respectively, which are simple in structure and high in control accuracy and therefore can be easily fabricated with high assembly efficiency.

As described above, according to the present invention, there is provided an actuator requiring no high dimensional accuracy of the elements and using shear-type piezoelectric elements capable of positioning with high accuracy.

Also, according to the present invention, there is provided a head-positioning mechanism simple in structure, high in fabrication and assembly efficiency and superior in positioning accuracy by use of an actuator capable of positioning with high accuracy which requires little dimensional accuracy.

FIG. 31A is a perspective view showing a configuration of an actuator 51 using a shear-type piezoelectric element in an assembled state according to the 11th embodiment of the invention.

As shown in FIG. 31A, the actuator 51 according to the first embodiment comprises a fixed member 21C making up a base, a drive member 80 arranged on the fixed member 21C and a movable member 90 arranged on the drive member 80. In this embodiment, the fixed member 21C is made of a conductive metal. The drive member 80 is configured of two shear-type piezoelectric elements 24 and a conductive layer 34 sandwiched between them. The two piezoelectric elements 24 making up the drive member 80 are polarized in opposite directions in the directions indicated by dotted line, i.e. in the directions perpendicular to the thickness of the device. The movable member 90 arranged on the drive member 80 is also made of a conductive metal.

Although the drive member 80 in this embodiment is configured of the two piezoelectric elements 24 laid one on the other, more piezoelectric elements 24 may be laid one on another. In such a case, every other piezoelectric element is polarized in the same direction, and a conductive layer 34 is inserted between each pair of adjacent piezoelectric elements 24.

In the embodiment shown in FIG. 31A, the electrodes for applying a voltage to the piezoelectric elements 24 are constituted of the fixed member 21C made of a conductive metal, the conductive layer 34 and the movable member 90 made of a conductive metal. As shown in FIG. 31C, however, an electrode film 38 can be formed on the upper and lower surfaces of the piezoelectric element 24 for applying a voltage uniformly from the electrodes to the piezoelectric element 24. The electrode films 38 are configured of, for example, a chromium layer 38A and a platinum layer 38B about 0.2 μm in thickness. The electrode films 38 can be formed by sputtering.

Further, as a modification of the embodiment shown in FIG. 31A, the conductive layer 34 can be a conductive adhesive. In this case, the electrode films 38 are not required to be formed on the upper and lower surfaces of the piezoelectric element 24. Also, a conductive adhesive can be used for connection between the piezoelectric element 24 and the fixed member 21C and between the piezoelectric element 24 and the movable member 90. This modification has the advantage that the step of forming the electrode films 38 is eliminated.

Furthermore, as another modification of the embodiment shown in FIG. 31A, a single piezoelectric element 24 can be used as the drive member 80 as shown in FIG. 31D.

FIG. 31B shows the assembled state of the actuator 51 of FIG. 31A. In this embodiment, the fixed member 21C and the movable member 90 are connected through an amplifier 28 to a controller 29. The conductive layer 34 of the drive member 80 and the controller 29 are grounded. A drive signal of a predetermined polarity output from the controller 29, therefore, is amplified by the amplifier 28 so that a predetermined voltage is applied along the thickness of the two piezoelectric elements 24, with the result that the actuator 51 according to the 11th embodiment is deformed in the direction of two-dot chain. The amount by which the actuator 51 is deformed is larger the higher the voltage value applied thereto and the greater the number of the piezoelectric elements 24 stacked in the drive member 80 making up the actuator 51.

In FIG. 31B, the controller 29 outputs two drive signals of positive and negative polarities. In the case where a drive signal of opposite polarity to that described above is output from the controller 29, therefore, the actuator 51 is deformed in the direction opposite to the shown direction. As described above, the actuator 51 according to the 11th embodiment is such that the portion thereof nearer to the movable member 90 has mounted thereon a member with the operation thereof required to be controlled, while fixing the portion of the actuator 51 nearer to the fixed member 21C. The polarity and amplitude of the drive signal from the controller 29 or the amplification factor of the amplifier 28 is appropriately regulated to control the direction and magnitude of the voltage applied to the piezoelectric elements 24 of the drive member 80, thereby making it possible to finely control the linear motion of the member by a minuscule distance. Also, in the case where the drive signal is a rectangular wave, the magnitude of the voltage applied to the piezoelectric elements 24 can be controlled by the duty cycle.

Now, explanation will be made about the fact that the displacement per volt (hereinafter referred to as the displacement sensitivity) of the movable member 90 can be increased by increasing the number of the piezoelectric elements 24 laid one on another.

Let $\lambda$ be the displacement of a shear-type piezoelectric element, n be the number of the piezoelectric elements laid one on another, d15 be the shear mode piezoelectric constant of the piezoelectric elements, and V be the applied voltage. Then, the displacement $\lambda$ is generally expressed as $$\lambda = n \times d15 \times V \text{ (d15: a constant determined by the material involved)}$$

In other words, the displacement sensitivity $\gamma$ is given as $\lambda/V = n \times d15$, which increases in proportion to the number of the piezoelectric elements laid one on another.

Table 1 below shows the measurements of the displacement sensitivity $\gamma$ of the piezoelectric elements formed in one and two layers. It is noted from this table that the piezoelectric elements in two layers have a displacement sensitivity 1.8 times higher than the piezoelectric element formed in one layer.

TABLE 1

| Number of layers and displacement sensitivity | |
|---|---|
| Number of device layers | Displacement sensitivity |
| One device | 0.42 nm/V |
| Two devices | 0.76 nm/V |

Figure 32A:
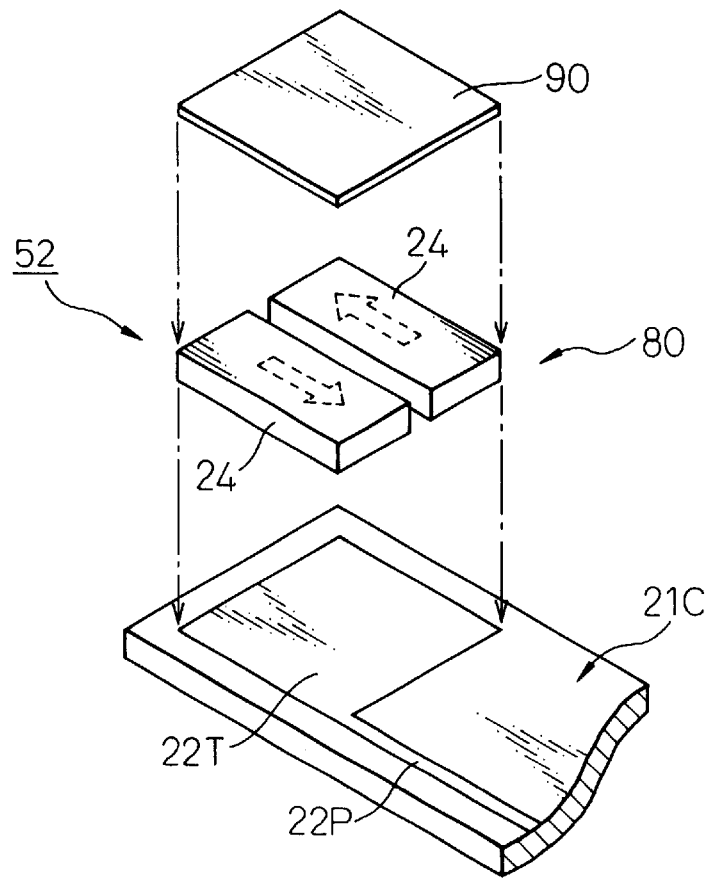
FIG. 32A is a perspective view showing a configuration of an actuator using a shear-type piezoelectric element according to a 12th embodiment of the invention in assembled state.

FIG. 32A is a perspective view showing the configuration of an actuator 52 in assembled state using a shear-type piezoelectric element according to a 12th embodiment of the invention.

As shown in FIG. 32A, the actuator 52 according to the 12th embodiment comprises a fixed member 21C making up a base, a drive member 80 arranged on the fixed member 21C and a movable member 90 arranged on the drive member 80. In this embodiment, an electrode 22T is arranged on the fixed member 21C and connected to a power supply not shown by a lead pattern 22P. In the case where the fixed member 21C is made of a non-conductive material, the electrode 22T is arranged directly on the fixed member 21C, while in the case where the fixed member 21C is made of a conductive metal, the electrode 22T is arranged on the fixed member 21C through an insulating layer of such a material as polyimide. The drive member 80 includes two shear-type piezoelectric elements 24 arranged in parallel to each other. The two piezoelectric elements 24 making up the drive member 80 are polarized in the directions of dotted arrows, i.e. in the opposite directions perpendicular to the thickness of the device. The movable member 90 formed on the drive member 80 is made of a conductive metal.

Also in this embodiment, electrode films 38, including a chromium layer 38A and a platinum layer 38B about 0.2 $\mu$m thick, can be formed by sputtering on the upper and lower surfaces, respectively, of the two piezoelectric elements 24. It is also possible to not arrange the electrode films 38 on the upper and lower surfaces of the piezoelectric elements 24 but to connect the piezoelectric elements 24 with the fixed member 21C and the piezoelectric elements 24 with the movable member 90 by means of a conductive adhesive.

Figure 32B:
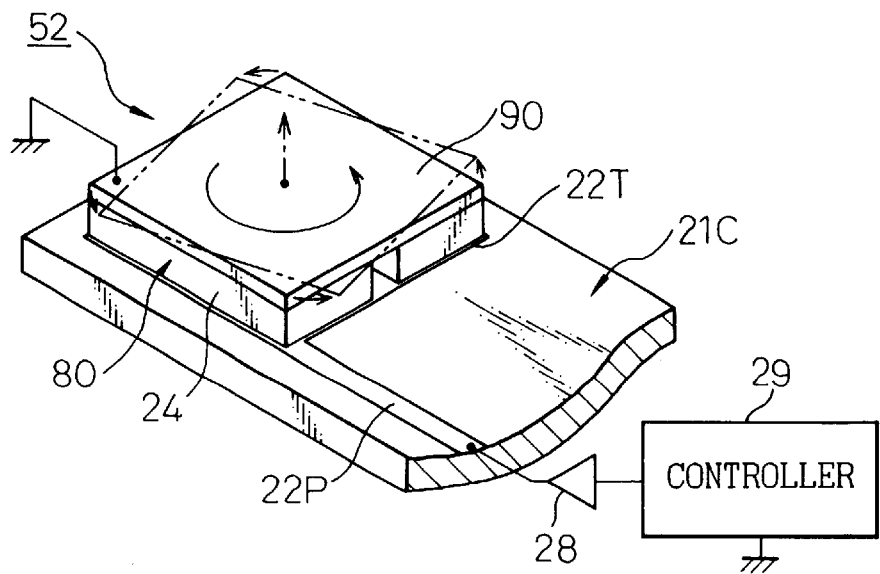
FIG. 32B is a perspective view showing an example operation of the actuator of FIG. 32A after being assembled.

FIG. 32B shows the actuator 52 in an assembled state. In this embodiment, the electrode 22T of the fixed member 21C is connected to the controller 29 through the lead pattern 22P and the amplifier 28. The movable member 90 and the controller 29 are grounded. A drive signal of predetermined polarity, when output from the controller 90, therefore, is amplified by the amplifier 28, so that a predetermined voltage is applied along the thickness of the two piezoelectric elements 24. The actuator 52 according to the 12th embodiment thus is rotated in the direction indicated by two-dot chain. The larger the amount of rotation, the higher the applied voltage.

In FIG. 32B, drive signals of both positive and negative polarities are output from the controller 29. In the case where a drive signal of a polarity opposite to the above-mentioned polarity is output from the controller 29, therefore, the actuator 52 is deformed in the direction opposite to the shown direction. With the actuator 52 according to the 12th embodiment, a member to be controlled in operation is mounted on the portion thereof nearer to the movable member 90 with the portion nearer to the fixed member 21C fixed, and the polarity and amplitude of the drive signal from the controller 29 are regulated appropriately to control the direction and magnitude of the voltage applied to the piezoelectric elements 24 of the drive member 80. In this way, the rotation of the particular member can be controlled by a minuscule distance.

Figure 33A:
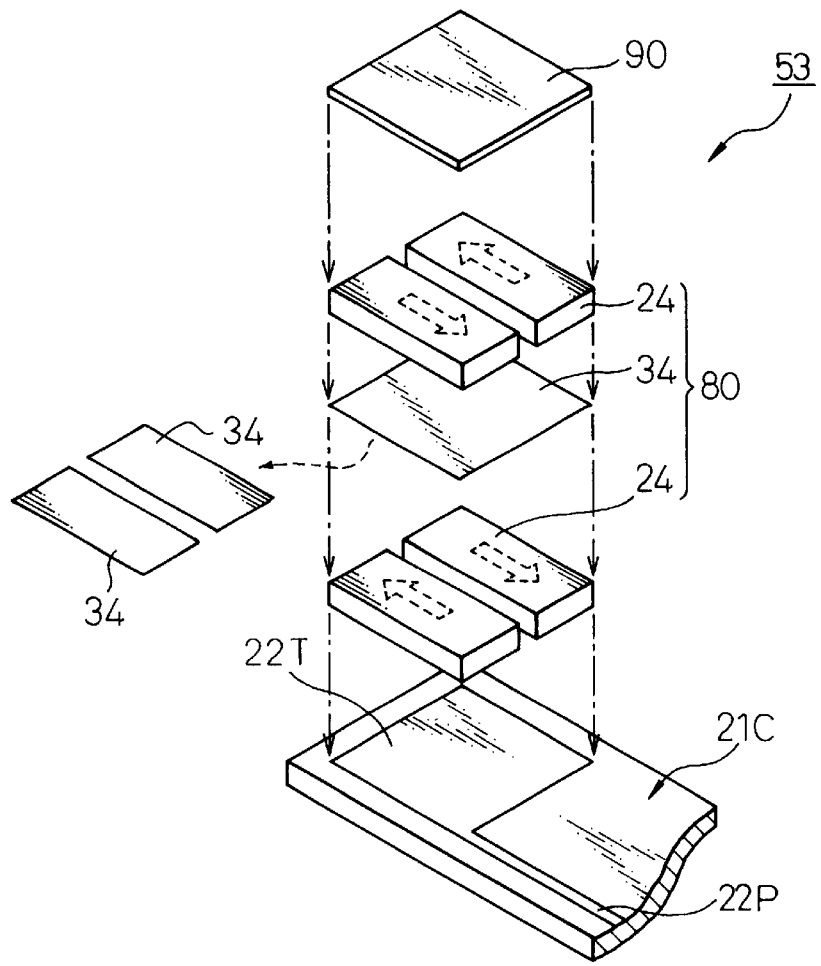
FIG. 33A is a perspective view showing a configuration of an actuator using a shear-type piezoelectric element according to a 13th embodiment of the invention in assembled state.

FIG. 33A is a perspective view showing a configuration of the actuator using shear-type piezoelectric elements in an assembled state according to a 13th embodiment of the invention. The actuator 53 according to the 13th embodiment is a modification of the actuator 52 of the second embodiment.

As shown in FIG. 33A, the actuator 53 according to the 13th embodiment is a multilayered version of the drive member 80 of the actuator 52 according to the 12th embodiment. Specifically, the actuator 53 according to the 13th embodiment is different from the actuator 52 according to the second embodiment only in that the drive member 80 interposed between the fixed member 21C and the movable member 90 is configured of two layers of piezoelectric elements 24 holding the conductive layers 34 therebetween.

In the 13th embodiment, the two piezoelectric elements 24 arranged just under the movable member 90 are polarized in the same direction as the piezoelectric elements in the 12th embodiment. In this case, the direction of polarization of each of the piezoelectric elements 24 arranged on the fixed member 21C is opposite to those of the piezoelectric elements 24 laterally and vertically adjacent thereto.

In this embodiment, as in the foregoing embodiments, an electrode film 38 made of a chromium layer 38A and a platinum layer 38B about 0.2 $\mu$m thick can be formed by sputtering on the upper and lower surfaces of the four piezoelectric elements 24. Also, instead of forming the electrode film 38 on the upper and lower surfaces of the piezoelectric elements 24, a conductive adhesive can be used for connection between the piezoelectric elements 24 and the fixed member 21C and between the piezoelectric elements 24 and the movable member 90.

Figure 33B:
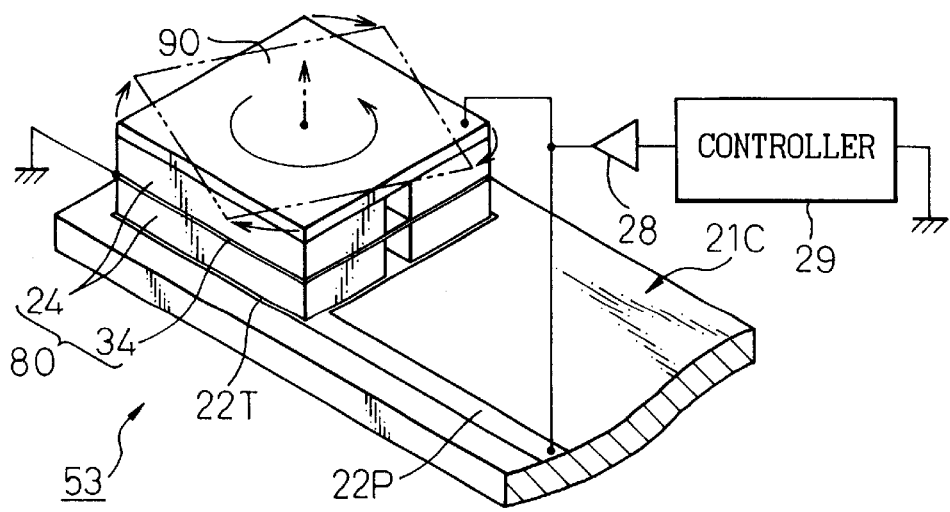
FIG. 33B is a perspective view showing an example operation of the actuator of FIG. 33A after being assembled.

FIG. 33B shows the actuator 53 of FIG. 33A in an assembled state. In this embodiment, the electrode 22T of the fixed member 21C and the movable member 90 are connected through the amplifier 28 to the controller 29. The conductive layer 34 and the controller 29 are grounded. A drive signal of predetermined polarity, when output from the controller 29, therefore, is amplified by the amplifier 28 so that a predetermined voltage is applied toward the conductive layer 34 from the electrode 22T and the movable member 90 along the thickness of the four piezoelectric elements 24. As a result, each layer is rotated in the same direction as in the actuator 52 of the 12th embodiment. The actuator 53 according to the 13th embodiment thus rotates in the direction indicated by two-dot chain. The amount of rotation of the actuator 53 is about twice that of the actuator 52 of the 12th embodiment with the same applied voltage.

In FIGS. 33A and 33B, the conductive layer 34 is arranged over the juxtaposed piezoelectric elements 24. As an alternative, the conductive layer 34 can be arranged separately on each layer of the piezoelectric elements 24.

Figure 34A:
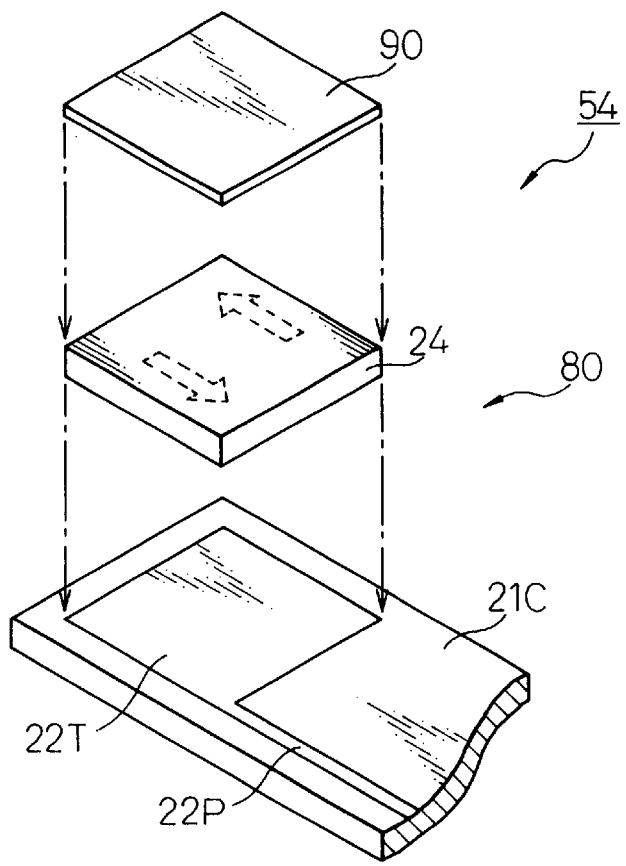
FIG. 34A is a perspective view showing a configuration of an actuator using a shear-type piezoelectric element according to a 14th embodiment of the invention in assembled state.

FIG. 34A is a perspective view showing a configuration of an actuator 54 using a shear-type piezoelectric element according to a 14th embodiment of the invention. The actuator 54 according to the 14th embodiment is a modification of the actuator 52 according to the 12th embodiment.

As shown in FIG. 34A, the actuator 54 according to the 14th embodiment comprises a single integrated piezoelectric element 24 in placed the two piezoelectric elements 24 of the drive member 80 of the actuator 52 according to the 12th embodiment. Specifically, the actuator 54 according to the 14th embodiment is different from the actuator 52 according to the 12th embodiment only in that the drive member 80 interposed between the fixed member 21C and the movable member 90 is configured of an integrated piezoelectric element 24. This integrated piezoelectric element 24 has internal portions thereof polarized in two different parallel directions. The directions of polarization are the same as those of the two piezoelectric elements 24 according to the 12th embodiment.

Also in this embodiment, the electrode film 38 can be formed, by sputtering, on each of the upper and lower surfaces of the piezoelectric elements 24. Further, the members can be connected to each other by a conductive adhesive.

Figure 34B:
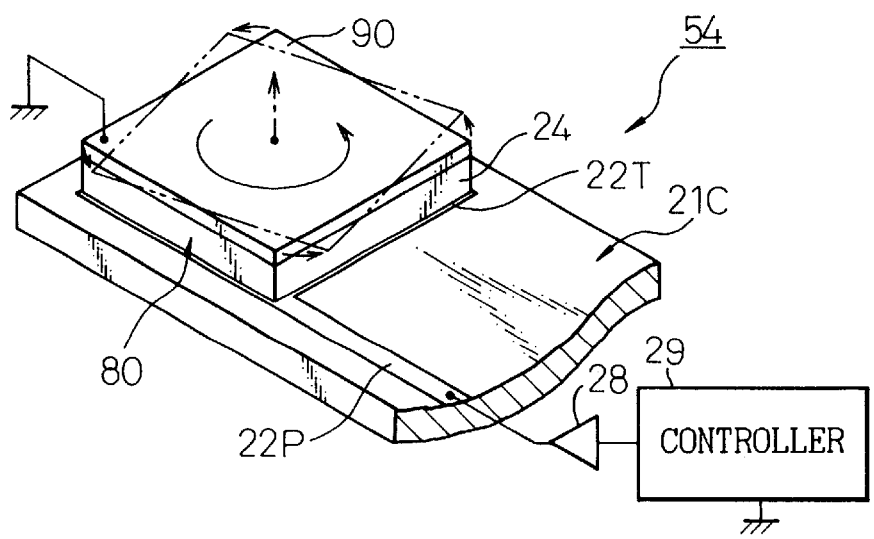
FIG. 34B is a perspective view showing an example operation of the actuator of FIG. 34A after being assembled.

FIG. 34B shows the actuator 54 of FIG. 34A in assembled state. In this embodiment, the electrode 22T of the fixed member 21C is connected to the controller 29 through the lead pattern 22P and the amplifier 28, and the movable member 90 and the controller 29 are grounded. As a result, a drive signal of a predetermined polarity, when output from the controller 29, is amplified by the amplifier 28 so that a predetermined voltage is applied along the thickness of the piezoelectric element 24. Consequently, the integrated piezoelectric element 24 is torsionally deformed. The actuator 54 according to the 14th embodiment thus is rotated in the direction indicated by two-dot chain, i.e. in the same direction as the actuator 52 according to the 12th embodiment. The amount of rotation of the actuator 54 is the same as that of the actuator 52 according to the 12th embodiment.

Figure 34C:
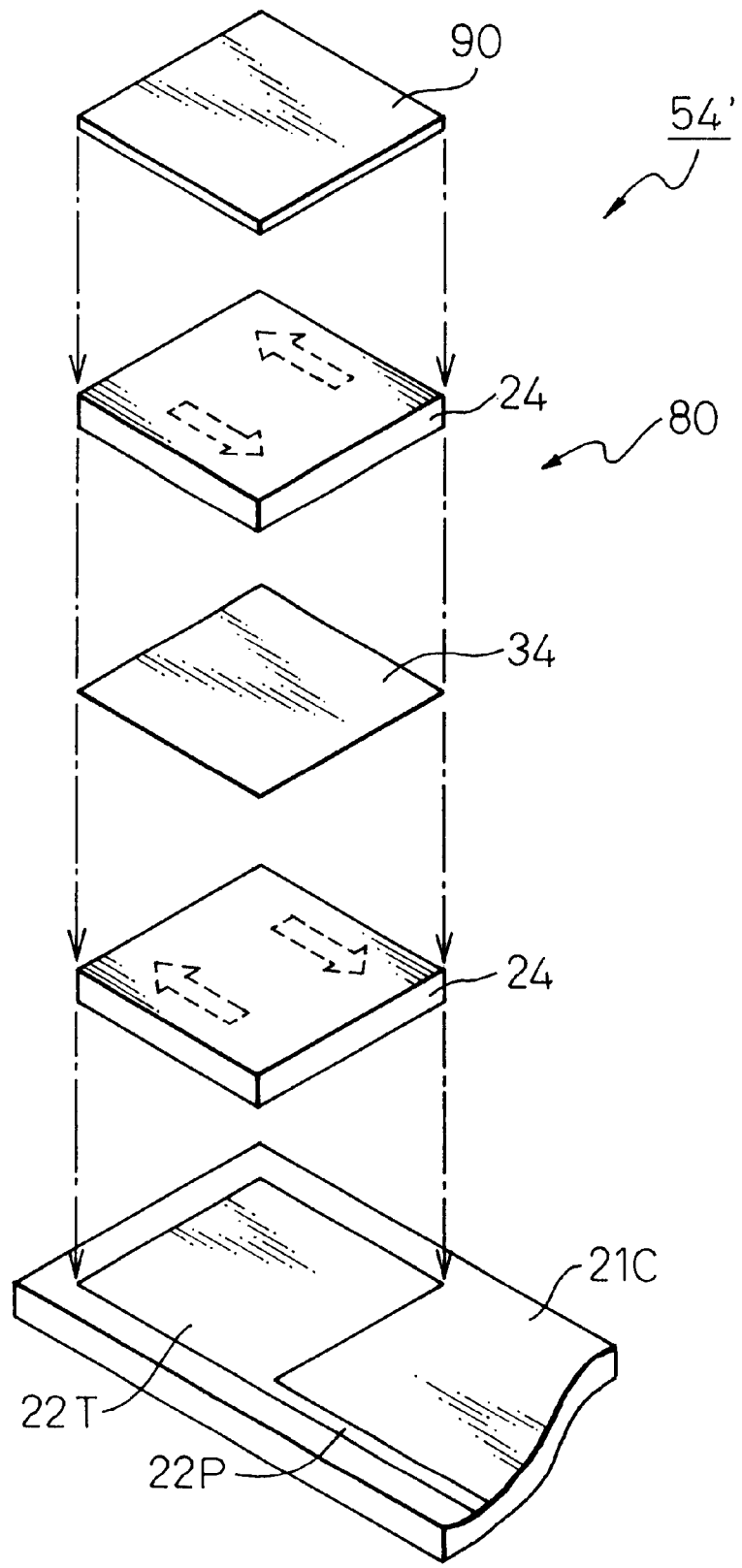
FIG. 34C is a perspective view showing a configuration of an actuator using a shear-type piezoelectric element according to a modification of the 14th embodiment of the invention in assembled state.

FIG. 34C shows the configuration of an actuator 54' according to a modification of the 14th embodiment. In this modification, a second integrated piezoelectric element 24 and a conductive layer 34 are formed between the integrated piezoelectric element 24 and the fixed member 21C of the actuator 54 according to the modification of the 14th embodiment. The second integrated piezoelectric element 24 thus added is polarized in the direction opposite to that of the upper piezoelectric element 24.

As a result, the amount of rotation of the actuator 54' according to a modification of the 14th embodiment is increased as compared with that of the actuator 54 according to the 14th embodiment when a predetermined voltage is applied between the electrode 22T and the conductive layer 34 and between the conductive layer 34 and the movable member.

Figure 35A:
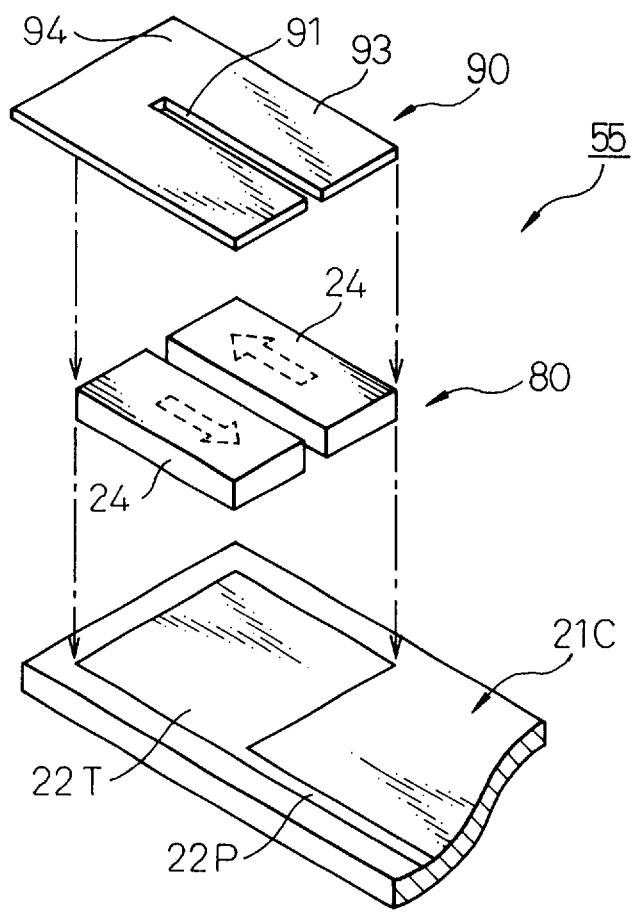
FIG. 35A is a perspective view showing a configuration of an actuator using a shear-type piezoelectric element according to a 15th embodiment of the invention in assembled state.

FIG. 35A is a perspective view showing the configuration of an actuator 55 using a shear-type piezoelectric element in assembled state according to a 15th embodiment of the invention. The actuator 55 according to the 15th embodiment is a modification of the actuator 52 according to the 12th embodiment.

As shown in FIG. 35A, the actuator 55 according to the 15th embodiment is different from the actuator 52 according to the 12th embodiment only in that the movable member 90 includes root portions 93 overlaid on and driven directly by the two piezoelectric elements 24 just under it and a magnified coverage portion 94 protruded from the root portions 93, and in that the root portions 93 have formed therebetween a first notch 91 for separating the two root portions 93 from each other. The first notch 91 is arranged in parallel to the directions of polarization of the two piezoelectric elements 24 of the drive member 80 on which the root portions 93 are formed.

Also in this embodiment, too, the electrode film 38 can be formed by sputtering on each of the upper and lower surfaces of the two piezoelectric elements 24. Also, instead of forming the electrode films 38 on the upper and lower surfaces of the piezoelectric elements 24, a conductive adhesive can be used for connecting between the piezoelectric elements 24 and the fixed member 21C and between the piezoelectric elements 24 and the movable member 90.

Figure 35B:
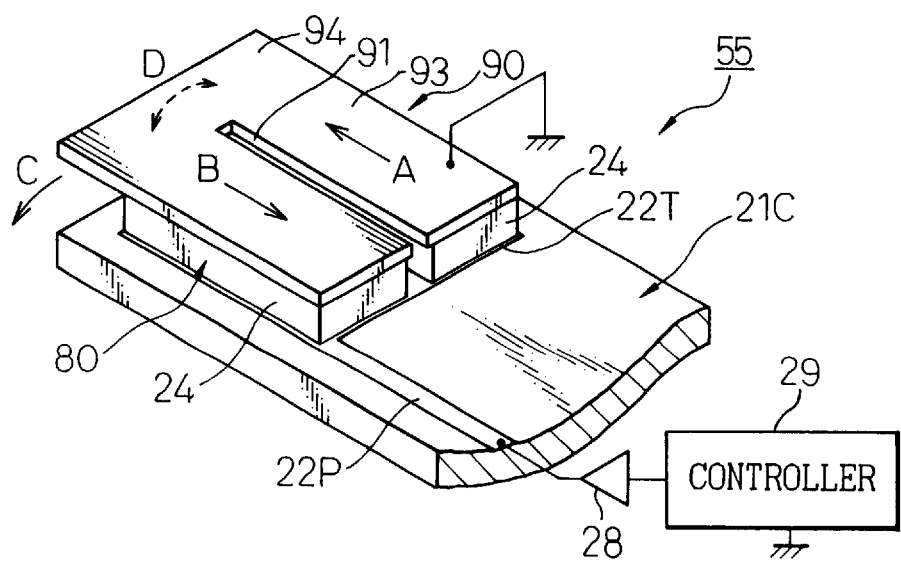
FIG. 35B is a perspective view showing an example operation of the actuator of FIG. 35A after being assembled.

FIG. 35B shows the actuator 55 of FIG. 35A in an assembled state. In this embodiment, the electrode 22T of the fixed member 21C is connected to the controller 29 through the lead pattern 22P and the amplifier 28, and the movable member 90 and the controller 29 are grounded. A drive signal of predetermined polarity, when output from the controller 29, is amplified by the amplifier 28 so that a predetermined voltage is applied along the thickness of the piezoelectric elements 24. As a result, the two piezoelectric elements 24 are moved in the directions of arrows A and B, respectively, in accordance with the direction of polarization thereof. Then, the magnified coverage portion 94 is rotated in the direction of arrow C.

In FIG. 35B, both positive and negative drive signals are output from the controller 29. When a drive signal of a polarity opposite to that in the above-mentioned case is output from the controller 29, therefore, the actuator 55 is rotated in the direction opposite to that of arrow C. In this way, the actuator 55 according to the 15th embodiment can rotate and control the rotation of a member mounted on the magnified coverage portion 94 with the portion thereof nearer to the fixed member 21C fixed, by controlling the voltage applied to the piezoelectric elements 24 of the drive member 80. Thus the particular member can be controlled to swing by a minuscule distance in the directions of arrow D as indicated by dashed line.

Figure 36A:
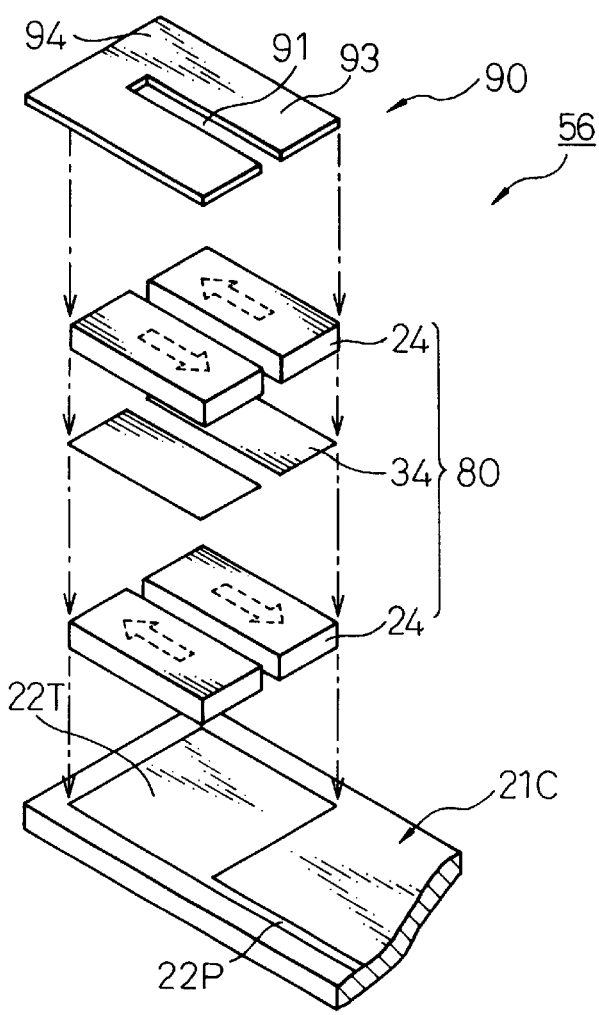
FIG. 36A is a perspective view showing a configuration of an actuator using a shear-type piezoelectric element according to a 16th embodiment of the invention in assembled state.

FIG. 36A is a perspective view showing a configuration of an actuator 56 using a shear-type piezoelectric element in assembled state according to a 16th embodiment of the invention. The actuator 56 according to the 16th embodiment is a modification of the actuator 53 according to the 13th embodiment.

As shown in FIG. 36A, the difference between the actuator 56 according to the 16th embodiment and the actuator 53 according to the 13th embodiment lies only in that in the 16th embodiment, the movable member 90 is configured of root portions 93 formed on and driven directly by the two piezoelectric elements 24 and a magnified coverage portion 94 protruded from the root portions 93, in that a first notch 91 is formed to separate the two root portions 93 from each other, and in that the conductive layer 34 is also divided into two portions by the first notch 91. The first notch 91 is formed in parallel to the directions of polarization of the four piezoelectric elements 24 of the drive member 80 arranged on the root portions 93.

In this embodiment, too, the electrode film 38 described above can be formed, by sputtering, on each of the upper and lower surfaces of the four piezoelectric elements 24. Also, it is possible to not form the electrode film 38 on the upper and lower surfaces of the piezoelectric elements 24 but to connect the members to each other by means of a conductive adhesive.

Figure 36B:
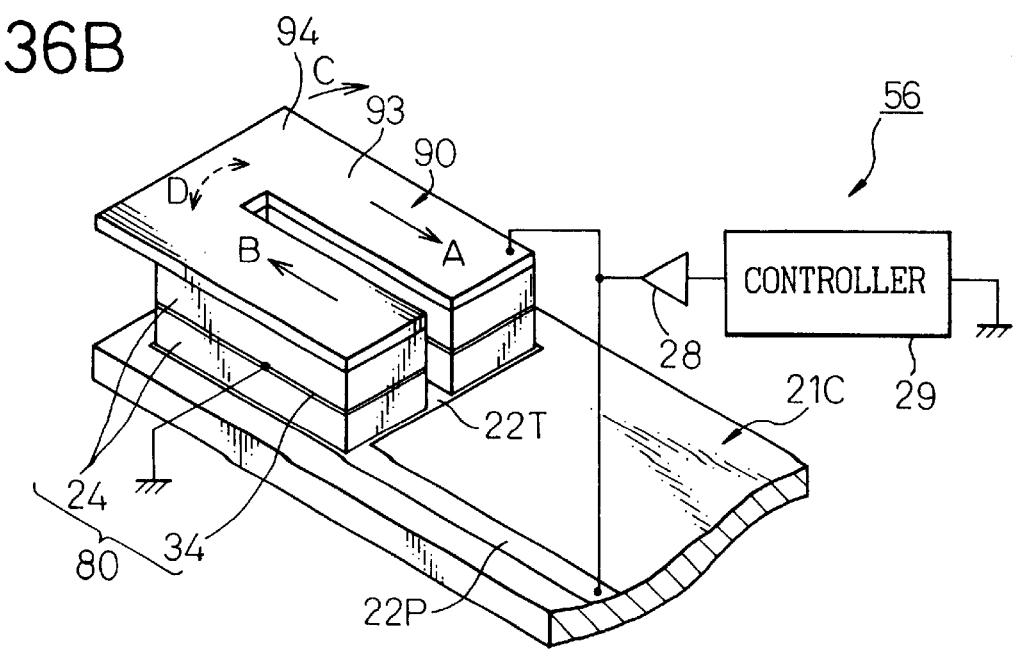
FIG. 36B is a perspective view showing an example operation of the actuator of FIG. 36A after being assembled.

FIG. 36B shows the actuator 56 of FIG. 36A in assembled state. According to this embodiment, the electrode 22T of the fixed member 21C and the movable member 90 are connected to the controller 29 through the amplifier 28, and the controller 29 and the conductive layers 34 are grounded. A drive signal of predetermined polarity, when output from the controller 29, therefore, is amplified by the amplifier 28 so that a predetermined voltage is applied in the direction along the thickness of the piezoelectric elements 24. As a result, the four piezoelectric elements 24 are moved in the directions of arrows A, B in accordance with the directions of polarization thereof, respectively. Then, the magnified coverage portion 94 is rotated in the direction of arrow C.

In FIG. 36B, a drive signal of either a positive polarity or a negative polarity is output from the controller 29. When a drive signal of a polarity opposite to that in the above-mentioned case is output from the controller 29, therefore, the actuator 56 is rotated in the direction opposite that of arrow C. As described above, the actuator 56 according to the 16th embodiment activates and controls a member which is mounted on the magnified coverage portion 94 and fixed on the portion of the actuator 56 nearer to the fixed member 21C, by controlling the application of the voltage to the piezoelectric elements 24 of the drive member 80. The rotation of the particular member can thus be controlled in the direction of dashed arrow D by a minuscule distance. In this way, the amount of rotation of the magnified coverage portion 94 in the 16th embodiment can be increased to almost twice that of the magnified coverage portion 94 according to the 15th embodiment.

Figure 37A:
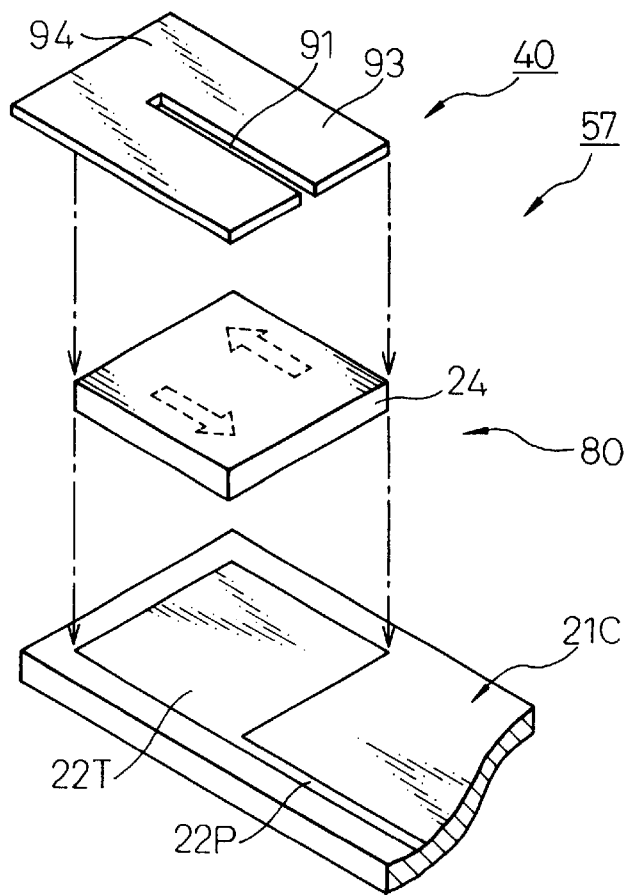
FIG. 37A is a perspective view showing a configuration of an actuator using a shear-type piezoelectric element according to a 17th embodiment of the invention in assembled state.

FIG. 37A is a perspective view showing a configuration of an actuator 57 using a shear-type piezoelectric element according to the 17th embodiment of the invention. The actuator 57 according to the 17th embodiment is a modification of the actuator 54 according to the 14th embodiment.

As shown in FIG. 37A, the actuator 57 according to the 17th embodiment is different from the actuator 54 according to the 14th embodiment only in that the movable member 90 is configured of root portions 93 formed on and driven directly by the piezoelectric element 24 and a magnified coverage portion 94 protruded from the root portions 93 and in that a first notch 91 is formed in such a position as to separate the root portions 93 from each other. This first notch 91 is formed in the direction parallel to the directions of polarization of the piezoelectric element 24 of the drive member 80 on which the root portions 93 are arranged.

In this embodiment, too, the electrode film 38 can be formed by sputtering on each of the upper and lower surfaces of the piezoelectric element 24. Also, it is possible not to form the electrode film 38 on the upper and lower surfaces of the piezoelectric elements 24 but to connect the members by means of a conductive adhesive.

Figure 37B:
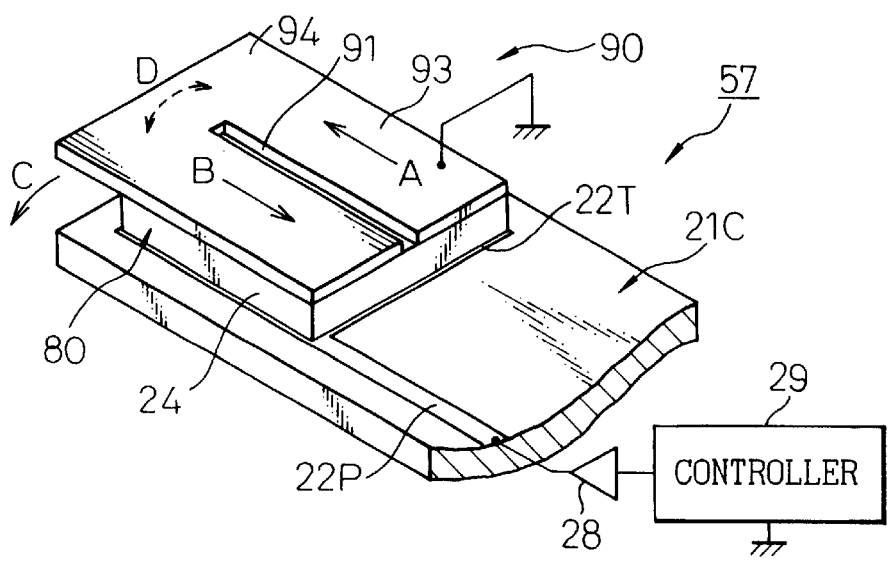
FIG. 37B is a perspective view showing an example operation of the actuator of FIG. 37A after being assembled.

FIG. 37B shows the actuator 57 of FIG. 37A in an assembled state. According to this embodiment, the electrode 22T of the fixed member 21C is connected to the controller 29 through the lead pattern 22P and the amplifier 28, and the controller 29 and the movable member 90 are grounded. Consequently, a drive signal of predetermined polarity output from the controller 29 is amplified by the amplifier 28 so that a predetermined voltage is applied in the direction along the thickness of the piezoelectric element 24. As a result, the piezoelectric element 24 is moved in the directions partly along arrow A and partly along arrow B in accordance with the direction of polarization. Then, the magnified coverage portion 94 is rotated in the direction indicated by arrow C.

In FIG. 37B, a drive signal of either positive or negative polarity is output from the controller 29. When a drive signal of a polarity opposite to that in the above-mentioned case is output from the controller 29, therefore, the actuator 56 is rotated in the direction opposite to arrow C. In this way, suppose that a member, the motion of which is to be controlled, is mounted on the magnified coverage portion 94 with the portion of the actuator 56 nearer to the fixed member 21C fixed and that a voltage controlled appropriately is applied to the piezoelectric element 24 of the drive member 80. Then, it is possible to rotate and control the member in the direction of dashed arrow D by a minuscule distance.

Figure 38A:
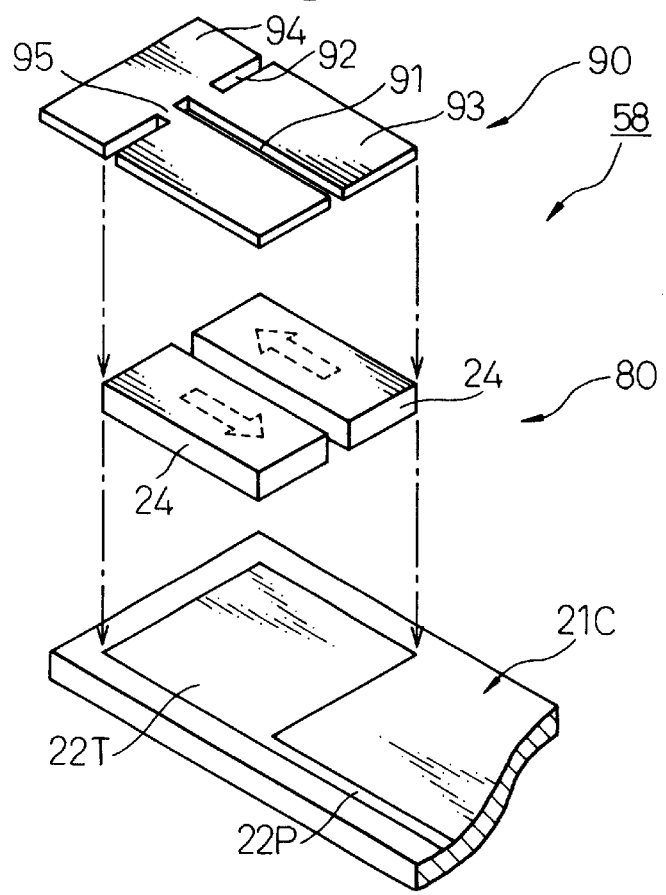
FIG. 38A is a perspective view showing a configuration of an actuator using a shear-type piezoelectric element according to an 18th embodiment of the invention in assembled state.

FIG. 38A is a perspective view showing a configuration of an actuator 58 using a shear-type piezoelectric element in an assembled state according to an 18th embodiment of the invention. The actuator 58 according to the 18th embodiment is a modification of the actuator 55 according to the 15th embodiment.

As shown in FIG. 38A, the actuator 58 according to the 18th embodiment is different from the actuator 55 according to the 15th embodiment only in that second notches 92 orthogonal to the first notch 91 are formed from the sides of the movable member 90 in the boundary between the root portions 93 of the movable member 90 and the magnified coverage portion 94. Hinges 95 are formed in the portion sandwiched between the forward end of the first notch 91 and each of the forward ends of the second notches 92.

In this embodiment, too, the electrode film 38 can be formed by sputtering on each of the upper and lower surfaces of the piezoelectric elements 24. Also, it is possible to not form the electrode film 38 on the upper and lower surfaces of the piezoelectric elements 24 but to connect the members to each other by means of a conductive adhesive.

Figure 38B:
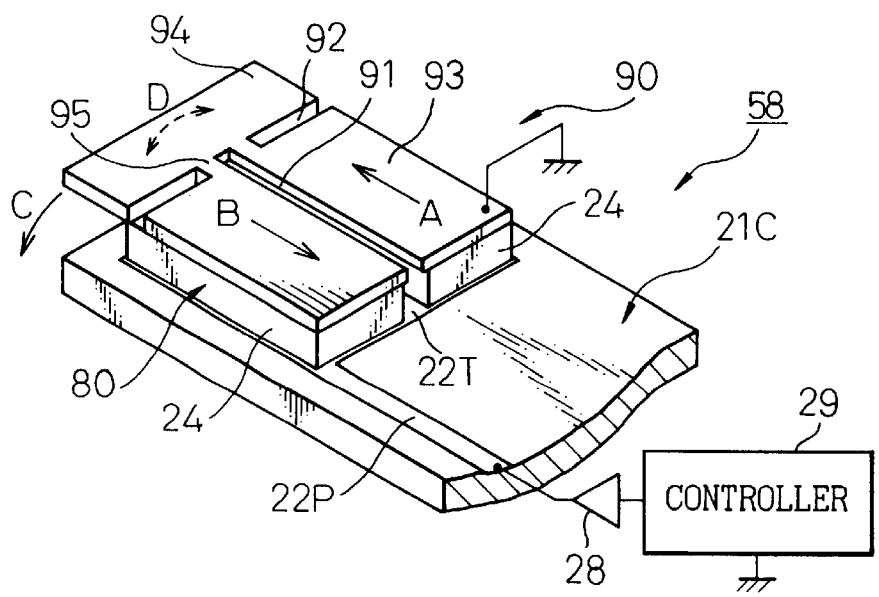
FIG. 38B is a perspective view showing an example operation of the actuator of FIG. 38A after being assembled.

FIG. 38B shows the actuator 58 of FIG. 38A in assembled state. The actuator 58 according to the 18th embodiment is connected to the controller 29 through the amplifier 28 in exactly the same way as in the 15th embodiment. In the actuator according to the 18th embodiment, a drive signal of predetermined polarity output from the controller 29 is amplified by the amplifier 28 so that a predetermined voltage is applied along in the thickness direction of the piezoelectric elements 24. As a result, the two piezoelectric elements 24 are moved in the directions of arrows A and B, respectively, in accordance with the direction of polarization thereof. The distance covered by the magnified coverage portion 94, however, is larger than that of the magnified coverage portion 94 according to the 15th embodiment due to the function of the hinges 95.

In FIG. 38B, a drive signal of either positive or negative polarity is output from the controller 29. When a drive signal of a polarity opposite to that in the above-mentioned case is output from the controller 29, therefore, the actuator 55 is rotated in the direction opposite to that of arrow C. Suppose a member, the operation of which is to be controlled, is mounted on the magnified coverage portion 94 with the portion of the actuator 55 nearer to the fixed member 21C fixed and that a voltage controlled appropriately is applied to the piezoelectric elements 24 of the drive member 80. Then, it is possible to swing or rotate the particular member in the direction of dashed arrow D by a minuscule distance.

The function of the hinges 95 according to the 18th embodiment will be described with reference to FIGS. 44 to 46B.

Figure 44:
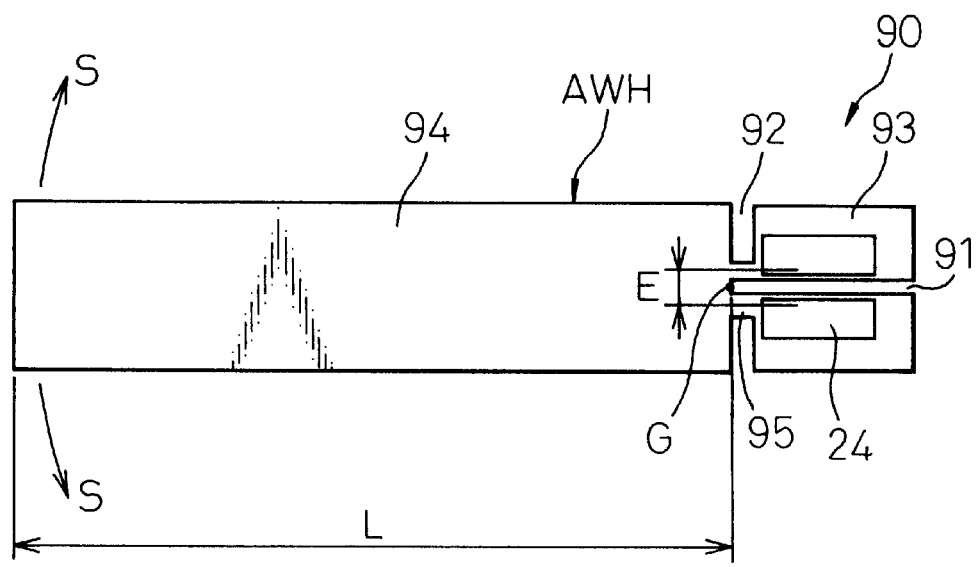
FIG. 44 is a plan view of an actuator comprising a hinge structure according to the invention.
Figure 45:
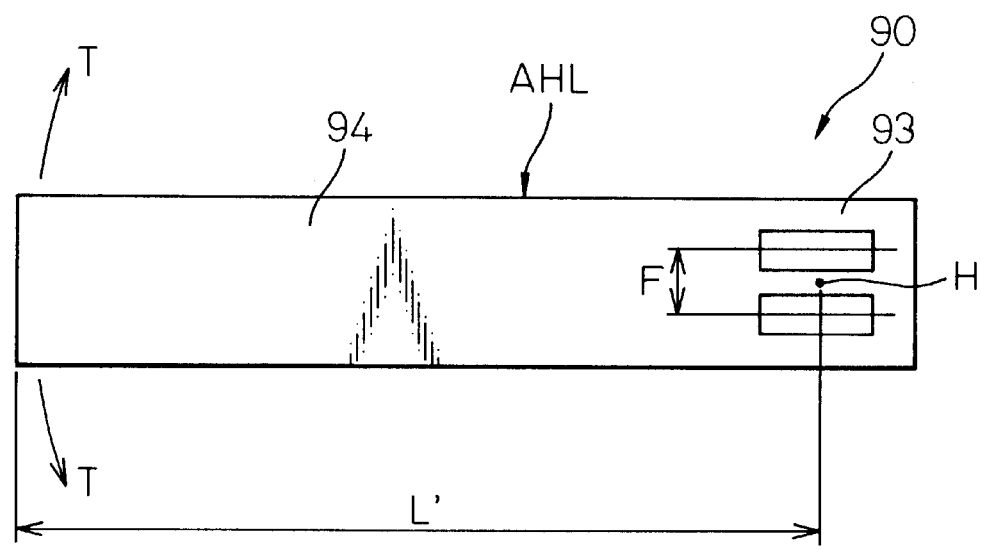
FIG. 45 is a plan view showing an actuator having no hinge structure according to the invention.

FIG. 44 shows an actuator AWH having a hinge structure similar to the actuator 58 of the 18th embodiment. FIG. 45 shows an actuator AHL having no hinge structure. The movable member 90 of the actuator AWH of FIG. 44 is formed with first and second notches 91, 92 and two hinges 95 like that of the 18th embodiment. Piezoelectric elements 24 are arranged on the two root portions 93 separated from each other by the first notch 91. The magnified coverage portion 94 is extended along the axis of the first notch 91, and a head or the like mounted at the forward end of the magnified coverage portion 94. Let E be the distance between the hinges 95 of this actuator AWH. The actuator AHL of FIG. 45, on the other hand, is equivalent to the actuator AWH of FIG. 44 less the first and second notches 91, 92. In this actuator AWH, let F be the center distance of the two piezoelectric elements 24.

The displacement magnification is given as (displacement of actuator)÷(displacement of device proper). In the hinge structure, the displacement magnification is dependent on the width of, and the distance between, the hinges. A larger displacement magnification can be obtained by decreasing the width of the hinges. With the actuator AWH having the hinges 95 formed as shown in FIG. 44, assume that the magnified coverage portion 94 is swung in the directions of arrow S shown in FIG. 44 by displacing the piezoelectric elements 24 as described above. The center of swing is located at a point G where the center line of the first notch 91 crosses the forward end of the first notch 91. In this case, the displacement magnification is approximately expressed as follows.

Displacement magnification=2×(length L of movable member)/ (center distance E of hinges)

On the other hand, assume that no hinge is provided and that the magnified coverage portion 94 is swung in the directions of arrow T in FIG. 45 by displacing the piezoelectric elements 24 as described above. The center of swing is located at a center point H of the area between the two piezoelectric elements 24. In this case, the displacement magnification is approximately given by the following equation.

Displacement magnification=2×(length L' of movable member)/ (center distance F of devices)

The piezoelectric elements 24 constitute the base of the movable member 90, and therefore the center distance F of the piezoelectric elements 24 can be reduced with a certain limitation. The center distance E of the hinges 95, on the other hand, is free of such a limitation. The center distance E of the hinges 95, therefore, can be reduced more than the center distance F of the piezoelectric elements 24. It is thus basically possible to increase the displacement magnification more in the presence of the hinges than in the absence of the hinges.

In the absence of the hinges 95, the linear motion caused by the shearing deformation of the piezoelectric elements 24 is converted to the rotational motion of a rigid member (movable member 90). Thus, a stress blocking the shearing deformation of the two piezoelectric elements 24 is generated between them, resulting in a lower efficiency of converting the deformation of the piezoelectric elements 24 into the deformation of the actuator. In the presence of the hinges 45, on the other hand, the stress blocking the shearing deformation of the piezoelectric elements 24 acts only on the hinges 45, and therefore the displacement of the piezoelectric elements 24 is reasonably reflected in the displacement of the movable member.

For these reasons, the provision of the hinges 45 can increase the displacement of the movable member 90.

Figure 46A:
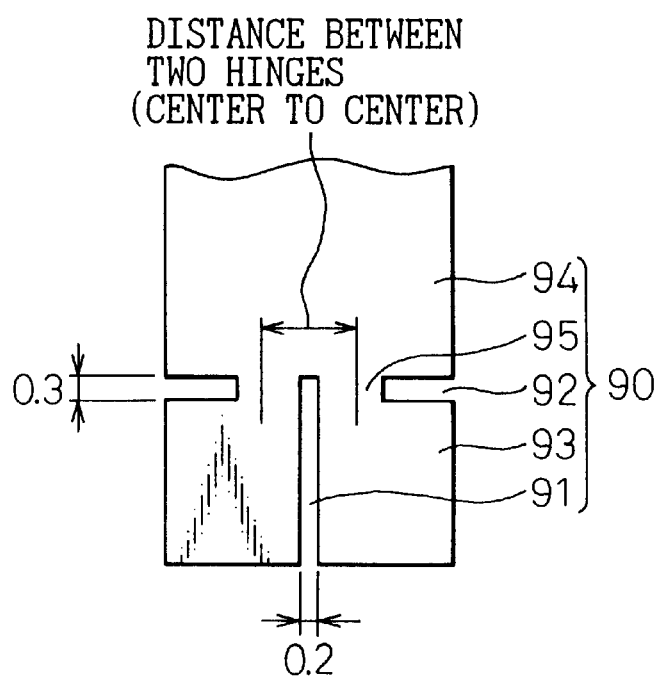
FIG. 46A is a partial plan view showing an example configuration of the hinge structure of an actuator according to the invention.
Figure 46B:
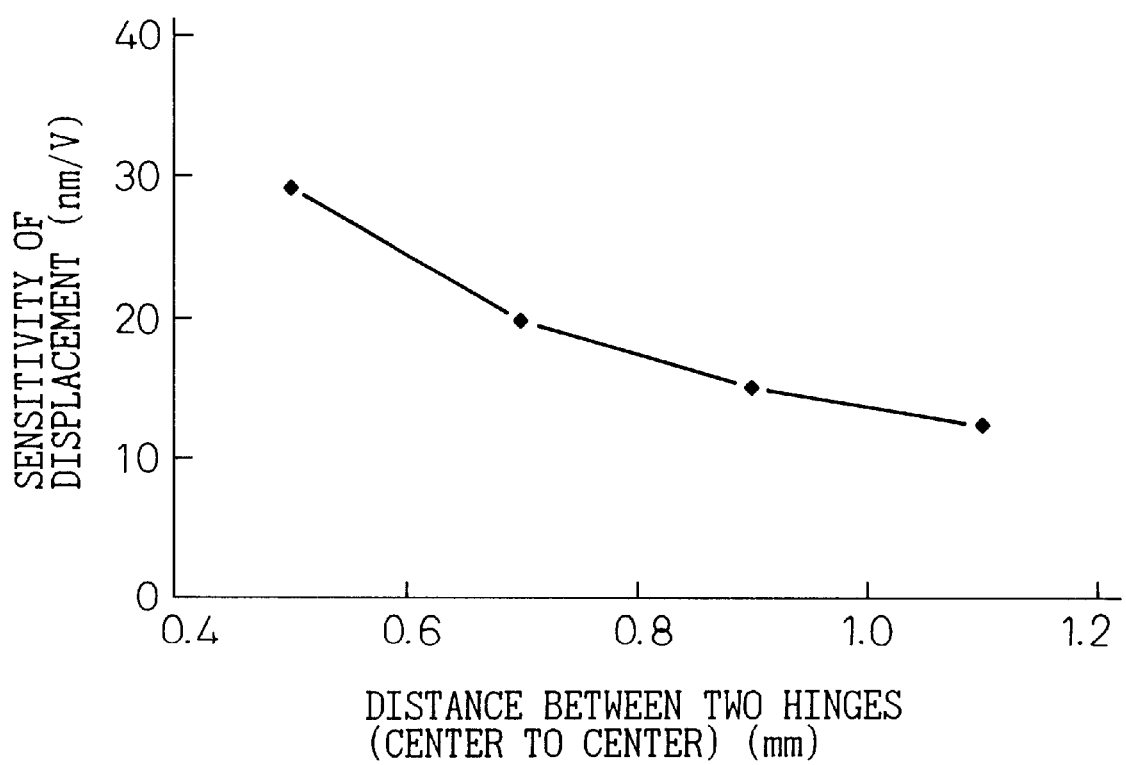
FIG. 46B is a diagram showing the relation between the center distance and the displacement sensitivity of the hinge structure of FIG. 46A.

FIG. 46B shows the result of analyzing, by the finite element method, the relationship between the center distance of the hinges 45 and the displacement constant (displacement per unit voltage) in the case where the first notch 41 and the second notches 42 constituting the hinges 45 of the actuator 58 according to the 18th embodiment of the invention shown in FIG. 46A have gaps of 0.2 mm and 0.3 mm, respectively. It is seen from this diagram that the smaller the center distance of the hinges 4, the higher the displacement constant. In the absence of hinges, on the other hand, the displacement constant of the movable member 90 in FIG. 45 is about 5 nm/V. This compares with the displacement constant of the movable member 90 having hinges which is at least six times as high as that having no hinges.

As described above, the provision of the hinges 45 on the movable member 90, like the multilayered structure of the piezoelectric elements 24, can increase the displacement of a piezoelectric actuator using the shearing effect.

Figure 39A:
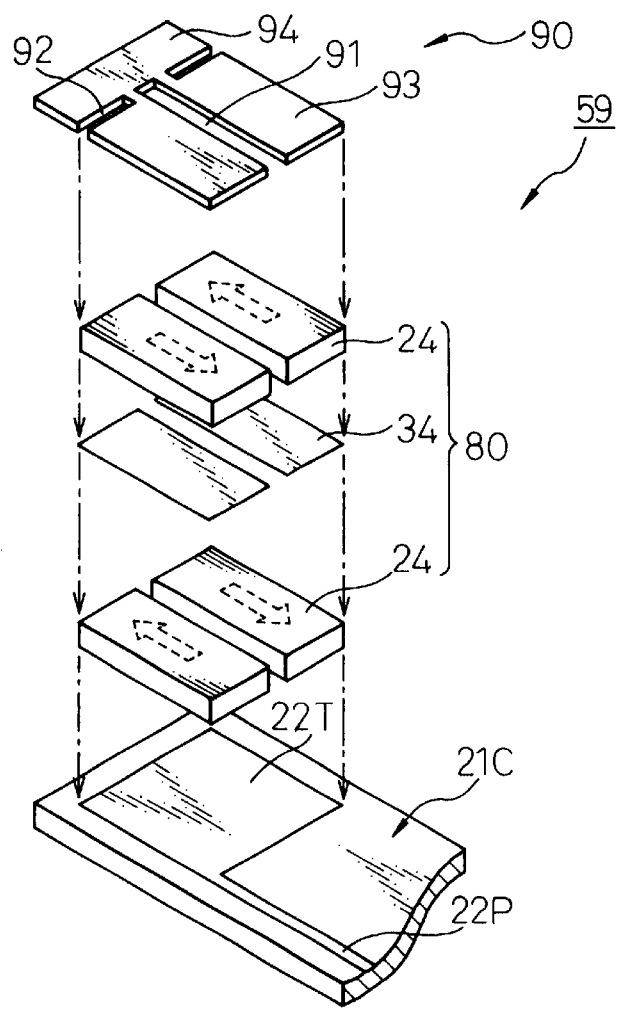
FIG. 39A is a perspective view showing a configuration of an actuator using a shear-type piezoelectric element according to a 19th embodiment of the invention in assembled state.

FIG. 39A is a perspective view showing a configuration of an actuator 59 using shear-type piezoelectric elements according to a 19th embodiment of the invention. The actuator 59 using the shear-type piezoelectric elements according to the 19th embodiment is a modification of the actuator 56 using the shear-type piezoelectric elements according to the 16th embodiment.

As shown in FIG. 39A, the actuator 59 according to the 19th embodiment is different from the actuator 56 according to the 16th embodiment only in that second notches 92 crossing at right angles to a first notch 91 are formed from the two sides of the movable member 90 in the boundary between the root portions 93 and the magnified coverage portion 94 of the movable member 90. Hinges 95 are formed in the portion sandwiched between the forward end of the first notch 91 and the forward end of each of the second notches 92.

In this embodiment, too, the electrode film 38 can be formed, by sputtering, on each of the upper and lower surfaces of the piezoelectric elements 24. Also, it is possible to not form the electrode film 38 on the upper and lower surfaces of the piezoelectric elements 24 but to connect the members to each other with a conductive adhesive.

Figure 39B:
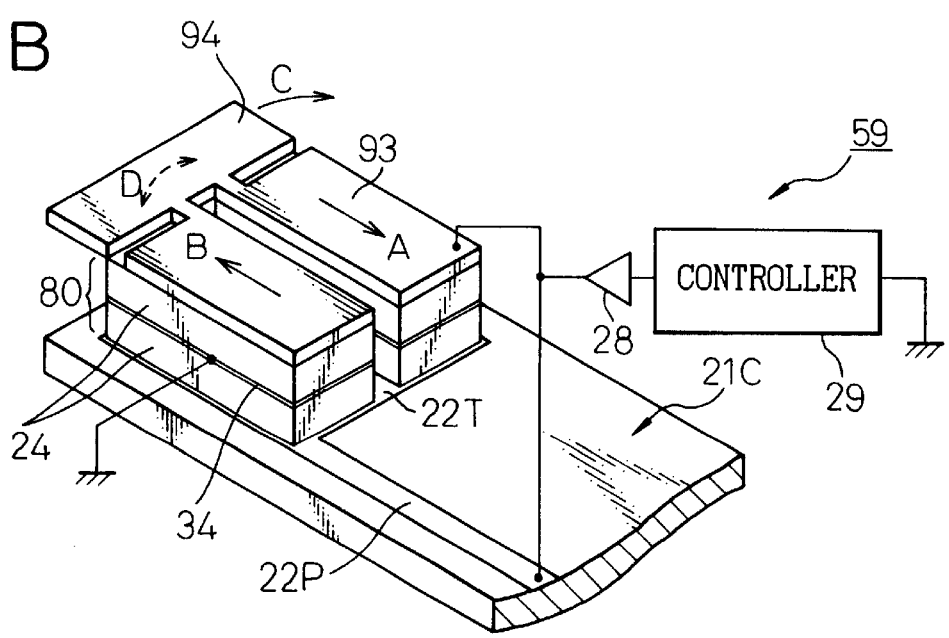
FIG. 39B is a perspective view showing an example operation of the actuator of FIG. 39A after being assembled.

FIG. 39B shows an actuator 59 of FIG. 39A in assembled state. According to the 19th embodiment, the actuator 59 is connected to the controller 29 through the amplifier 28 in exactly the same manner as in the 16th embodiment. With the actuator 59 according to the 19th embodiment, on the other hand, a drive signal of predetermined polarity output from the controller 29 is amplified by the amplifier 28 so that a predetermined voltage is applied in the direction along the thickness of the piezoelectric elements 24. As a result, the two piezoelectric elements 24 are moved in the directions of arrows A, B, respectively, in accordance with the direction of polarization thereof. The distance covered by the magnified coverage portion 94 along the direction of arrow C, however, is larger than that covered by the magnified coverage portion 94 in the direction of arrow C in the 16th embodiment, due to the action of the hinges 95 as described above.

Figure 40A:
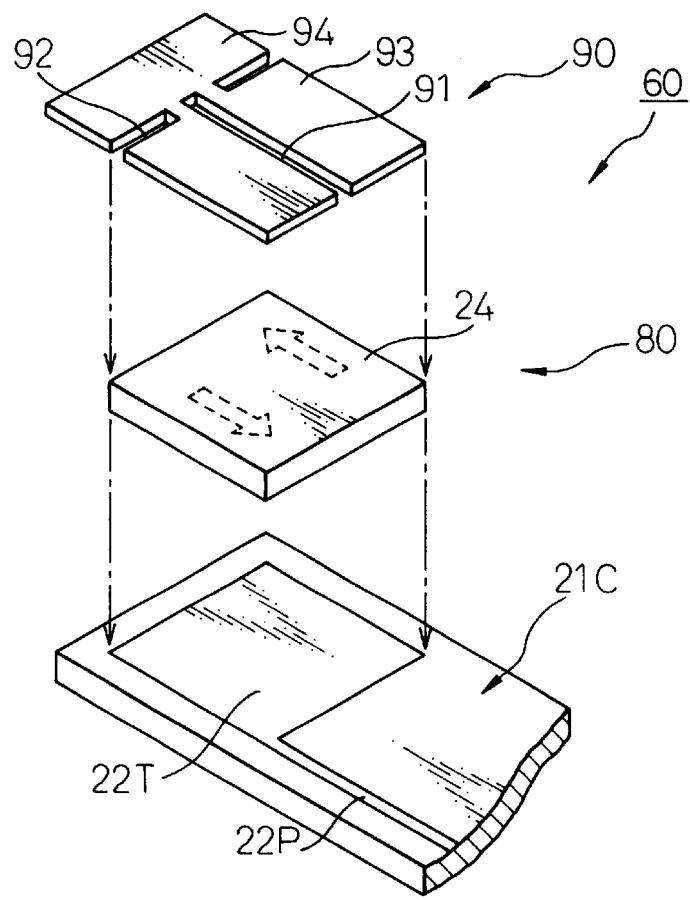
FIG. 40A is a perspective view showing a configuration of an actuator using a shear-type piezoelectric element according to a 20th embodiment of the invention in assembled state.

FIG. 40A is a perspective view showing a configuration of an actuator 60 using the shear-type piezoelectric elements in an assembled state according to a 20th embodiment of the invention. The actuator 60 according to the 20th embodiment is a modification of the actuator 57 according to the 17th embodiment.

As shown in FIG. 40A, the actuator 60 according to the 20th embodiment is different from the actuator 57 according to the 17th embodiment only in that the second notches 92 crossing at right angles to the first notch 92 are formed from the two sides of the movable member 90 in the boundary between the root portions 93 and the magnified coverage portion 94 of the movable member 90. The hinges 95 are formed at the portion sandwiched between the forward end of the first notch 91 and the forward end of each the second notches 92.

In this embodiment, too, the electrode film 38 can be formed by sputtering on each of the upper and lower surfaces of the piezoelectric elements 24. Also, it is possible to not form the electrode film 38 on each of the upper and lower surfaces of the piezoelectric elements 24 but to connect the members to each other by means of a conductive adhesive.

Figure 40B:
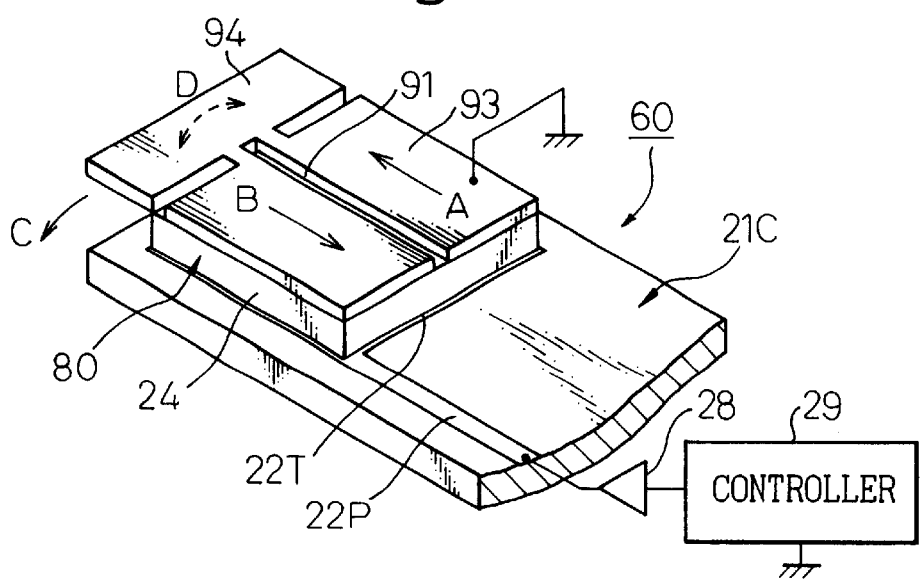
FIG. 40B is a perspective view showing an example operation of the actuator of FIG. 40A after being assembled.

FIG. 40B shows the actuator 60 of FIG. 40A in an assembled state. The actuator 60 according to the 20th embodiment is connected to the controller 29 through the amplifier 28 in exactly the same manner as the actuator of the 17th embodiment. With the actuator 60 according to the 20th embodiment, a drive signal of predetermined polarity output from the controller 29 is amplified by the amplifier 28 so that a predetermined voltage is applied in the direction along the thickness of the piezoelectric elements 24. As a result, the piezoelectric elements 24 are moved in the directions of arrows A, B, respectively, in accordance with the direction of polarization thereof. The distance covered by the magnified coverage portion 94 in the direction of arrow C according to this embodiment, however, is larger than the distance covered by the magnified coverage portion 94 in the direction of arrow C according to the 17th embodiment.

FIG. 41 shows another embodiment of the structure of the hinges 95 of the movable member 90 used for the actuators 58 to 60 according to the 18th to 20th embodiments of the invention. Unlike in the above-mentioned embodiments in which the first notch 91 is I-shaped, the first notch 91 has a T-shaped forward end according to this embodiment. In this way, the first notch 91 is not limited to I-shape.

Figure 42A:
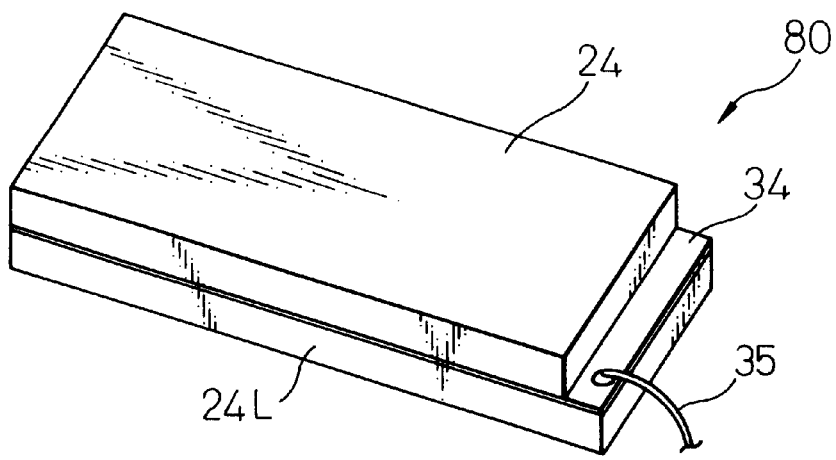
FIG. 42A is a perspective view showing a configuration of a shear-type piezoelectric element alone of the actuator according to a 21st embodiment of the invention.
Figure 42B:
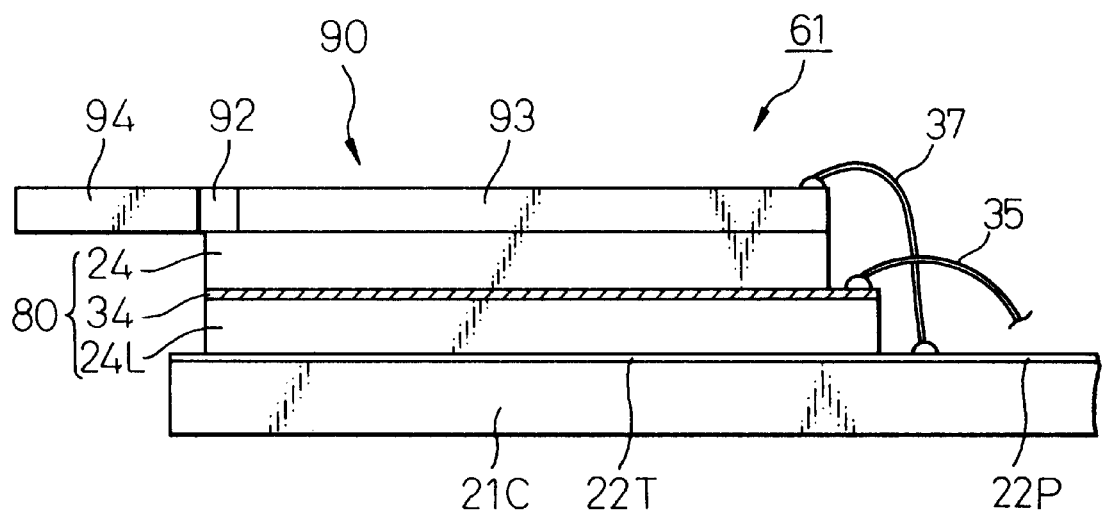
FIG. 42B is a side view showing a configuration of an actuator using the piezoelectric element of FIG. 42A.

FIGS. 42A, 42B show a configuration of the actuator 61 according to a 21st embodiment of the invention using the shear-type piezoelectric elements. FIG. 42A shows a configuration of the drive member 80 alone. FIG. 42B is a side view showing a configuration of the actuator 61 using the drive member 80 of FIG. 42A.

As shown in FIG. 42A, according to the 21st embodiment, the drive member 80 includes a piezoelectric element 24 of normal length and a piezoelectric element 24L slightly longer than the piezoelectric element 24. With the drive member 80 according to this embodiment, the piezoelectric elements 24, 24L are arranged one on the other with one end each thereof aligned. Consequently, the other end of the piezoelectric element 24L is protruded beyond the other end of the piezoelectric element 24 at the other end of the drive member 80. The conductive layer 34 sandwiched between the piezoelectric element 24 and the piezoelectric element 24L is deposited to the longer piezoelectric element 24L. The conductive layer 34 is thus exposed from the other end of the drive member 80. According to the 21st embodiment, the exposed portion of the conductive layer 34 is used as an electrode for connecting a lead wire 35.

As shown in FIG. 42B, therefore, the actuator 61 according to the 21st embodiment with the drive member 80 arranged on the fixed member 21C facilitates the connection between the conductive layer 34 and the lead wire 35. Numeral 37 designates a lead wire for connecting the movable member 90 and the fixed member 21C.

Figure 43A:
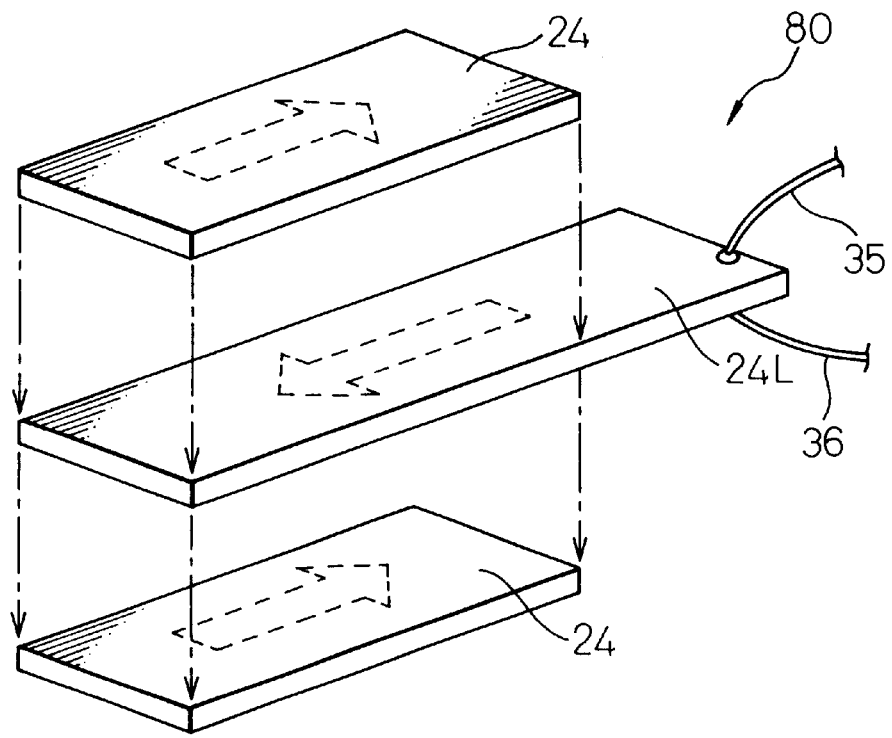
FIG. 43A is a perspective view showing a configuration of a shear-type piezoelectric element alone used with an actuator in assembled state according to a 22nd embodiment of the invention.
Figure 43B:
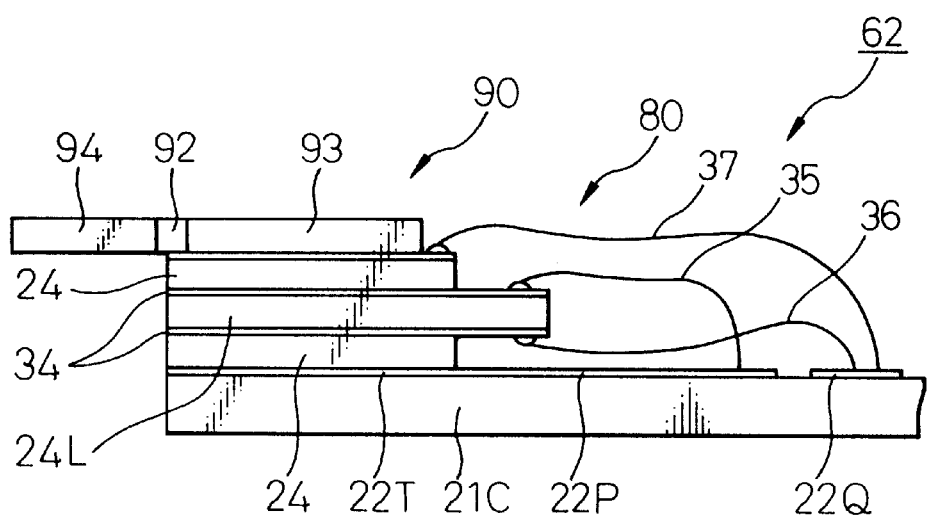
FIG. 43B is a side view showing a configuration of an actuator using the piezoelectric element of FIG. 43A.

FIGS. 43A, 43B show a configuration of an actuator 62 using the shear-type piezoelectric elements according to a 22nd embodiment of the invention. FIG. 43A shows a configuration of the drive member 80 alone, and FIG. 43B is a side view showing a configuration of the actuator 62 using the drive member 80 of FIG. 43A.

As shown in FIG. 43A, the drive member 80 according to the 22nd embodiment includes two piezoelectric elements 24 of normal length and a piezoelectric element 24L slightly longer than the piezoelectric elements 24. Also with the drive member 80 according to this embodiment, the piezoelectric element 24L is sandwiched between the two piezoelectric elements 24, and all the three piezoelectric elements are each deposited with an end thereof in alignment. At the other end of the drive member 80, therefore, the other end of the piezoelectric element 24L is protruded from the other end each of the two piezoelectric elements 24. The conductive layers 34 sandwiched between the piezoelectric elements 24 and the piezoelectric element 24L are formed in registry with the longer piezoelectric element 24L. Consequently, the conductive layers 34 are exposed on the two sides of the piezoelectric element 24 at the other end of the drive member 80. According to the 22nd embodiment, the exposed portions of the conductive layers 34 are used as electrodes to connect the lead wires 35, 36.

As a result, as shown in FIG. 43B, with the actuator 62 according to the 22nd embodiment, fabricated by arranging the drive member 80 on the fixed member 21C, the conductive layers 34 and the lead wires 35, 36 can be easily connected to each other. In FIG. 43B, 22Q designates a grounding lead pattern arranged on the fixed member 21C. This lead pattern 22Q is also connected with a lead wire 37.

Also in both the 21st and 22nd embodiments, the electrode film 38 can be formed by sputtering on each of the upper and lower surfaces of the piezoelectric elements 24. Also, it is possible to not form the electrode film 38 on each of the upper and lower surfaces of the piezoelectric elements 24 but to connect the members to each other by means of a conductive adhesive.

Figure 47A:
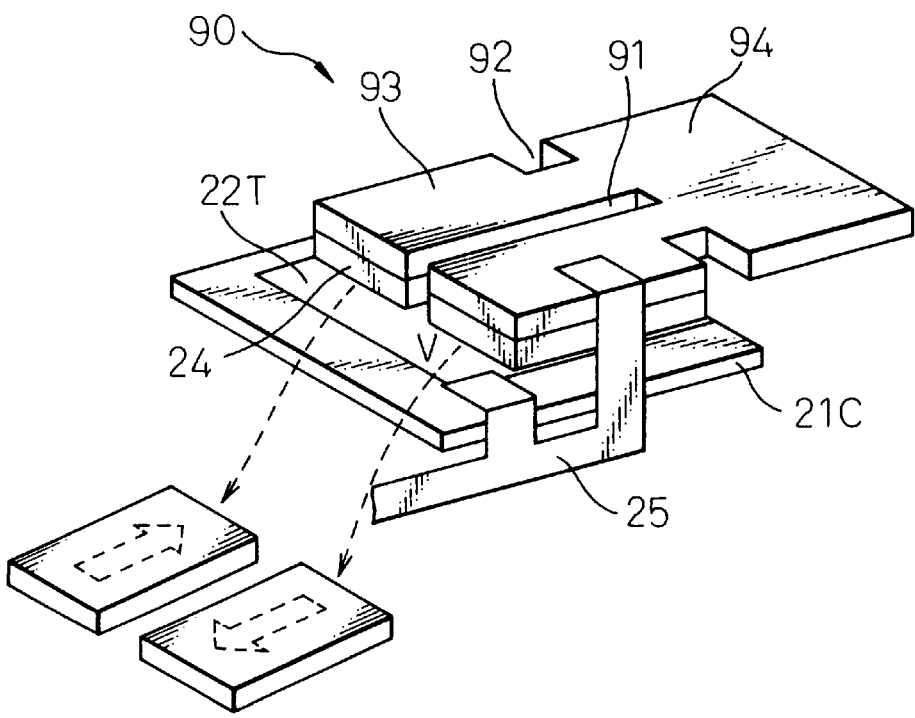
FIG. 47A is a perspective view showing an example wiring structure of the lead wire connected to the electrodes of an actuator according to the invention.
Figure 47B:
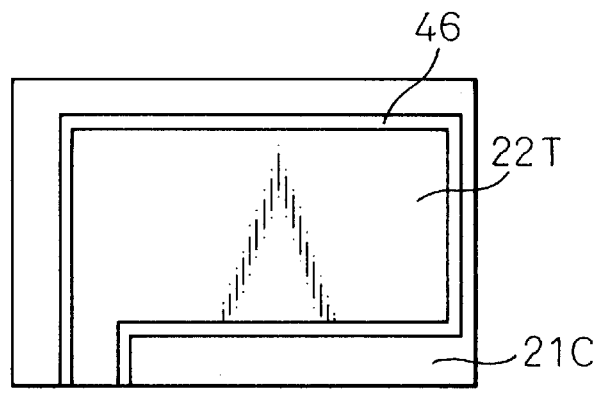
FIG. 47B is a plan view showing a configuration of the baseboard in FIG. 47A.

FIG. 47A shows another example of the structure for wiring to the electrodes of the actuator according to this embodiment. In the above-mentioned embodiments, a lead pattern is formed on the fixed member 21C, so that the electrodes of the piezoelectric elements 24, 24L and the lead pattern on the fixed member 21C and the movable member 90 are connected by the lead wires 35, 36 for application of a voltage to the piezoelectric elements. With this embodiment, on the other hand, a voltage is applied to the piezoelectric elements 24 by means of a FPC (flexible printed circuit) 45. FIG. 47B shows the structure of the electrode 22T on the fixed member 21C in the case where the fixed member 21C is a conductor in FIG. 47A. In this case, an insulating layer 46 is formed on the fixed member 21C, and the electrode 22T is formed on the insulating layer 46.

Figure 48:
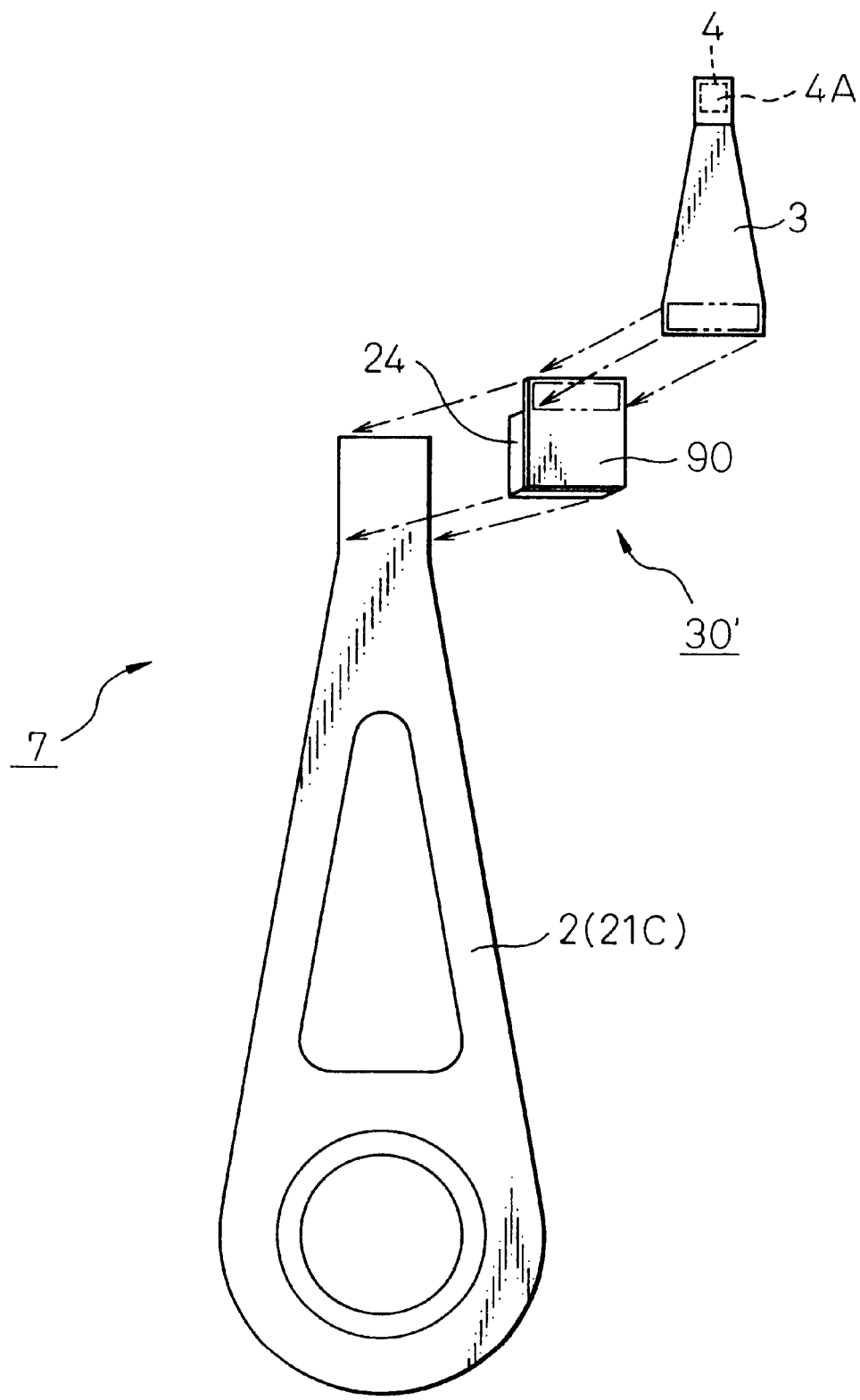
FIG. 48 is a diagram for assembling a head actuator having a head-positioning mechanism using an actuator according to the invention.

FIG. 48 shows a basic configuration of a head-positioning mechanism 30' in a first application comprising any one of the actuators 51 to 62 according to the 11th to 22nd embodiments of the invention interposed between the forward end of the access arm 2 of the head actuator 7 and the support spring 3 having the head 4. With the head-positioning mechanism 30 comprising any one of the actuators 51 to 62 according to the 11th to 22nd embodiments, the fixed member 21C is configured as the access arm 2 of the head actuator 7. Also, the base of the support spring 3, with a head slider 4A mounted at the forward end thereof, is arranged on the movable member 90.

Figure 49:
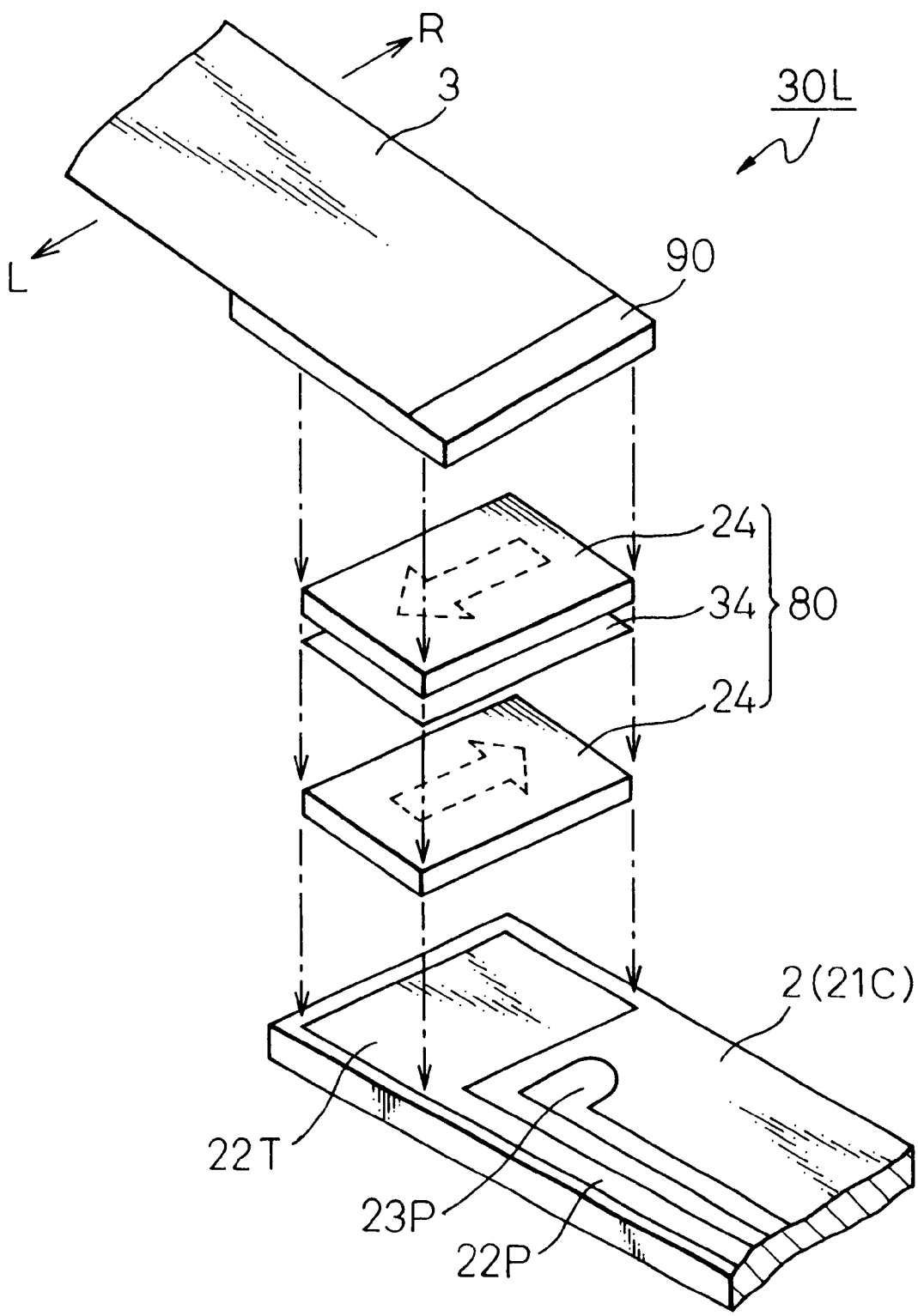
FIG. 49 is a perspective view showing a configuration of the head-positioning mechanism in an assembled state according to the 11th embodiment of a first application using the actuator of the 11th embodiment of the invention.

FIG. 49 shows a configuration of the head-positioning mechanism 30L according to the 11th embodiment of the first application comprising the actuator 51 according to the 11th embodiment of the invention. With the head-positioning mechanism 30L according to this embodiment, an electrode 22T connected to the whole bottom surface of the drive member 80 and lead patterns 22P, 23P are formed at the forward end of the access arm 2 (fixed member 21C). The drive member 80 including two piezoelectric elements 24 with a conductive layer 34 inserted therebetween is arranged on the electrode 22T, and the movable member 90 with the base of the support spring 3 mounted thereon by welding or the like means is arranged on the drive member 80. The movable member 90 is connected to the lead pattern 23P by a lead wire not shown. With the head-positioning mechanism 30L according to this embodiment, when a voltage is applied between the lead patterns 22P, 23P, the support spring 3 is urged to finely move in the directions R, L in the diagram.

Figure 50A:
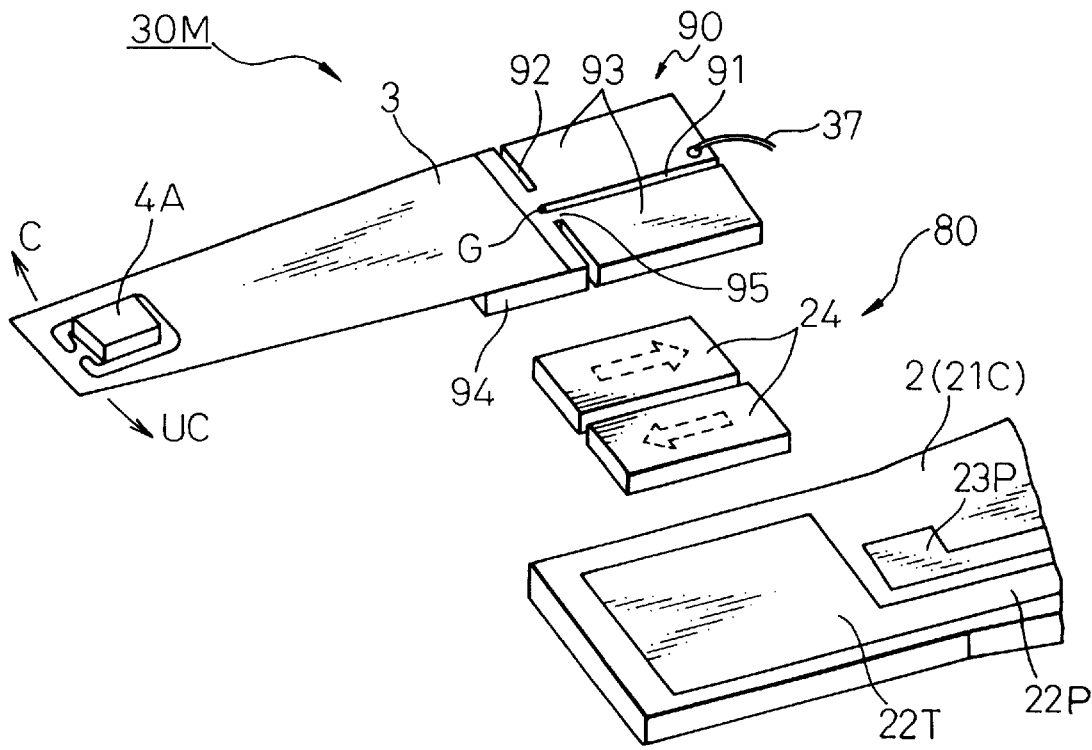
FIG. 50A is a perspective view showing a configuration of a head-positioning mechanism in assembled state of the 12th embodiment according to the first application using the actuator of the 18th embodiment of the invention.

FIG. 50A shows a configuration of the head-positioning mechanism 30M according to a 12th embodiment of the first application comprising the actuator 58 according to the 18th embodiment of the invention. In the head-positioning mechanism 30M according to this embodiment, an electrode 22T connected to the whole bottom surface of the drive member 80 and lead patterns 22P, 23P are formed at the forward end of the access arm 2 (fixed member 21C). The two piezoelectric elements 24 are arranged substantially in parallel on the electrode 22T, and the movable member 90 is arranged on the piezoelectric elements 24. The movable member 90 includes two root portions 93 separated from each other by a first notch 91 and arranged on the two piezoelectric elements 24, respectively, and a magnified coverage portion 94 connected to the root portions 93 by hinges 95. The base of the support spring 3 is mounted by welding or the like means on the magnified coverage portion 94. The movable member 90 is connected to the lead pattern 23P by the lead wire 37. With the head-positioning mechanism 30M according to this embodiment, upon application of a voltage between the lead patterns 22P, 23P, the support spring 3 is swung by a minuscule angle in the directions C, UC about a point located G between the two hinges 95. The movable member 90 is desirably grounded.

Figure 50B:
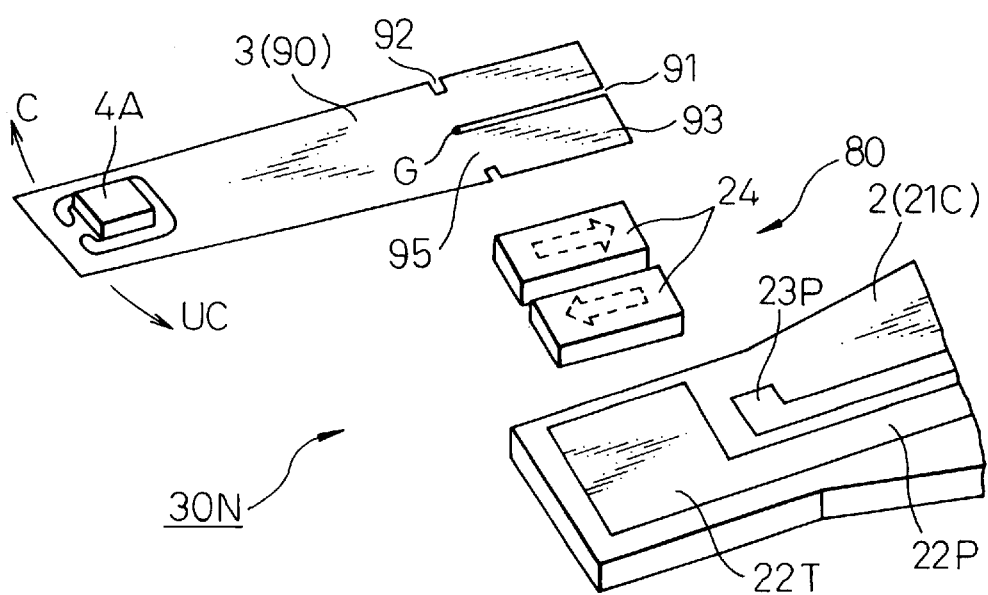
FIG. 50B is a perspective view showing a configuration of a head-positioning mechanism using an actuator in assembled state according to a modification of the 18th embodiment of the invention.

FIG. 50B shows a modification of the head-positioning mechanism 30M according to the embodiment described with reference to FIG. 50A. The difference of the embodiment shown in FIG. 50B from that of FIG. 50A lies only in that the movable member 90 constitutes the spring 3 at the same time. The base of the support spring 3 separated into two root portions 93 by the hinges 95 sandwiched between the first and second notches 91, 92 is arranged on the piezoelectric elements 24, respectively, of the drive member 80. The operation of the head-positioning mechanism 30N according to this modification is exactly the same as that of the head-positioning mechanism 30M shown in FIG. 50A.

FIG. 51 shows a configuration of another modification of the head-positioning mechanism 30M shown in FIG. 50A. The difference of the head-positioning mechanism 30P of FIG. 51 from the head-positioning mechanism 30M of FIG. 50A lies only in the shape of the electrodes on the access arm 2 and the direction of polarization of the piezoelectric elements 24. According to the embodiment of FIG. 50A, an electrode 22T connected to the whole bottom surface of the drive member 80 and lead patterns 22P, 23P are formed at the forward end of the access arm 2 (fixed member 21C). The two piezoelectric elements 24 polarized in opposite directions are arranged substantially in parallel to each other on the electrode 22T, and the movable member 90 is arranged on the piezoelectric elements 24. The root portions 93 of the movable member 90 separated from each other by the first notch 91 are connected to the lead pattern 23P by a lead wire 37.

In the embodiment shown in FIG. 51, on the other hand, the two electrodes 22, 23 connected to the piezoelectric elements 24 of the drive member 80 are formed substantially in parallel to each other at the forward end of the access arm 2 (fixed member 21C). The two piezoelectric elements 24 polarized in the same direction are arranged on the electrodes 22, 23, respectively. The conductive movable member 90 is arranged on the two piezoelectric elements 24. With the head-positioning mechanism 30P according to this embodiment, however, upon application of a voltage between the lead patterns 22, 23 connected to the electrodes 22, 23, respectively, the support spring 3 is swung by a minuscule angle in the directions C, UC in the diagram about a point G located between the two hinges 95. This embodiment requires no lead wire.

Figure 52:
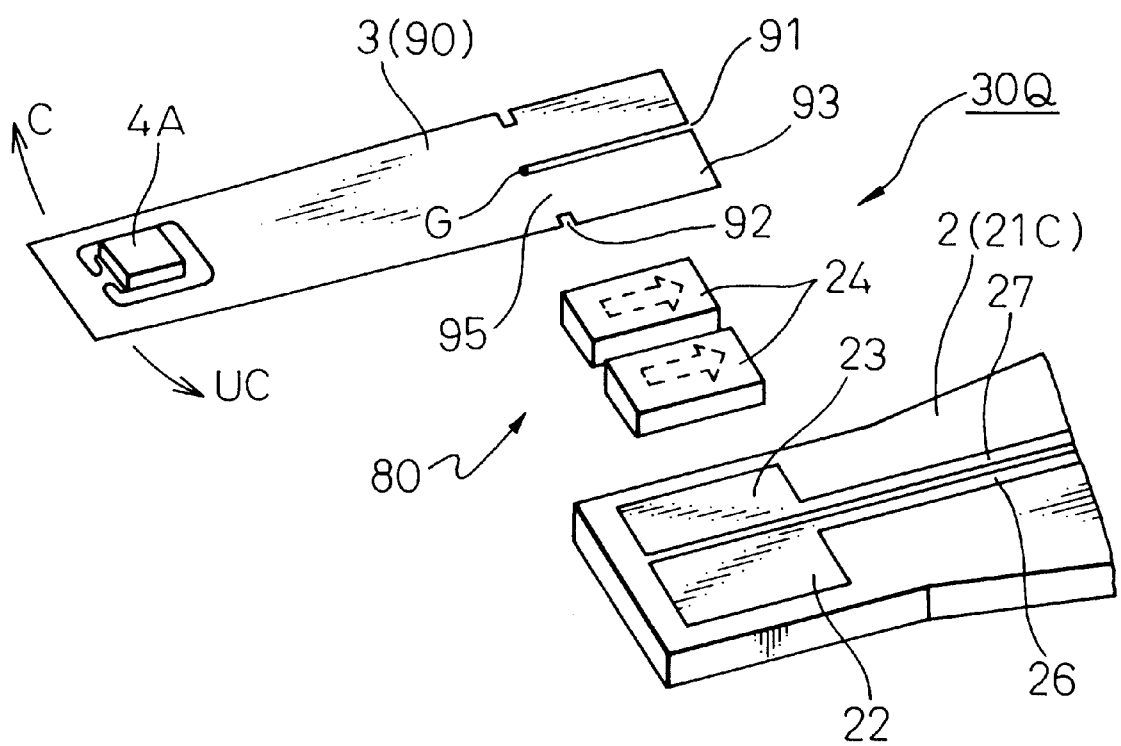
FIG. 52 is a perspective view showing a configuration according to a modification of the head-positioning mechanism in assembled state of FIG. 51.

FIG. 52 shows the configuration of a head-positioning mechanism 30Q constituting a modification of the head-positioning mechanism 30P according to the embodiment described with reference to FIG. 51. The embodiment shown in FIG. 52 is different from that of FIG. 51 only in that the movable member 90 constitutes the support spring 3. The root portions constituting the base 93 of the support spring 3 separated from each other by the hinges 95 sandwiched between the first and second notches 91, 92 are arranged on the piezoelectric elements 94, respectively, of the drive member 80. The operation of the head-positioning mechanism 30Q according to this modification is exactly identical to that of the head-positioning mechanism 30P shown in FIG. 51.

Figure 53:
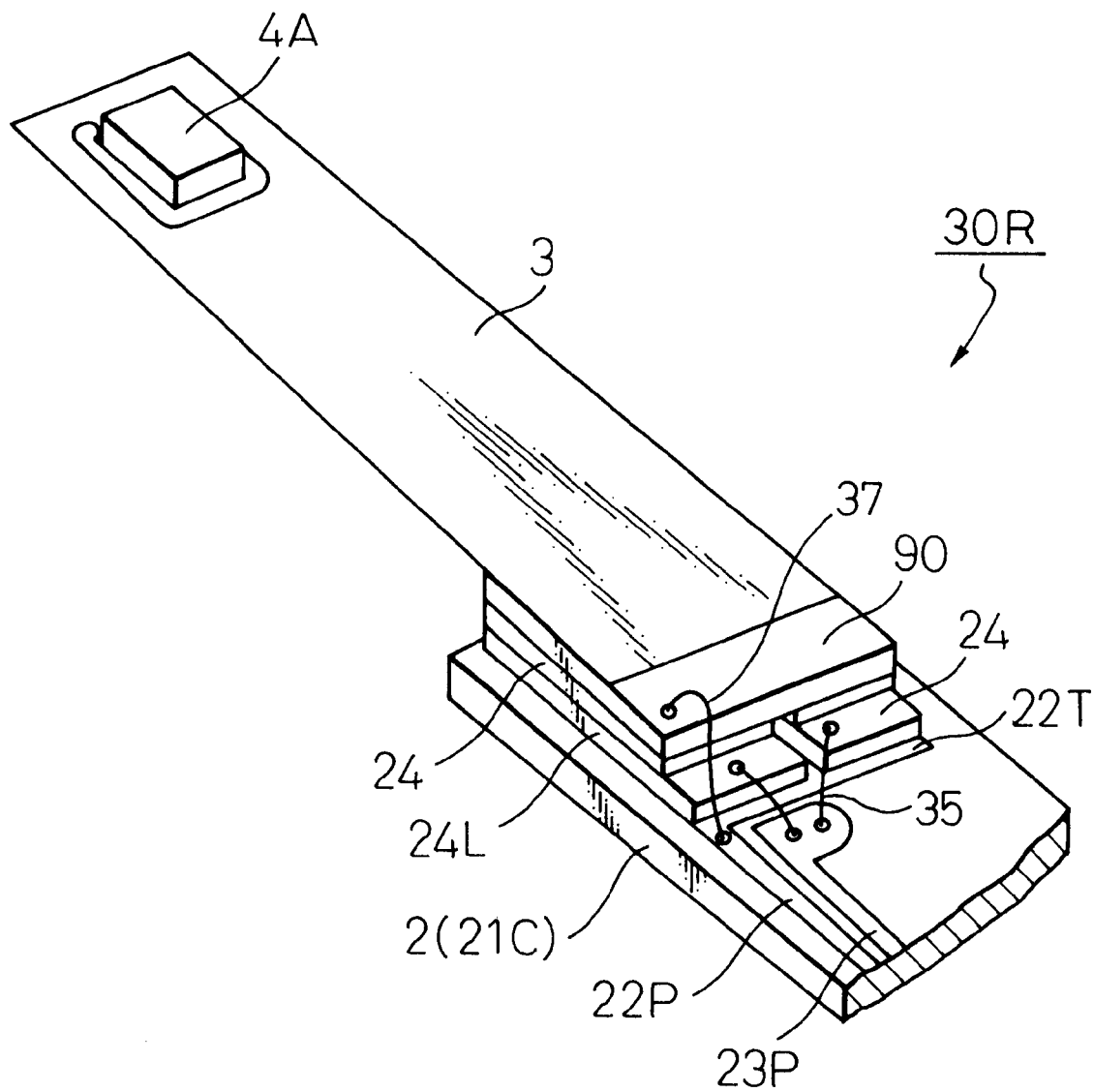
FIG. 53 is a perspective view showing a configuration of a head-positioning mechanism according to the 13th embodiment of the first application using the actuator according to the 21st embodiment of the invention.

FIG. 53 shows the configuration of a head-positioning mechanism 30R according to a 13th embodiment of the first application comprising an actuator 61 according to the 21st embodiment of the invention.

With the actuator 61 according to the 21st embodiment, the drive member 80 includes a piezoelectric element 24 of normal length and a piezoelectric element 24L slightly longer than the piezoelectric element 24, as described above. An end of the piezoelectric element 24L is protruded from the other end of the piezoelectric element 24. The base of the support spring 3 with a head slider 4A mounted at the forward end thereof is fixed on the movable member 90. The conductive layer 34 sandwiched between the piezoelectric element 24 and the piezoelectric element 24L is exposed on an end of the piezoelectric element 24L. Consequently, the exposed portion of the conductive layer 34 can be used as an electrode for connecting the lead wire 35. In the head-positioning mechanism 30R according to this embodiment, therefore, the conductive layer 34 and the lead wire 35 can be easily connected to each other.

What is claimed is:

1. An actuator using at least one piezoelectric element, comprising:
    a shear-type piezoelectric element, said shear-type piezoelectric element defining a fixed end on one side thereof and a free end on an opposite side thereof;
    two electrodes arranged in juxtaposition to each other within a single plane at said fixed end of said shear-type piezoelectric element;
    an opposed electrode arranged on said free end of said shear-type piezoelectric element, whereby said opposed electrode is in opposed relationship to said two electrodes;
    wherein said opposed electrode is displaced in accordance with the direction of polarization of said shear-type piezoelectric element by supplying power between said two electrodes by applying a first voltage to one said two electrodes and a second voltage to the other of said two electrodes, where there is a voltage differential between said first voltage and said second voltage; and
    further wherein said shear-type piezoelectric element is polarized in a direction that is substantially parallel to said single plane within which said two electrodes are juxtaposed.

2. An actuator according to claim 1,
    wherein said shear-type piezoelectric element is segmented into two independent portions laid on said two electrodes, respectively.

3. In a disk drive comprising at least a recording disk, a head arranged on each of a plurality of information recording surfaces of said recording disk for reading and writing information and a head actuator for moving said head in a radial direction of said recording disk in order to position said head on the desired recording track on said recording disk,
    a head positioning mechanism using an actuator according to claim 5 with a part of said head actuator for moving said head by a small distance independently of the motion of said head actuator, wherein:
        said two electrodes of said actuator are arranged at a forward end of said head actuator; and
        a base of a support spring of said head actuator is mounted on said opposed electrode of said actuator.

4. In a disk drive comprising at least a recording disk, a head arranged on each of a plurality of information recording surfaces of said recording disk for reading and writing information and a head actuator for moving said head in a radial direction of said recording disk in order to position said head on the desired recording track on said recording disk,
    a head-positioning mechanism using an actuator according to claim 1 with a part of said head actuator for moving said head by a small distance independently of the motion of said head actuator, wherein:
        said two electrodes of said actuator are arranged at a forward end of said head actuator; and
        a base of a support spring of said head actuator is mounted on said opposed electrode of said actuator.

5. A head-positioning mechanism according to claim 4,
    wherein a plane for dividing said two electrodes is arranged longitudinally of an arm.

6. A head-positioning mechanism according to claim 4,
    wherein a plane for dividing said two electrodes is arranged in the direction perpendicular to the longitudinal direction of an arm.

7. An actuator using at least a piezoelectric element, comprising:
    two electrodes arranged in juxtaposition at a fixed end;
    a shear-type piezoelectric element laid over said two electrodes; and
    an opposed electrode arranged on the surface at a free end of said shear-type piezoelectric element in opposed relationship to said two electrodes;
    wherein said opposed electrode is displaced in the plane thereof in accordance with the direction of polarization of said shear-type piezoelectric element by supplying power between said two electrodes; and
    further wherein said shear-type piezoelectric element is polarized in the direction parallel to the direction in which said two electrodes are juxtaposed, and wherein said opposed electrode is displaced in such a direction as to rotate about the central portion of said shear-type piezoelectric element by supplying a current to said two electrodes.

8. In a disk drive comprising at least a recording disk, a head arranged on each of a plurality of information recording surfaces of said recording disk for reading and writing information and a head actuator for moving said head in a radial direction of said recording disk in order to position said head on the desired recording track on said recording disk,
    a head positioning mechanism using an actuator according to claim 2 with a part of said head actuator for moving said head by a small distance independently of the motion of said head actuator, wherein:
        said two electrodes of said actuator are arranged at a forward end of said head actuator; and
        a base of a support spring of said head actuator is mounted on said opposed electrode of said actuator.

9. An actuator using at least a piezoelectric element, comprising:
    two electrodes arranged in juxtaposition at a fixed end;
    a shear-type piezoelectric element laid over said two electrodes; and
    an opposed electrode arranged on the surface at a free end of said shear-type piezoelectric element in opposed relationship to said two electrodes;
    wherein said opposed electrode is displaced in the plane thereof in accordance with the direction of polarization of said shear-type piezoelectric element by supplying power between said two electrodes by applying a first voltage to one of said two electrodes and a second voltage to the other of said two electrodes, where there is a voltage differential between said first voltage and said second voltage; and further wherein said shear-type piezoelectric element is polarized in the direction parallel to the direction in which said two electrodes are juxtaposed, wherein said shear-type piezoelectric element has two portions thereof polarized in opposite directions to each other on said two electrodes, and wherein said opposed electrode is displaced to proceed in the direction parallel to the directions of polarization of said shear-type piezoelectric element by supplying a current to said two electrodes.

10. In a disk drive comprising at least a recording disk, a head arranged on each of a plurality of information recording surfaces of said recording disk for reading and writing information and a head actuator for moving said head in a radial direction of said recording disk in order to position said head on the desired recording track on said recording disk, a head positioning mechanism using an actuator according to claim 3 with a part of said head actuator for moving said head by a small distance independently of the motion of said head actuator, wherein:
said two electrodes of said actuator are arranged at a forward end of said head actuator; and
a base of a support spring of said head actuator is mounted on said opposed electrode of said actuator.

11. An actuator using at least a piezoelectric element, comprising:

two electrodes arranged in juxtaposition at a fixed end;
a shear-type piezoelectric element laid over said two electrodes; and
an opposed electrode arranged on the surface at a free end of said shear-type piezoelectric element in opposed relationship to said two electrodes;
wherein said opposed electrode is displaced in the plane thereof in accordance with the direction of polarization of said shear-type piezoelectric element by supplying power between said two electrodes by applying a first voltage to one of said two electrodes and a second voltage to the other of said two electrodes, where there is a voltage differential between said first voltage and said second voltage; and
further wherein said shear-type piezoelectric element is polarized in the direction perpendicular to the direction in which said two electrodes are juxtaposed, wherein said shear-type piezoelectric element has two portions thereof polarized in opposite directions to each other on said two electrodes, and wherein said two electrodes are displaced in the direction parallel to the polarization of said shear-type piezoelectric element by supplying a current to said two electrodes.

12. In a disk drive comprising at least a recording disk, a head arranged on each of a plurality of information recording surfaces of said recording disk for reading and writing information and a head actuator for moving said head in a radial direction of said recording disk in order to position said head on the desired recording track on said recording disk, a head positioning mechanism using an actuator according to claim 4 with a part of said head actuator for moving said head by a small distance independently of the motion of said head actuator, wherein:
said two electrodes of said actuator are arranged on an end surface of said head that is nearer to said head; and
a head element board including the head of said head actuator is mounted on said opposed electrode of said actuator.

13. In a disk drive comprising at least a recording disk, a head arranged on each of a plurality of information recording surfaces of said recording disk for reading and writing information and a head actuator for moving said head in a radial direction of said recording disk in order to position said head on the desired recording track on said recording disk, a head positioning mechanism using an actuator according to claim 11 with a part of said head actuator for moving said head by a small distance independently of the motion of said head actuator, wherein:
said two electrodes of said actuator are arranged at a forward end of said head actuator; and
a base of a support spring of said head actuator is mounted on said opposed electrode of said actuator.

14. An actuator using at least a piezoelectric element, comprising:

two electrodes arranged in juxtaposition at a fixed end;
a shear-type piezoelectric element laid over said two electrodes; and
an opposed electrode arranged on the surface at a free end of said shear-type piezoelectric element in opposed relationship to said two electrodes;
wherein said opposed electrode is displaced in the plane thereof in accordance with the direction of polarization of said shear-type piezoelectric element by supplying power between said two electrodes; and
further wherein said shear-type piezoelectric element is segmented into two independent portions laid on said two electrodes, respectively, wherein said shear-type piezoelectric element is polarized in the direction parallel to the direction in which said two electrodes are juxtaposed, and wherein said opposed electrode is displaced in such a direction as to rotate about the central portion of said shear-type piezoelectric element by supplying a current to said two electrodes.

15. In a disk drive comprising at least a recording disk, a head arranged on each of a plurality of information recording surfaces of said recording disk for reading and writing information and a head actuator for moving said head in a radial direction of said recording disk in order to position said head on the desired recording track on said recording disk, a head positioning mechanism using an actuator according to claim 14 with a part of said head actuator for moving said head by a small distance independently of the motion of said head actuator, wherein:
said two electrodes of said actuator are arranged at a forward end of said head actuator; and
a base of a support spring of said head actuator is mounted on said opposed electrode of said actuator.

16. An actuator using at least a piezoelectric element, comprising:

two electrodes arranged in juxtaposition at a fixed end;
a shear-type piezoelectric element laid over said two electrodes; and
an opposed electrode arranged on the surface at a free end of said shear-type piezoelectric element in opposed relationship to said two electrodes;
wherein said opposed electrode is displaced in the plane thereof in accordance with the direction of polarization of said shear-type piezoelectric element by supplying power between said two electrodes by applying a first voltage to one of said two electrodes and a second voltage to the other of said two electrodes, where there is a voltage differential between said first voltage and said second voltage; and further wherein said shear-type piezoelectric element is segmented into two independent portions laid on said two electrodes, respectively, wherein said shear-type piezoelectric element is polarized in the direction parallel to the direction in which said two electrodes are juxtaposed, wherein said shear-type piezoelectric element has two portions thereof polarized in opposite directions to each other on said two electrodes, and wherein said opposed electrode is displaced to proceed in the direction parallel to the directions of polarization of said shear-type piezoelectric element by supplying a current to said two electrodes.

17. In a disk drive comprising at least a recording disk, a head arranged on each of a plurality of information recording surfaces of said recording disk for reading and writing information and a head actuator for moving said head in a radial direction of said recording disk in order to position said head on the desired recording track on said recording disk, a head positioning mechanism using an actuator according to claim 7 with a part of said head actuator for moving said head by a small distance independently of the motion of said head actuator, wherein:
said two electrodes of said actuator are arranged at a forward end of said head actuator; and
a base of a support spring of said head actuator is mounted on said opposed electrode of said actuator.

18. An actuator using at least a piezoelectric element, comprising:

two electrodes arranged in juxtaposition at a fixed end;
a shear-type piezoelectric element laid over said two electrodes; and
an opposed electrode arranged on the surface at a free end of said shear-type piezoelectric element in opposed relationship to said two electrodes;
wherein said opposed electrode is displaced in the plane thereof in accordance with the direction of polarization of said shear-type piezoelectric element by supplying power between said two electrodes by applying a first voltage to one of said two electrodes and a second voltage to the other of said two electrodes, where there is a voltage differential between said first voltage and said second voltage; and
further wherein said shear-type piezoelectric element is segmented into two independent portions laid on said two electrodes, respectively, wherein said shear-type piezoelectric element is polarized in the direction perpendicular to the direction in which said two electrodes are juxtaposed, wherein said shear-type piezoelectric element has two portions thereof polarized in opposite directions to each other on said two electrodes, and wherein said two electrodes are displaced in the direction parallel to the polarization of said shear-type piezoelectric element by supplying a current to said two electrodes.

19. In a disk drive comprising at least a recording disk, a head arranged on each of a plurality of information recording surfaces of said recording disk for reading and writing information and a head actuator for moving said head in a radial direction of said recording disk in order to position said head on the desired recording track on said recording disk, a head positioning mechanism using an actuator according to claim 8 with a part of said head actuator for moving said head by a small distance independently of the motion of said head actuator, wherein:
said two electrodes of said actuator are arranged at a forward end of said head actuator; and
a base of a support spring of said head actuator is mounted on said opposed electrode of said actuator.

20. In a disk drive comprising at least a recording disk, a head arranged on each of a plurality of information recording surfaces of said recording disk for reading and writing information and a head actuator for moving said head in a radial direction of said recording disk in order to position said head on the desired recording track on said recording disk, a head-positioning mechanism using an actuator according to any one of claims 1 to 8 with a part of said head actuator for moving said head by a small distance independently of the motion of said head actuator, wherein:
the two electrodes of said actuator are arranged at a forward end of a support spring of said head actuator; and
a head slider of said head actuator is mounted on said opposed electrode of said actuator.

21. A head-positioning mechanism according to claim 20, wherein said two electrodes are arranged in juxtaposition longitudinally to said support spring.

22. A head-positioning mechanism according to claim 20, wherein said two electrodes are arranged in juxtaposition perpendicular to the longitudinal direction of said support spring.

23. An actuator comprising:

a first electrode arranged at a fixed end;
at least two shear-type piezoelectric devices laid over said first electrode, said at least two piezoelectric devices being separated from each other by a space; and
a second electrode laid in parallel to said first electrode, current being passed between said first and second electrodes when a first voltage is applied to said first electrode and second voltage is applied to said second electrode, where there is a voltage differential between said first voltage and said second voltage;
said shear-type piezoelectric device being polarized in a direction parallel to said first and said second electrodes.

24. An actuator comprising:

a first electrode arranged at a fixed end;
at least one shear-type piezoelectric device laid over said first electrode; and
a second electrode laid in parallel to said first electrode, current being passed between said first and second electrodes when a first voltage is applied to said first electrode and a second voltage is applied to said second electrode, where there is a voltage differential between said first voltage and said second voltage;
wherein said shear-type piezoelectric device is polarized in a direction parallel to said first and said second electrodes; and
further wherein said shear-type piezoelectric device includes two piezoelectric elements said over said first electrode and separated from each other by a space;
the polarization of said two piezoelectric elements is different; and
said second electrode is laid over said two piezoelectric elements and has a first notch over said space.

25. An actuator according to claim 24 wherein said second electrode comprises a moveable member which extends beyond an end of said two piezoelectric elements in the direction of said first notch, said actuator further including second notches orthogonal to said first notch formed from the sides of the moveable member to help the displacement of the moveable member.

26. In a disk drive comprising at least a recording disk, a head arranged on each of a plurality of information recording surfaces of said recording disk for reading and writing information and a head actuator for moving said head in a radial direction of said recording disk in order to position said head on the desired recording track on said recording disk, a head-positioning mechanism using an actuator according to claim 25 wherein:
a first end of a spring member is secured to said moveable member, and a head slider is secured to a second end of said spring member, said moveable member and said spring member being separate components secured together.

27. An actuator according to claim 1, wherein said first voltage is a positive voltage and said second voltage is a negative voltage.

28. An actuator according to claim 3, wherein said first voltage is a positive voltage and said second voltage is a negative voltage.

29. An actuator according to claim 4, wherein said first voltage is a positive voltage and said second voltage is a negative voltage.

30. An actuator according to claim 7, wherein said first voltage is a positive voltage and said second voltage is a negative voltage.

31. An actuator according to claim 8, wherein said first voltage is a positive voltage and said second voltage is a negative voltage.

32. An actuator according to claim 23, wherein said first voltage is a positive voltage and said second voltage is a negative voltage.

33. An actuator according to claim 24, wherein said first voltage is a positive voltage and said second voltage is a negative voltage.

* * * * *

UNITED STATES PATENT AND TRADEMARK OFFICE
CERTIFICATE OF CORRECTION

PATENT NO. : 6,327,120 B1
DATED : December 4, 2001
INVENTOR(S) : Koganezawa et al.

It is certified that error appears in the above-identified patent and that said Letters Patent is hereby corrected as shown below:

Column 45,
Line 54, delete the words "claim 5" and insert -- claim 2 -- therefor;

Column 46,
Line 44, delete the words "claim 2" and insert -- claim 7 -- therefor;

Column 47,
Line 19, delete the words "claim 3" and insert -- claim 9 -- therefor;
Line 59, delete the words "claim 4" and insert -- claim 11 -- therefor;

Column 49,
Line 43, delete the words "claim 7" and insert -- claim 16 -- therefor;
Line 67, delete the words "claim 2" and insert -- claim 18 -- therefor;

Column 50,
Line 15, delete the words "claims 1 to 8" and insert -- claims 1, 2, 7, 9, 11, 14, 16 or 18 -- therefor;

Column 52,
Line 1, delete the words "claim 3" and insert -- claim 9 -- therefor;
Line 4, delete the words "claim 4" and insert -- claim 11 -- therefor;
Line 7, delete the words "claim 7" and insert -- claim 16 -- therefor; and
Line 10, delete the words "claim 8" and insert -- claim 18 -- therefor.

Signed and Sealed this

Third Day of September, 2002

*Attest:*

JAMES E. ROGAN
*Attesting Officer*     *Director of the United States Patent and Trademark Office*

UNITED STATES PATENT AND TRADEMARK OFFICE
CERTIFICATE OF CORRECTION

PATENT NO.    : 6,327,120 B1
DATED         : December 4, 2001
INVENTOR(S)   : Koganezawa et al.

It is certified that error appears in the above-identified patent and that said Letters Patent is hereby corrected as shown below:

<u>Title page,</u>
Item [73], Assignee, delete "FDX" and insert -- FDK --.

Signed and Sealed this

Fourth Day of March, 2003

*Attest:*

*Attesting Officer*

JAMES E. ROGAN
*Director of the United States Patent and Trademark Office*